(12) United States Patent (10) Patent No.: US 12,114,564 B2
Miyazaki et al. (45) Date of Patent: Oct. 8, 2024

(54) NITROGEN-CONTAINING COMPOUND FOR ORGANIC ELECTROLUMINESCENCE DEVICE

(71) Applicant: Samsung Display Co., Ltd., Yongin-si (KR)

(72) Inventors: Yuuki Miyazaki, Fukuoka (JP); Ryuhei Furue, Fukuoka (JP)

(73) Assignee: Samsung Display Co., Ltd., Yongin-si (KR)

( * ) Notice: Subject to any disclaimer, the term of this patent is extended or adjusted under 35 U.S.C. 154(b) by 445 days.

(21) Appl. No.: 17/124,170

(22) Filed: Dec. 16, 2020

(65) Prior Publication Data

US 2021/0210696 A1 Jul. 8, 2021

(30) Foreign Application Priority Data

Jan. 7, 2020 (KR) ........................ 10-2020-0001963

(51) Int. Cl.
*H10K 85/60* (2023.01)
*H10K 50/11* (2023.01)

(52) U.S. Cl.
CPC ....... *H10K 85/654* (2023.02); *H10K 85/6572* (2023.02); *H10K 50/11* (2023.02)

(58) Field of Classification Search
CPC ............. H01L 51/0067; H01L 51/0072; H01L 51/5016; H01L 51/0052; H01L 51/0054;
(Continued)

(56) References Cited

U.S. PATENT DOCUMENTS 9,127,017 B2 9/2015 Nguyen et al.
2019/0019960 A1 1/2019 Zink et al.
(Continued)

FOREIGN PATENT DOCUMENTS

DE 10 2016 123 105 A1 3/2018
JP 4747558 B2 8/2011
(Continued)

OTHER PUBLICATIONS

Machine Translation of KR20110011579A (Year: 2011).*
(Continued)

*Primary Examiner* — Jenna N Chandhok
(74) *Attorney, Agent, or Firm* — Lewis Roca Rothgerber Christie LLP

(57) ABSTRACT

An organic electroluminescence device of an embodiment of the present disclosure includes a first electrode, a hole transport region disposed on the first electrode, an emission layer disposed on the hole transport region, an electron transport region disposed on the emission layer, and a second electrode disposed on the electron transport region, wherein the emission layer may include a nitrogen-containing compound represented by Formula 1, thereby exhibiting a long service life. In Formula 1, at least one of $A_1$ to $A_5$ is represented by Formula 2, and at least another one of $A_1$ to $A_5$ is represented by Formula 3:

Formula 1

(Continued)

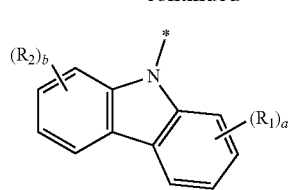

Formula 2

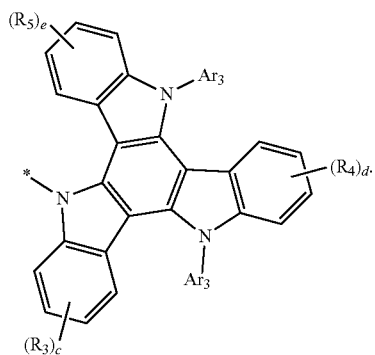

Formula 3

15 Claims, 2 Drawing Sheets

(58) Field of Classification Search
CPC .............. H01L 51/0056; H01L 51/0058; H01L 51/0061; H01L 51/0071; C07D 487/14; H10K 85/654; H10K 85/6572; H10K 85/615; H10K 85/622; H10K 85/624; H10K 85/626; H10K 85/636; H10K 85/657

See application file for complete search history.

(56) References Cited

U.S. PATENT DOCUMENTS

| | | | |
|---|---|---|---|
| 2019/0115398 A1* | 4/2019 | Tsukamoto | ........ H10K 50/131 |
| 2019/0194171 A1 | 6/2019 | Bergmann et al. | |
| 2020/0115364 A1 | 4/2020 | Aguilera-Iparraguirre et al. | |
| 2020/0203652 A1* | 6/2020 | Duan | ............... H01L 51/5028 |

FOREIGN PATENT DOCUMENTS

| | | | | |
|---|---|---|---|---|
| JP | 5923597 | B2 | 5/2016 | |
| KR | 20110011579 | A * | 2/2011 | |
| KR | 10-1521790 | B1 | 5/2015 | |
| KR | 10-1599120 | B1 | 3/2016 | |
| WO | WO 2018/041933 | A1 | 3/2018 | |
| WO | WO-2018131877 | A1 * | 7/2018 | ............ C09K 11/06 |
| WO | WO 2018/237385 | A1 | 12/2018 | |

OTHER PUBLICATIONS

Machine Translation of WO2018131877 (Year: 2018).*
Noda, Hiroki et al., "Critical role of intermediate electronic states for spin-flip processes in charge-transfer-type organic molecules with multiple donors and acceptors," Nature Materials, 18, pp. 1084-1090 (2019), 8 pages.

* cited by examiner

NITROGEN-CONTAINING COMPOUND FOR ORGANIC ELECTROLUMINESCENCE DEVICE

CROSS-REFERENCE TO RELATED APPLICATION

This application claims priority to and the benefit of Korean Patent Application No. 10-2020-0001963, filed on Jan. 7, 2020, the entire content of which is hereby incorporated by reference.

BACKGROUND

One or more aspects of embodiments of the present disclosure relate to an organic electroluminescence device and a nitrogen-containing compound for the organic electroluminescence device.

Organic electroluminescence displays are recently being developed as image display devices. Unlike liquid crystal display devices and/or the like, organic electroluminescence displays are so-called self-luminescent display devices, in which holes and electrons respectively injected from a first electrode and a second electrode recombine in an emission layer, and thus a luminescent material including an organic compound in the emission layer emits light to implement display.

In the application of an organic electroluminescence device to a display device, there is a demand for an organic electroluminescence device having a low driving voltage, high luminous efficiency, and a long service life (life span), and there is a demand for new materials capable of stably attaining such characteristics for an organic electroluminescence device.

In recent years, in order to implement a highly efficient organic electroluminescence device, materials utilizing triplet state energy phosphorescence emission, delayed fluorescence triplet-triplet annihilation (TTA) (in which singlet excitons are generated by collision of triplet excitons), and/or thermally activated delayed fluorescence (TADF) are being developed.

SUMMARY

One or more aspects of embodiments of the present disclosure are directed toward an organic electroluminescence device having a long service life and high efficiency, and a nitrogen-containing compound used therein.

One or more aspects of embodiments of the present disclosure are directed toward an organic electroluminescence device including a thermally activated delayed fluorescence emitting material, and a nitrogen-containing compound used as a thermally activated delayed fluorescence emitting material.

One or more example embodiments of the present disclosure provide an organic electroluminescence device including: a first electrode; a hole transport region disposed on the first electrode; an emission layer disposed on the hole transport region; an electron transport region disposed on the emission layer; and a second electrode disposed on the electron transport region, wherein the emission layer contains a nitrogen-containing compound including an aromatic monocycle having a substituted or unsubstituted carbazole group, a substituted or unsubstituted triazine group, and a substituted or unsubstituted triazatruxene group as a substituent.

In an embodiment, the emission layer may be to emit delayed fluorescence, and may be a delayed fluorescence emission layer including a first compound and a second compound, and the first compound may include the nitrogen-containing compound.

In an embodiment, the nitrogen-containing compound may be represented by Formula 1:

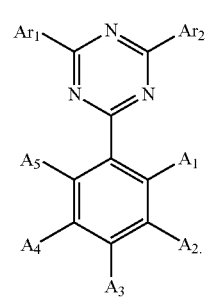

Formula 1

In Formula 1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, $A_1$ to $A_5$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or represented by Formula 2 or Formula 3, wherein at least one of $A_1$ to $A_5$ is represented by Formula 2, and at least another one of $A_1$ to $A_5$ is represented by Formula 3:

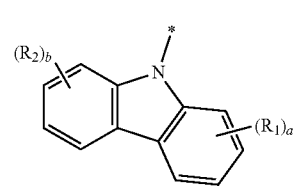

Formula 2

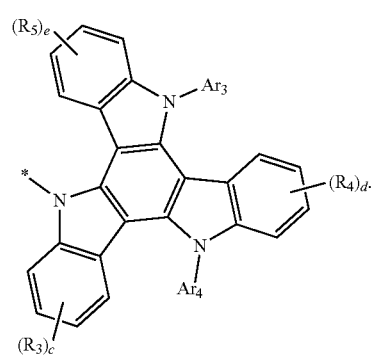

Formula 3

In Formula 2 and Formula 3, $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms, $R_1$ to $R_5$ may each independently be a hydrogen atom, a deuterium atom, a halogen atom, a substituted or unsubstituted amine group, a substituted or unsubstituted thiol group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent ring to form a ring, and a to e may each independently be an integer of 0 to 4.

When a in Formula 2 is an integer of 2 or more, a pair of adjacent $R_1$'s may form a condensed ring structure with (e.g., according to) any one among Formulae 7-1 to 7-4:

Formula 7-1
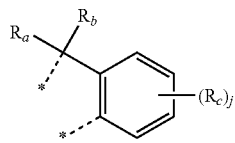

Formula 7-2
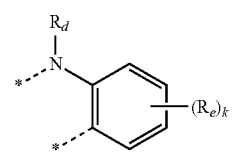

Formula 7-3
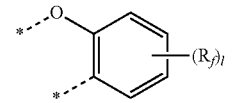

Formula 7-4
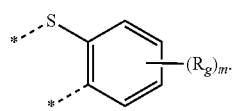

In Formulae 7-1 to 7-4, $R_a$ to $R_g$ may each independently be a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and j to m may each independently be an integer of 0 to 4.

$Ar_1$ to $Ar_4$ may each independently be represented by Formula 8:

Formula 8
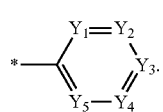

In Formula 8, $Y_1$ to $Y_5$ may each independently be CX or N, and

X may be a hydrogen atom, a deuterium atom, an alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent ring to form a ring.

In an embodiment, Formula 1 may be represented by any one among Formula 4-1 to Formula 4-4.

Formula 4-1
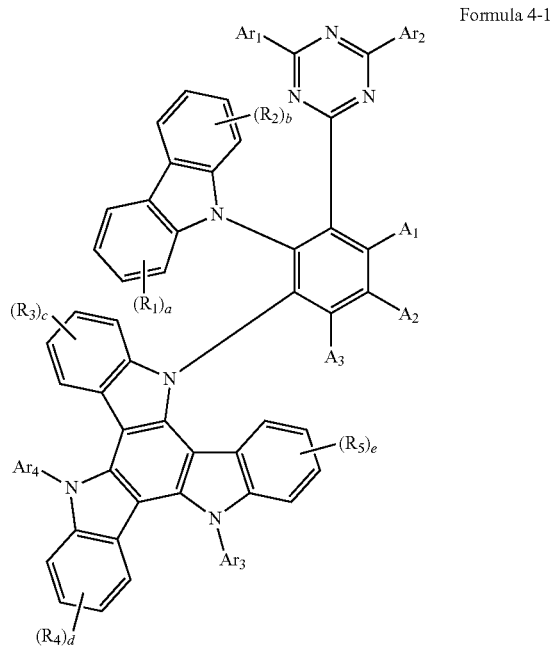

Formula 4-2
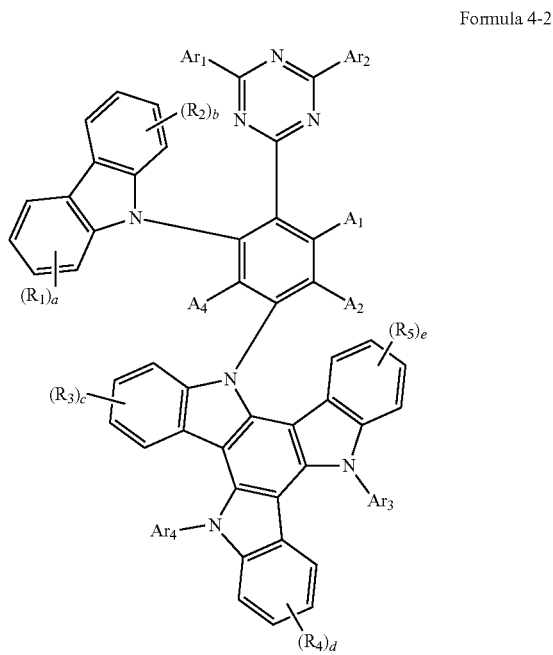

Formula 4-3

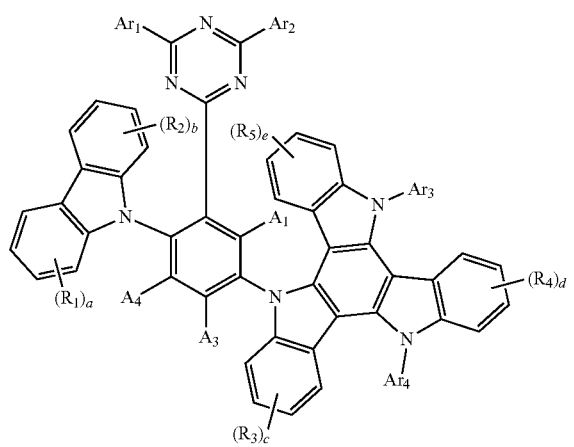

Formula 4-4

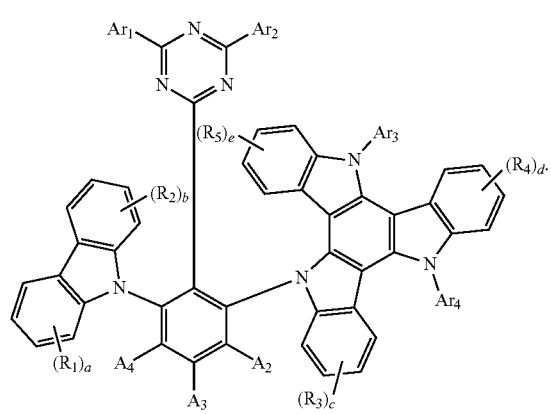

In Formula 4-1 to Formula 4-4, $Ar_1$ to $Ar_4$, $A_1$ to $A_4$, $R_1$ to $R_5$, and a to e may each independently be the same as defined in Formula 1 to Formula 3.

In an embodiment, Formula 1 may be represented by any one among Formula 5-1 to Formula 5-4.

Formula 5-1

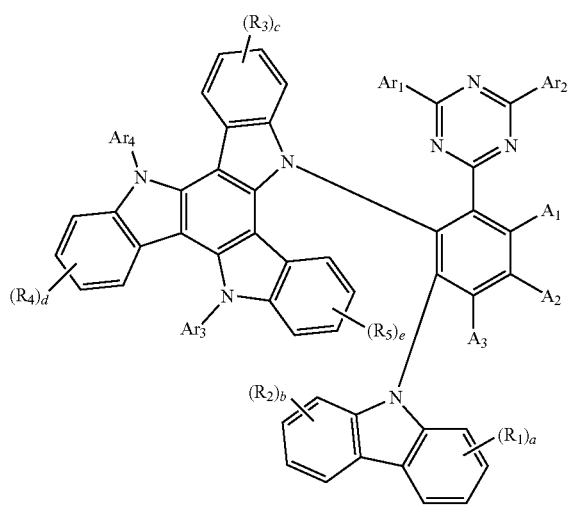

Formula 5-2

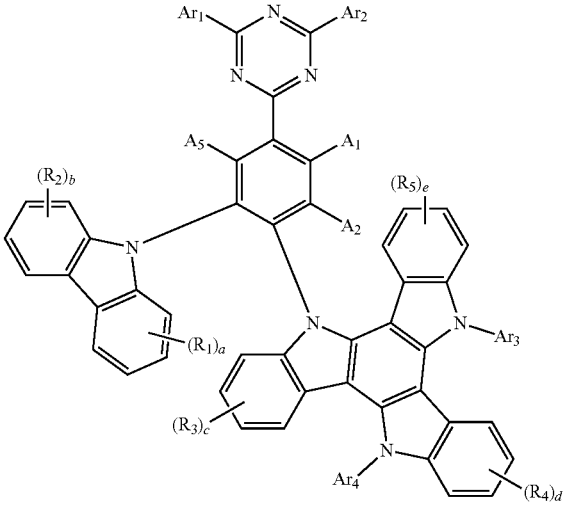

Formula 5-3

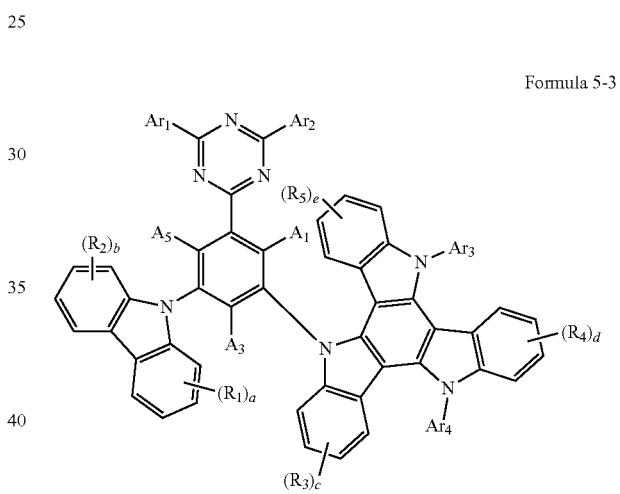

Formula 5-4

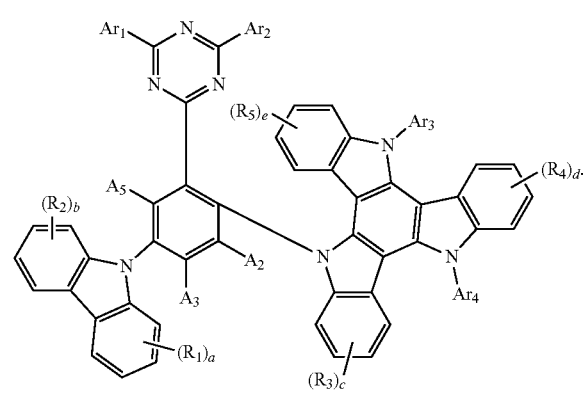

In Formula 5-1 to Formula 5-4, $Ar_1$ to $Ar_4$, $A_1$ to $A_3$, $A_5$, $R_1$ to $R_5$, and a to e may each independently be the same as defined in Formula 1 to Formula 3.

In an embodiment, Formula 1 may be represented by Formula 6-1 or Formula 6-2:

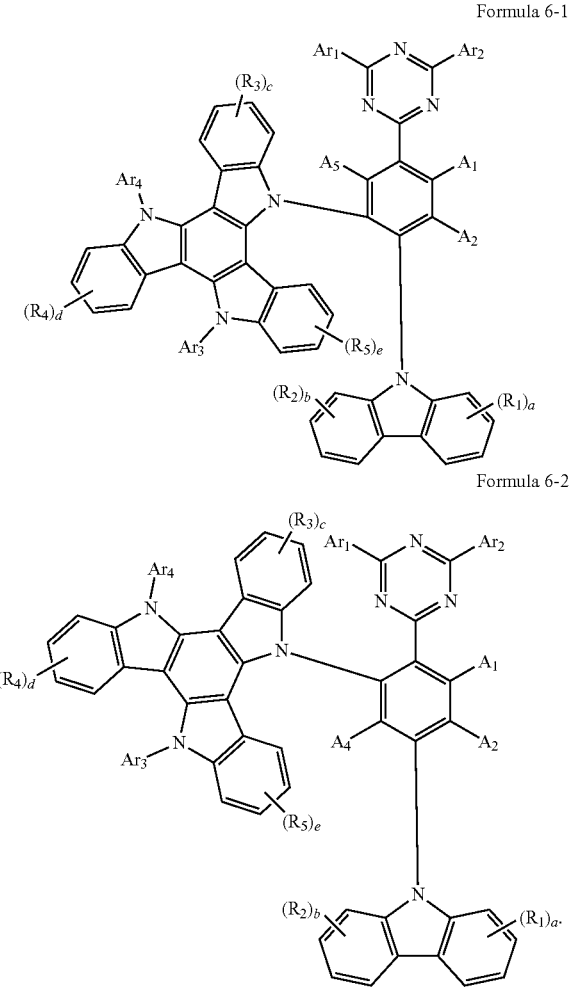

In Formula 6-1 and Formula 6-2, $Ar_1$ to $Ar_4$, $A_1$, $A_2$, $A_4$, $A_5$, $R_1$ to $R_5$, and a to e may each independently be the same as defined in Formula 1 to Formula 3.

In an embodiment, the nitrogen-containing compound represented by Formula 1 may be at least any one among compounds represented by Compound Group 1:

An embodiment of the present disclosure provides a nitrogen-containing compound represented by Formula 1.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
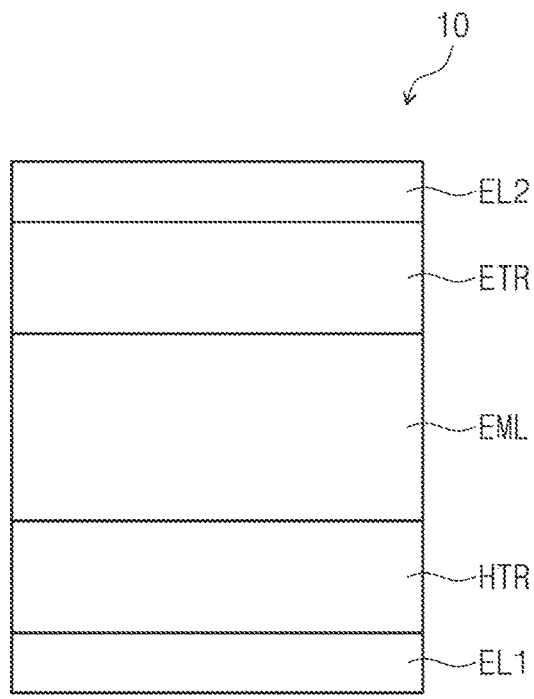
FIG. 1 is a cross-sectional view schematically illustrating an organic electroluminescence device according to an embodiment of the present disclosure.

The present disclosure may have various modifications and may be embodied in different forms, and example embodiments will be explained in more detail with reference to the accompanying drawings. The present disclosure may, however, be embodied in different forms and should not be construed as being limited to the embodiments set forth herein. Rather, all modifications, equivalents, and substituents that are included in the spirit and technical scope of the present disclosure should be included in the present disclosure.

In the description, it will be understood that when an element or layer is referred to as being "on," "connected to," or "coupled to" another element or layer, it can be directly on, connected or coupled to the other element or layer, or intervening elements or layers may be present. When an element is referred to as being "directly on," "directly connected to," or "directly coupled to" another element, there are no intervening elements present.

Like numbers refer to like elements throughout, and duplicative descriptions thereof may not be provided. Also, in the drawings, the thicknesses, the ratios, and dimensions of elements may be exaggerated for an effective description of technical contents.

The term "and/or," includes any and all combinations of one or more of the associated listed items. As used herein, the singular forms "a," "an," and "the" are intended to include the plural forms as well, unless the context clearly indicates otherwise.

As used herein, expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure".

It will be understood that although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are relative concepts, and are used with reference to the directions indicated in the drawings.

Unless otherwise defined, all terms (including technical and scientific terms) used herein have the same meaning as commonly understood by one of ordinary skill in the art to which the present disclosure pertains. It is also to be understood that terms should be interpreted as having meanings that are consistent with their meanings in the context of the relevant art (such as defined in commonly used dictionaries) unless expressly defined herein, and should not be interpreted in an idealized or overly formal sense.

It should be understood that the terms "includes," "including," "comprises," "comprising," and/or "have," are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the present disclosure and a compound of an embodiment included therein will be described with reference to the accompanying drawings.

FIGS. 1 to 4 are cross-sectional views schematically illustrating organic electroluminescence devices according to embodiments of the present disclosure. Referring to FIGS. 1 to 4, in each of the organic electroluminescence devices 10, a first electrode EL1 and a second electrode EL2 are disposed to face each other, and an emission layer EML may be disposed between the first electrode EL1 and the second electrode EL2.

In some embodiments, each of the organic electroluminescence devices 10 may further include a plurality of functional layers between the first electrode EL1 and the second electrode EL2 in addition to the emission layer EML. The plurality of functional layers may include a hole transport region HTR and an electron transport region ETR. For example, each of the organic electroluminescence devices 10 according to embodiments may include the first electrode EL1, the hole transport region HTR, the emission layer EML, the electron transport region ETR, and the second electrode EL2, sequentially stacked. In some embodiments, the organic electroluminescence device 10 of an embodiment may include a capping layer CPL disposed on the second electrode EL2.

The organic electroluminescence device 10 of an embodiment may include a nitrogen-containing compound of an embodiment, which will be described later, in the emission layer EML disposed between the first electrode EL1 and the second electrode EL2. However, embodiments are not limited thereto, and the organic electroluminescence device 10 of an embodiment may include a nitrogen-containing compound according to an embodiment not only in the emission layer EML but also in the hole transport region HTR and/or electron transport region ETR (which are among the plurality of functional layers disposed between the first electrode EL1 and the second electrode EL2), and/or in the capping layer CPL disposed on the second electrode EL2.

Figure 2:
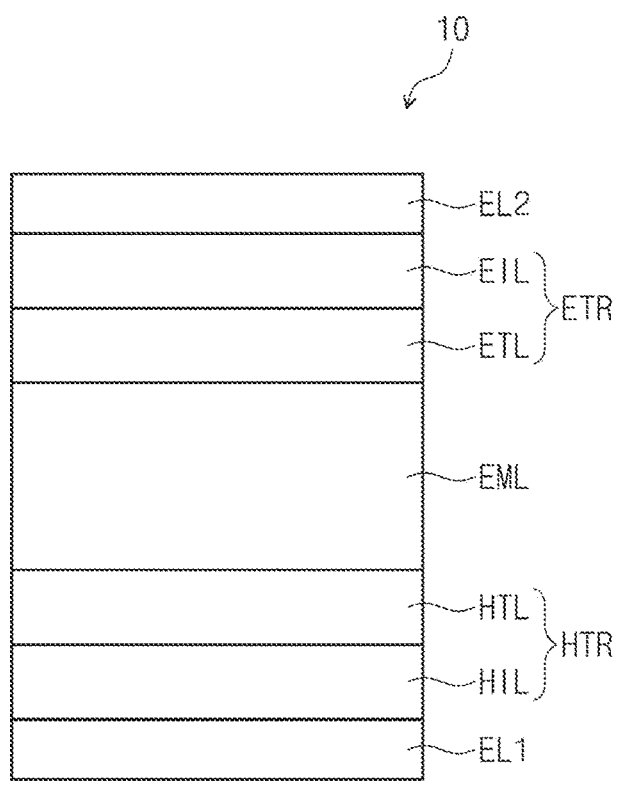
FIG. 2 is a cross-sectional view schematically illustrating an organic electroluminescence device according to an embodiment of the present disclosure.
Figure 3:
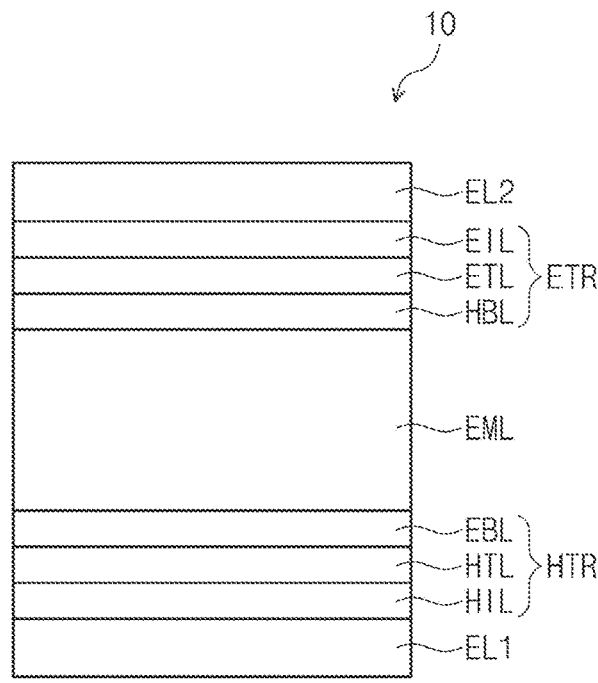
FIG. 3 is a cross-sectional view schematically illustrating an organic electroluminescence device according to an embodiment of the present disclosure.
Figure 4:
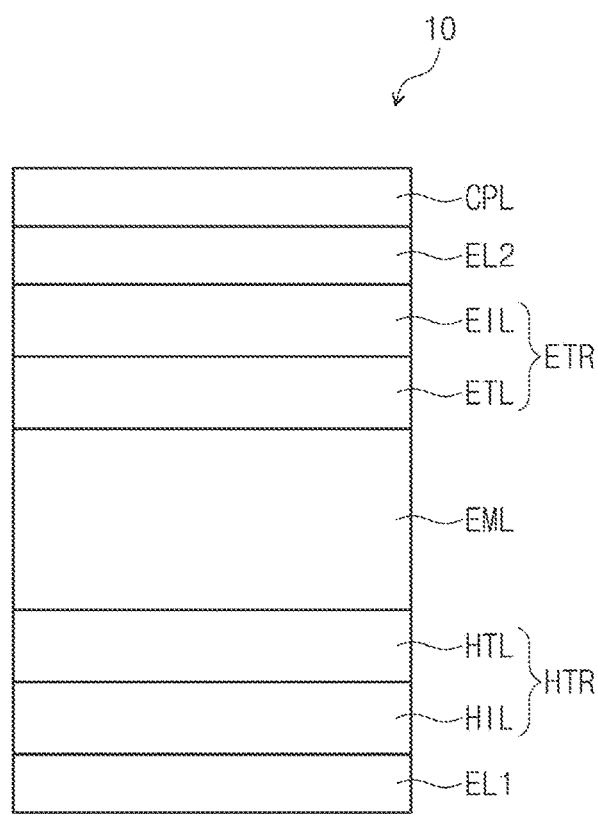
FIG. 4 is a cross-sectional view schematically illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared to FIG. 2, FIG. 4 illustrates a cross-sectional view of an organic electroluminescence device 10 of an embodiment including a capping layer CPL disposed on the second electrode EL2.

The first electrode EL1 may be conductive. The first electrode EL1 may be formed of a metal alloy and/or a conductive compound. The first electrode EL1 may be a pixel electrode or a positive electrode. The first electrode EL1 may be a transmissive electrode, a transflective electrode, or a reflective electrode. When the first electrode EL1 is a transmissive electrode, the first electrode EL1 may include a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, Mo, Ti, a compound thereof, a mixture thereof (e.g., a mixture of Ag and Mg), or an oxide thereof (e.g., ITO, IZO). In some embodiments, the first electrode EL1 may have a multilayer structure including a reflective layer or a transflective layer formed of the above-described materials, and a transparent conductive layer formed of ITO, IZO, ZnO, ITZO, etc. For example, the first electrode EL1 may have a three-layer structure of ITO/Ag/ITO, but embodiments of the present disclosure are not limited thereto. The thickness of the first electrode EL1 may be about 1,000 Å to about 10,000 Å, for example, about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments are not limited thereto.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine); N,N'-diphenyl-N,N'-bis-[4-(di-m-tolyl-amino)-phenyl]-biphenyl-4,4-diamine (DNTPD), 4,4,4"-[tris(3-methylphenyl) phenylamino]triphenylamine] (m-MTDATA), 4,4,4"-tris(N, N-diphenylamino)triphenylamine (TDATA), 4,4,4"-tris[N,-(2-naphthyl)-N-phenylamino]-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N, N'-diphenyl-benzidine (NPD), triphenylamine-containing polyether ketone (TPAPEK), 4-isopropyl-4-methyldiphenyliodonium tetrakis (pentafluorophenyl)borate, dipyrazino[2,3-f: 2,3'-h]quinoxaline-2,3,6,7,10,11-hexacarbonitrile (HAT-CN), etc.

The hole transport layer HTL may include any suitable materials available in the art. For example, the hole transport layer HTL may further include carbazole derivatives (such as N-phenyl carbazole and/or polyvinyl carbazole), fluorene derivatives, N,N'-bis(3-methylphenyl)-N, N-diphenyl-[1,1'-biphenyl]-4,4'-diamine (TPD), triphenylamine derivatives (such as 4,4',4''-tris(N-carbazolyl)triphenylamine (TCTA)), N,N'-di(naphthalene-1-yl)-N,N'-diphenyl-benzidine (NPD), 4,4'-cyclohexylidene bis[N,N-bis(4-methylphenyl)benzenamine] (TAPC), 4,4-bis[N,N'-(3-tolyl)amino]-3,3'-dimethylbiphenyl (HMTPD), 1,3-bis(N-carbazolyl)benzene (mCP), etc.

The electron blocking layer EBL may include, for example, carbazole derivatives (such as N-phenyl carbazole and/or polyvinyl carbazole), fluorene derivatives, N,N'-bis(3-methylphenyl)-N,N'-diphenyl-[1,1'-biphenyl]-4,4'-diamine (TPD), triphenylamine derivatives (such as 4,4,4''-tris(N-carbazolyl)triphenylamine (TCTA)), N,N'-di(naphthalene-1-yl)-N,N'-diphenyl-benzidine (NPD), 4,4'-cyclohexylidene bis[N,N-bis(4-methylphenyl)benzenamine] (TAPC), 4,4-bis[N,N'-(3-tolyl)amino]-3,3'-dimethylbiphenyl (HMTPD), mCP, etc.

The hole transport region HTR may have a thickness of about 50 Å to about 15,000 Å, for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be one of quinone derivatives, metal oxides, or cyano group-containing compounds, but is not limited thereto. For example, non-limiting examples of the p-dopant include quinone derivatives (such as tetracyanoquinodimethane (TCNQ) and/or 2,3,5,6-tetrafluoro-7,7,8,8-tetracyanoquinodimethane (F4-TCNQ)), metal oxides such as tungsten oxide and/or molybdenum oxide, etc.

In some embodiments, the hole transport region HTR may further include at least one of a hole buffer layer or an electron blocking layer EBL in addition to the hole injection layer HIL and the hole transport layer HTL. The hole buffer layer may compensate for a resonance distance of the wavelength of light emitted from an emission layer EML and may thereby increase light emission efficiency. Materials that may be included in the hole transport region HTR may also be included in the hole buffer layer. The electron blocking layer EBL is a layer that serves to prevent or reduce electrons from being injected from the electron transport region ETR to the hole transport region HTR.

The emission layer EML is provided on the hole transport region HTR. The thickness of the emission layer EML may be, for example, about 100 Å to about 1000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML may be to emit one of red, green, blue, white, yellow or cyan light. The emission layer EML may include a fluorescence-emitting material or a phosphorescence-emitting material.

In an embodiment, the emission layer EML may be a fluorescence emission layer. For example, some of the light emitted from the emission layer EML may result from thermally activated delayed fluorescence (TADF). In some embodiments, the emission layer EML may include a luminescent component to emit thermally activated delayed fluorescence (TADF), and for example, the emission layer EML may be to emit blue light via thermally activated delayed fluorescence.

The emission layer EML of the organic electroluminescence device 10 of an embodiment includes a nitrogen-containing compound according to an embodiment of the present disclosure.

In the description, the term "substituted or unsubstituted" refers to a state of being unsubstituted, or substituted with at least one substituent selected from the group consisting of a deuterium atom, a halogen atom, a cyano group, a nitro group, an amino group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. In some embodiments, each of the substituents described above may be further substituted or unsubstituted. For example, a biphenyl group may be interpreted as an aryl group, or as a phenyl group substituted with a phenyl group.

In the description, the term "bonded to an adjacent group to form a ring" may refer to a state of being bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The rings formed by being bonded to an adjacent group may be monocyclic or polycyclic. In some embodiments, the rings formed by being bonded to each other may be connected to another ring to form a spiro structure.

In the description, the term "an adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other.

In the description, non-limiting examples of the halogen atom include a fluorine atom, a chlorine atom, a bromine atom, and an iodine atom.

In the description, unless otherwise specified, an alkyl group may be chain or cyclic alkyl group. The number of carbons in the alkyl group may be 1 to 50, 1 to 30, 1 to 20, 1 to 10, or 1 to 6. Non-limiting examples of the alkyl group include a methyl group, an ethyl group, an n-propyl group, an isopropyl group, an n-butyl group, a s-butyl group, a t-butyl group, an i-butyl group, a 2-ethylbutyl group, a 3,3-dimethylbutyl group, an n-pentyl group, an i-pentyl group, a neopentyl group, a t-pentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, an n-heptyl group, a 1-methylheptyl group, a 2,2-dimethylheptyl group, a 2-ethylheptyl group, a 2-butylheptyl group, a n-octyl group, a t-octyl group, a 2-ethyloctyl group, a 2-butyloctyl group, a 2-hexyloctyl group, a 3,7-dimethyloctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc. Non-limiting examples of the cyclic alkyl group include a cyclopentyl group, a cyclohexyl group, a 4-methylcyclohexyl group, a 4-t-butylcyclohexyl group, a cyclooctyl group, etc.

In the description, the term "alkenyl group" may refer to a hydrocarbon group including at least one carbon-carbon double bond in the middle or at the terminal end of an alkyl group having 2 or more carbon atoms. The alkenyl group may be linear or branched. The number of carbon atoms is not specifically limited, and may be 2 to 30, 2 to 20, or 2 to 10. Non-limiting examples of the alkenyl group include a vinyl group, a 1-butenyl group, a 1-pentenyl group, a 1,3-butadienyl aryl group, a styrenyl group, a styryl vinyl group, etc.

In the description, the term "alkynyl group" may refer to a hydrocarbon group including at least one carbon-carbon triple bond in the middle or at the terminal end of an alkyl group having 2 or more carbon atoms. The alkynyl group may be linear or branched. The number of carbon atoms is not specifically limited, and may be 2 to 30, 2 to 20, or 2 to 10. Non-limiting examples of the alkynyl group include an ethynyl group, a propynyl group, etc.

In the description, the term "hydrocarbon ring group" may refer to any functional group or substituent derived from an aliphatic hydrocarbon ring, or any functional group or substituent derived from an aromatic hydrocarbon ring. The number of ring-forming carbon atoms in the hydrocarbon ring group may be 5 to 60, 5 to 30, or 5 to 20.

In the description, the term "aryl group" may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc.

In the description, the fluorenyl group may be substituted, and two substituents (e.g., at the 9H position) may be combined with each other to form a spiro structure. Non-limiting examples of the substituted fluorenyl group are as follows. However, embodiments of the present disclosure are not limited thereto.

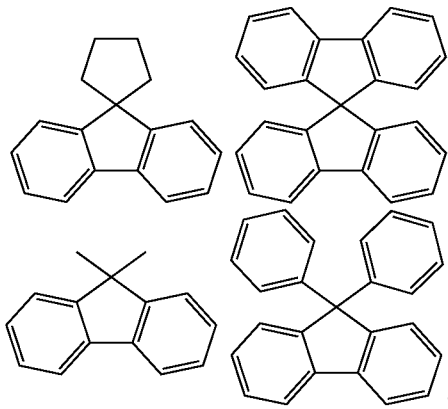

In the description, the term "heterocyclic group" may refer to any functional group or substituent derived from a ring containing at least one of boron (B), oxygen (O), nitrogen (N), phosphorus (P), silicon (Si), or sulfur (S) as a hetero atom. The heterocyclic group may be an aliphatic heterocyclic group or an aromatic heterocyclic group. The aromatic heterocyclic group may be a heteroaryl group. The aliphatic heterocycle and aromatic heterocycle may be monocyclic or polycyclic.

In the description, the heterocyclic group may include at least one of B, O, N, P, Si or S as a hetero atom. When the heterocyclic group contains two or more heteroatoms, the two or more heteroatoms may be the same as or different from each other. The heterocyclic group may be a monocyclic heterocyclic group or a polycyclic heterocyclic group, and includes a heteroaryl group. The number of ring-forming carbon atoms in in the heterocyclic group may be 2 to 30, 2 to 20, or 2 to 10.

In the description, the aliphatic heterocyclic group may include at least one of B, O, N, P, Si, or S as a hetero atom. The number of ring-forming carbon atoms in the aliphatic heterocyclic group may be 2 to 30, 2 to 20, or 2 to 10. Non-limiting examples of the aliphatic heterocyclic group include an oxirane group, a thiirane group, a pyrrolidine group, a piperidine group, a tetrahydrofuran group, a tetrahydrothiophene group, a thiane group, a tetrahydropyran group, a 1,4-dioxane group, etc.

In the description, the heteroaryl group may include at least one of B, O, N, P, Si, or S as a hetero atom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Non-limiting examples of the heteroaryl group include thiophene, furan, pyrrole, imidazole, thiazole, oxazole, oxadiazole, triazole, pyridyl, bipyridyl, pyrimidyl, triazine, acridyl, pyridazine, pyrazinyl, quinolinyl, quinazoline, quinoxalinyl, phenoxazyl, phthalazinyl, pyrido pyrimidyl, pyrido pyrazinyl, pyrazino pyrazinyl, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophenyl, thienothiophene, benzofuranyl, phenanthroline, thiazolyl, isoxazolyl, oxadiazolyl, thiadiazolyl, phenothiazolyl, phenothiazinyl, dibenzosilole, dibenzofuranyl, etc.

In the description, the number of carbon atoms in an amine group is not specifically limited, but may be 1 to 30. The amine group may include an alkyl amine group, an aryl amine group, or a heteroaryl amine group. Non-limiting examples of the amine group include a methylamine group, a dimethylamine group, a phenylamine group, a diphenylamine group, a naphthylamine group, a 9-methyl-anthracenylamine group, etc.

In the description, a thiol group may include an alkylthio group and an arylthio group.

In the description, an oxy group may be linear, branched, or cyclic. The oxy group may be an alkoxy group or an aryloxy group. The term "alkoxy group" may refer to an alkyl group in which an oxygen atom is bonded to the alkyl group as defined above. The number of carbon atoms in the alkoxy group is not limited, but for example, may be 1 to 20 or 1 to 10. Non-limiting examples of the alkoxy group include a methoxy group, an ethoxy group, a propoxy group, an isobutyloxy group, a sec-butyloxy group, a pentyloxy group, an isoamyloxy group, a hexyloxy group, etc.

The term "aryloxy group" may refer to an aryl group in which an oxygen atom is bonded to the aryl group defined above. The number of carbons in the aryloxy group may be, for example, 6 to 30 ring-forming carbon atoms, but is not limited thereto. Non-limiting examples of the aryloxy group include a phenoxy group, a p-tolyloxy group, a m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, etc.

In the description, "——*" refers to a point of connection.

The nitrogen-containing compound according to an embodiment of the present disclosure may be represented by Formula 1:

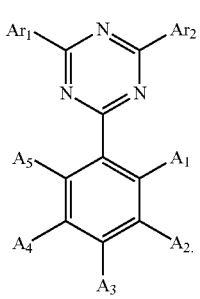

Formula 1

In Formula 1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms.

In Formula 1, $A_1$ to $A_5$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or represented by Formula 2 or Formula 3, where at least one of $A_1$ to $A_5$ may be represented by Formula 2, and at least another one of $A_1$ to $A_5$ is represented by Formula 3:

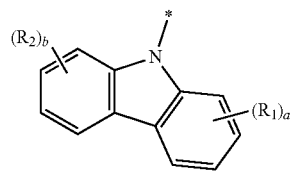

Formula 2

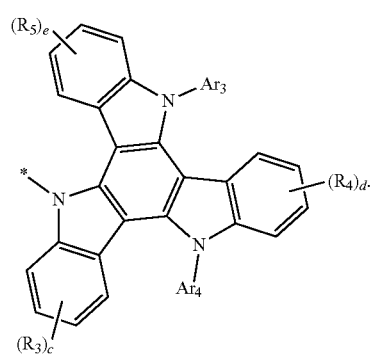

Formula 3

In Formula 2 and Formula 3, $R_1$ to $R_5$ may each independently be a hydrogen atom, a deuterium atom, a halogen atom, a substituted or unsubstituted amine group, a substituted or unsubstituted thiol group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent ring to form a ring.

In Formula 2, a may be an integer of 0 to 4. When a is 2 or more, a plurality of $R_1$'s may be the same as or different from each other.

In Formula 2, b may be an integer of 0 to 4. When b is 2 or more, a plurality of $R_2$'s may be the same as or different from each other.

In Formula 3, c may be an integer of 0 to 4. When c is 2 or more, a plurality of $R_3$'s may be the same as or different from each other.

In Formula 3, d may be an integer of 0 to 4. When d is 2 or more, a plurality of $R_4$'s may be the same as or different from each other.

In Formula 3, e may be an integer of 0 to 4. When e is 2 or more, a plurality of $R_5$'s may be the same as or different from each other.

In Formula 3, $Ar_3$ and $Ar_4$ may each independently be a substituted or unsubstituted aryl group having 6 to 30 ring-forming carbon atoms, or a substituted or unsubstituted heteroaryl group having 2 to 30 ring-forming carbon atoms.

In an embodiment, $Ar_1$ to $Ar_4$ may each independently be represented by Formula 8:

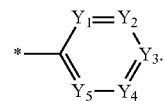

Formula 8

In Formula 8, $Y_1$ to $Y_5$ may each independently be CX or N, and X may be a hydrogen atom, a deuterium atom, an alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent ring to form a ring.

In an embodiment, when a in Formula 2 is an integer of 2 or more, a pair of adjacent $R_1$'s may form a condensed ring structure with (e.g., according to) any one among Formulae 7-1 to 7-4:

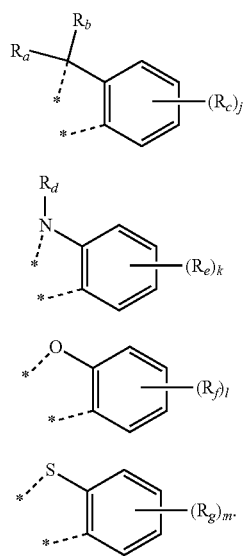

Formula 7-1

Formula 7-2

Formula 7-3

Formula 7-4

In Formulae 7-1 to 7-4, $R_a$ to $R_g$ may each independently be a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formulae 7-1 to 7-4, j to m may each independently be an integer of 0 to 4. When j is 2 or more, a plurality of $R_c$'s may be the same as or different from each other; when k is 2 or more, a plurality of $R_e$'s may be the same as or different from each other; when l is 2 or more, a plurality of $R_f$'s may be the same as or different from each other; and when m is 2 or more, a plurality of $R_g$'s may be the same as or different from each other.

In an embodiment, $Ar_1$ and $Ar_2$ in Formula 1 may each independently be a substituted or unsubstituted phenyl group, a substituted or unsubstituted biphenyl group, a substituted or unsubstituted pyridyl group, a substituted or unsubstituted pyrimidyl group, a substituted or unsubstituted carbazole group, a substituted or unsubstituted fluorenyl group, a substituted or unsubstituted dibenzofuranyl group, or a substituted or unsubstituted dibenzothiophenyl group.

In an embodiment, any one of $A_1$ to $A_5$ in Formula 1 may be represented by Formula 2, and another one of $A_1$ to $A_5$ may be represented by Formula 3.

In an embodiment, $A_1$ to $A_5$ in Formula 1 may each independently be a hydrogen atom, a deuterium atom, a halogen atom, a substituted or unsubstituted arylamine group, a substituted or unsubstituted phenyl group, a substituted or unsubstituted pyrimidyl group, a substituted or unsubstituted pyrenyl group, a substituted or unsubstituted fluorenyl group, or a substituted or unsubstituted dibenzothiophenyl group, or may be represented by Formula 2 or Formula 3.

In an embodiment, Formula 2 may be a substituent at the ortho-position of the triazine group in Formula 1. For example, Formula 1 may be represented by any one among Formula 4-1 to Formula 4-4:

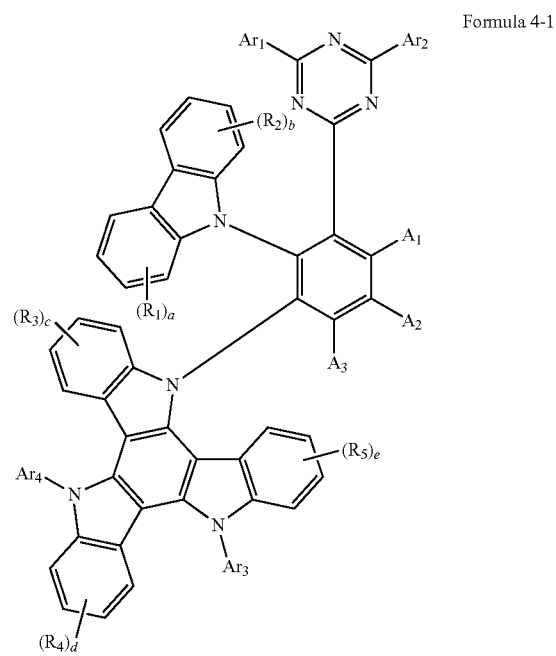

Formula 4-1

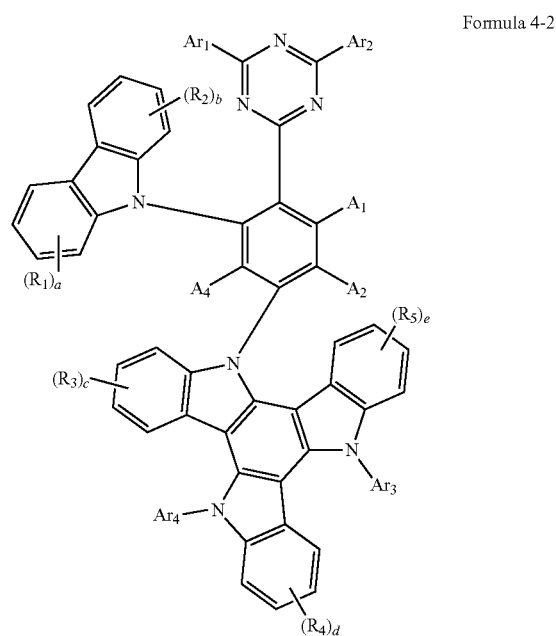

Formula 4-2

Formula 4-3

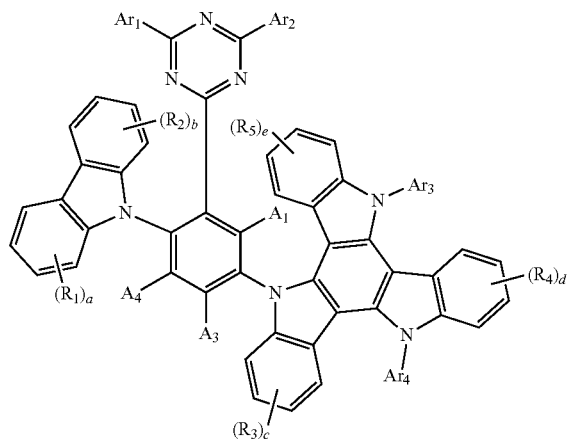

Formula 4-4

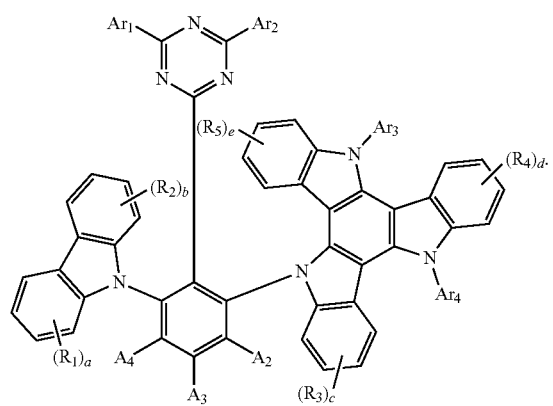

In Formula 4-1 to Formula 4-4, $Ar_1$ to $Ar_4$, $A_1$ to $A_4$, $R_1$ to $R_5$, and a to e may each independently be the same as defined in Formula 1 to Formula 3.

In an embodiment, Formula 2 may be a substituent at the meta-position of the triazine group in Formula 1. For example, Formula 1 may be represented by any one among Formula 5-1 to Formula 5-4:

Formula 5-1

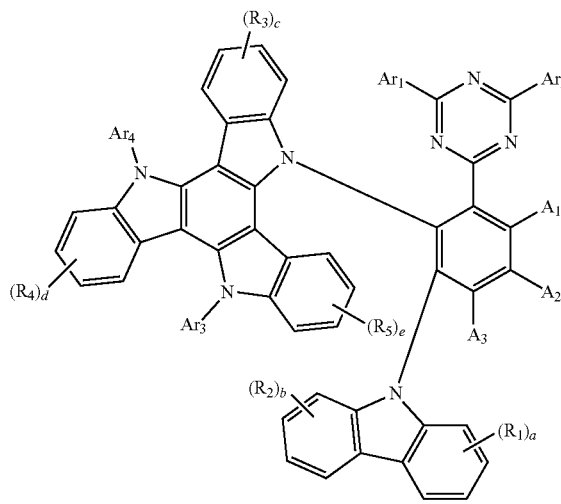

Formula 5-2

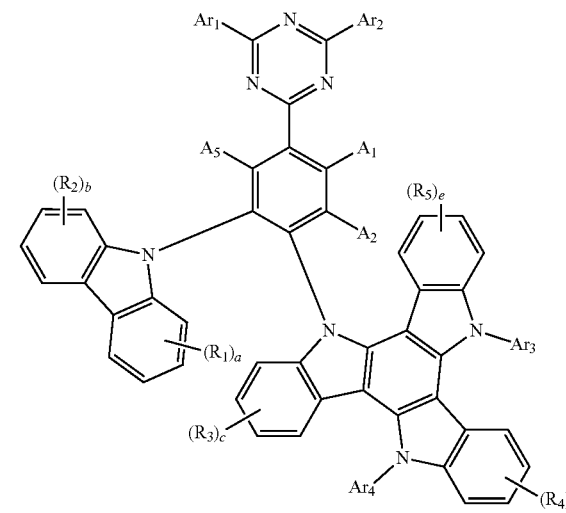

Formula 5-3

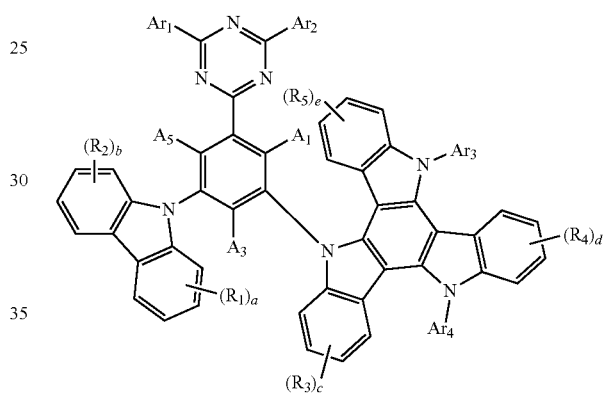

Formula 5-4

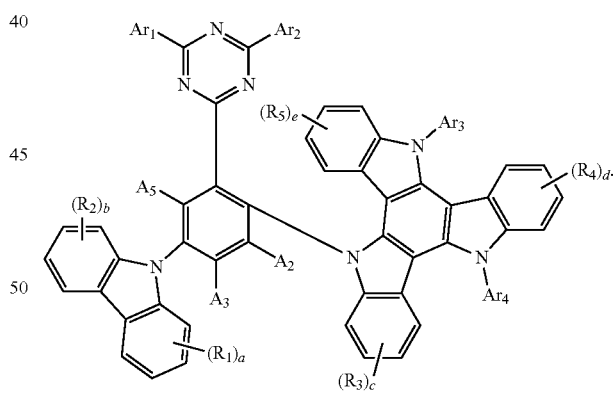

In Formula 5-1 to Formula 5-4, $Ar_1$ to $Ar_4$, $A_1$ to $A_3$, $A_5$, $R_1$ to $R_5$, and a to e may each independently be the same as defined in Formula 1 to Formula 3.

In an embodiment, Formula 2 may be a substituent at the para-position of the triazine group in Formula 1. For example, Formula 1 may be represented by Formula 6-1 or Formula 6-2:

Formula 6-1

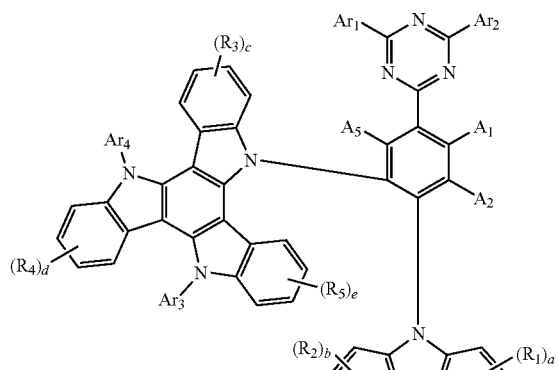

Formula 6-2

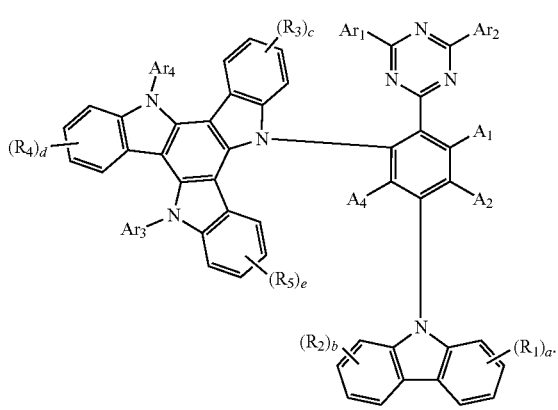

In Formula 6-1 and Formula 6-2, $Ar_1$ to $Ar_4$, $A_1$, $A_2$, $A_4$, $A_5$, $R_1$ to $R_5$, and a to e may each independently be the same as defined in Formula 1 to Formula 3.

In embodiment, the nitrogen-containing compound represented by Formula 1 may be any one selected from among the compounds represented by Compound Group 1. However, embodiments of the present disclosure are not limited thereto:

Compound Group 1

1

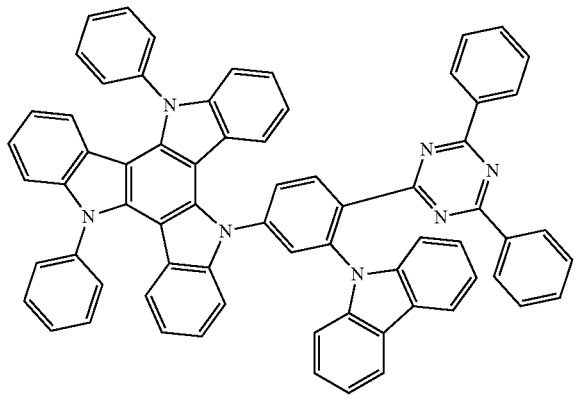

2

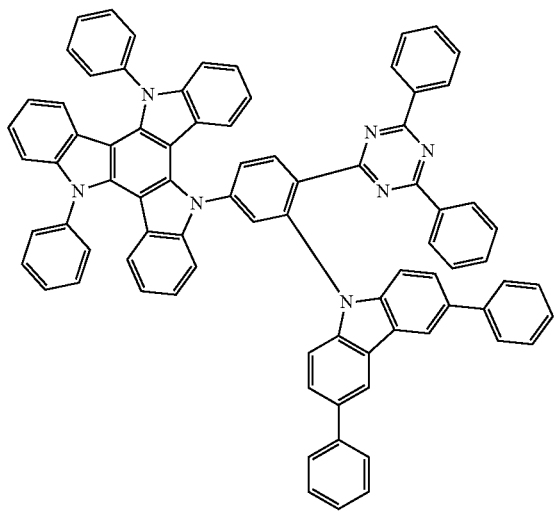

3

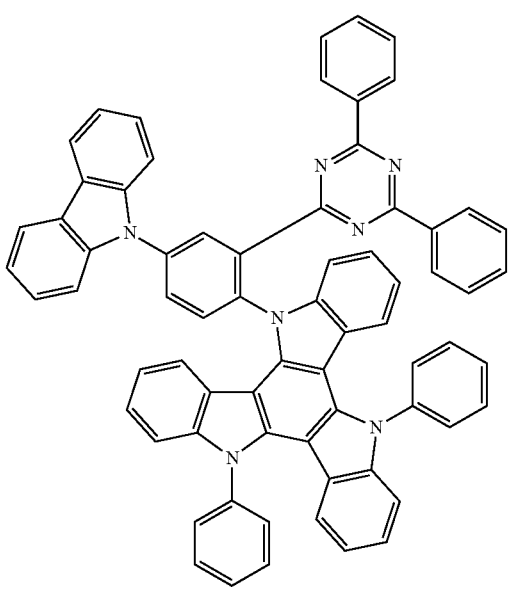

4

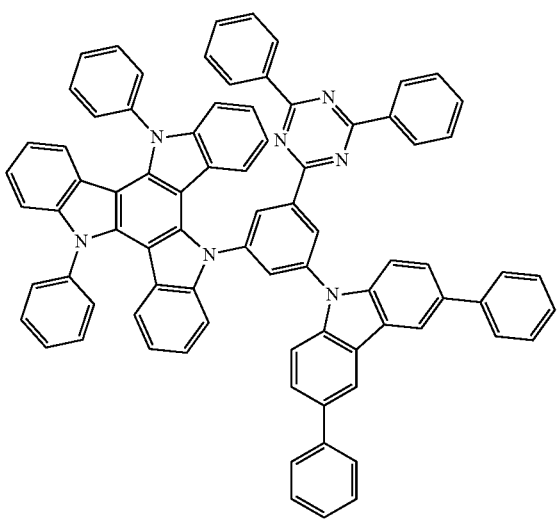

5
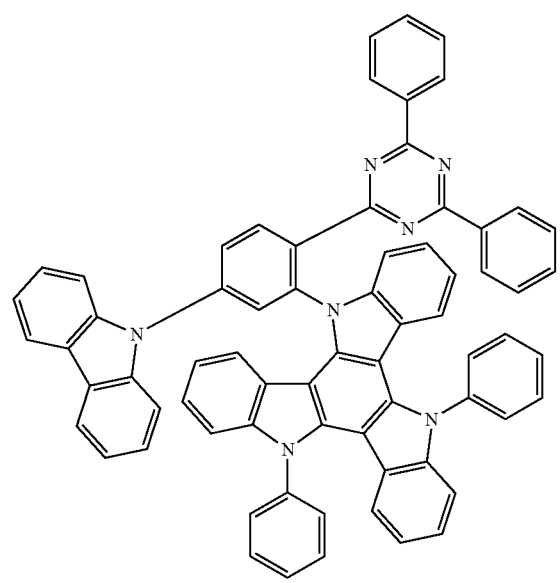
6
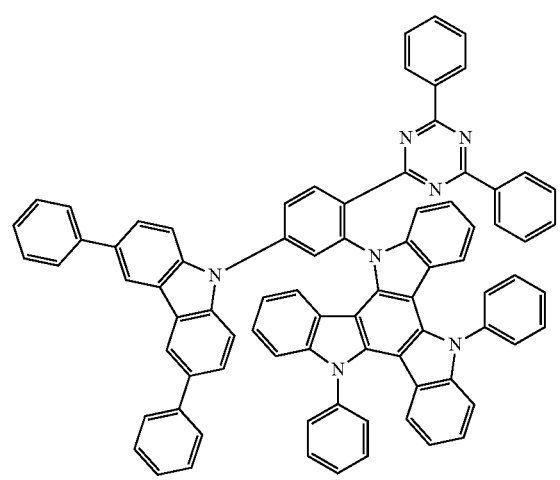
7
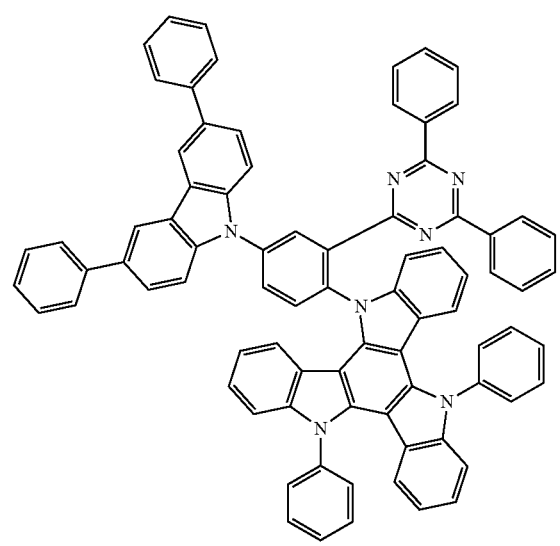
8
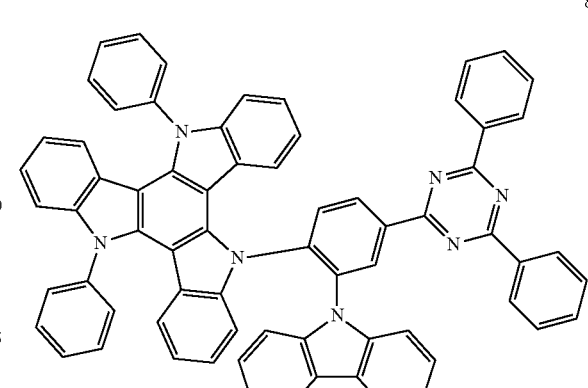
9
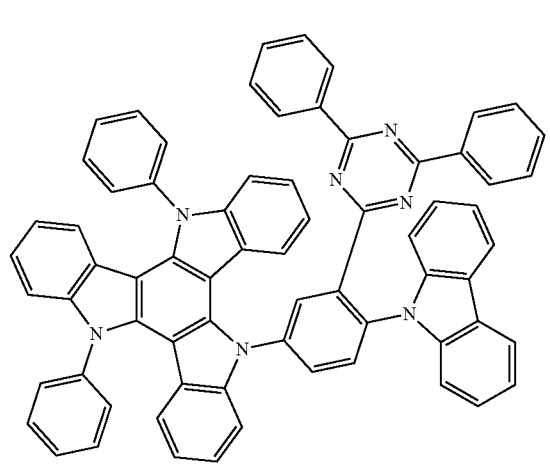
10
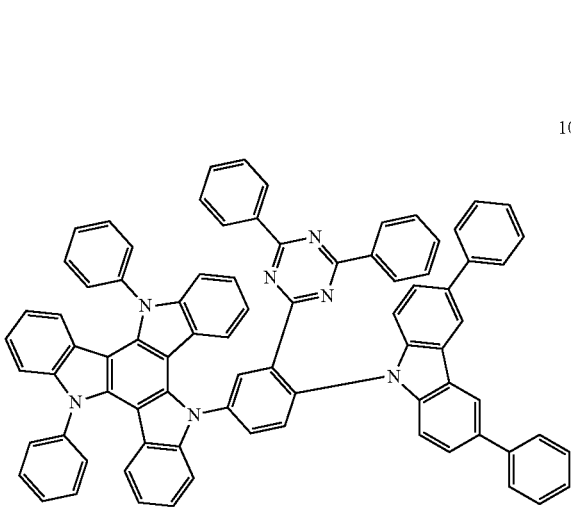

11
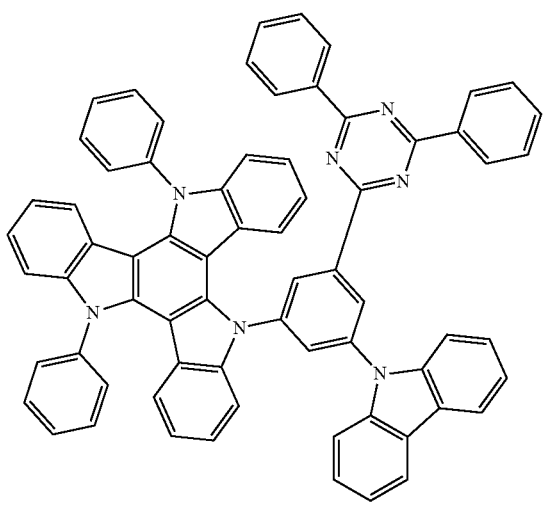
12
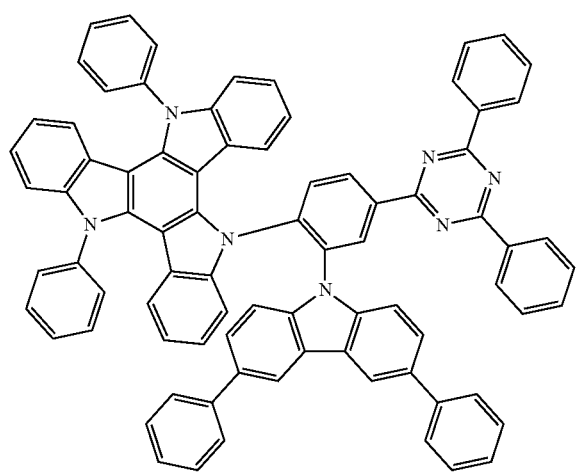
13
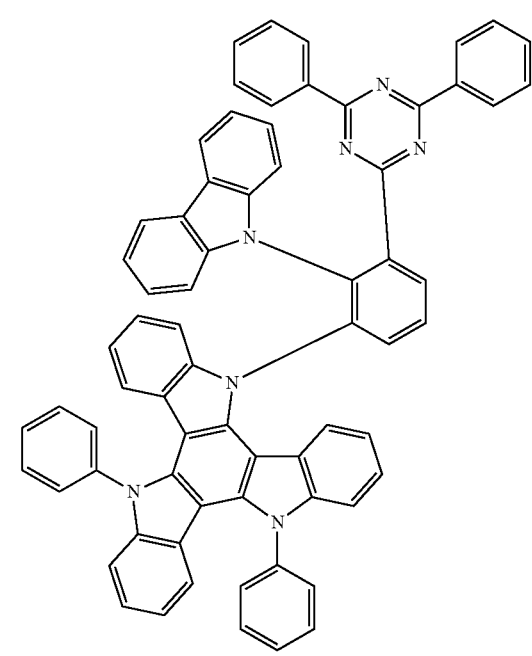
14
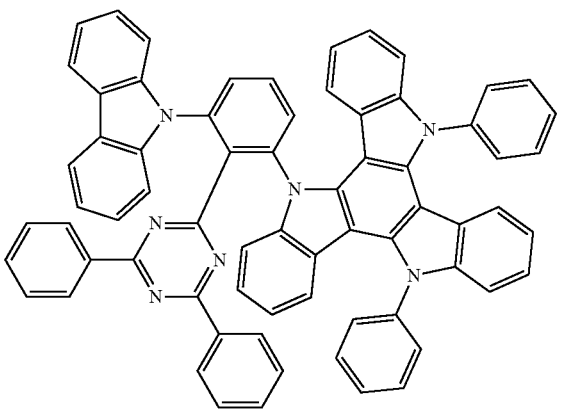
15
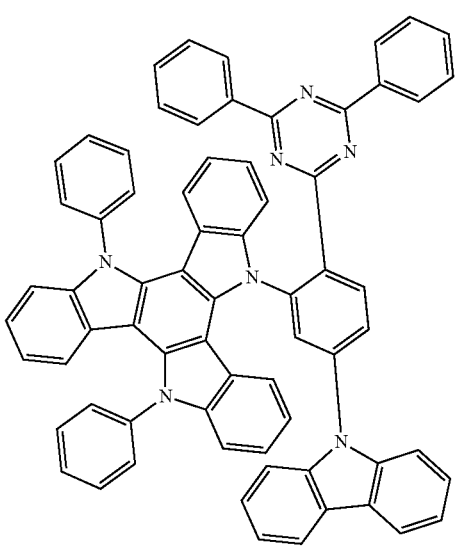
16
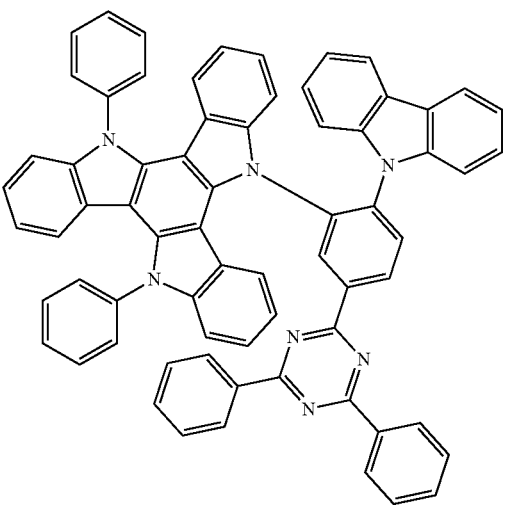

17
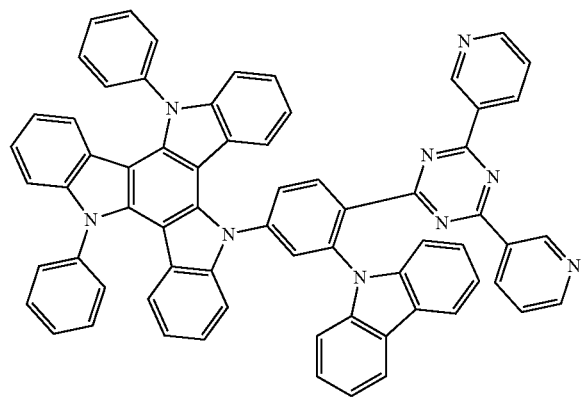
18
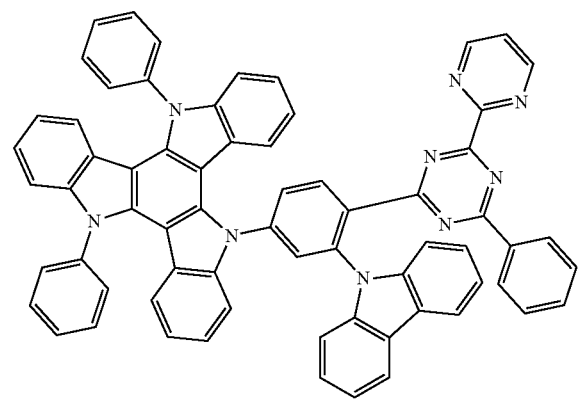
19
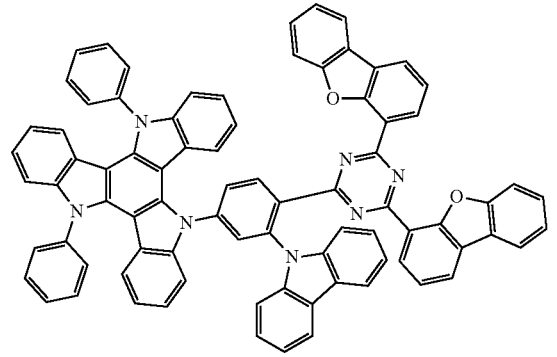
20
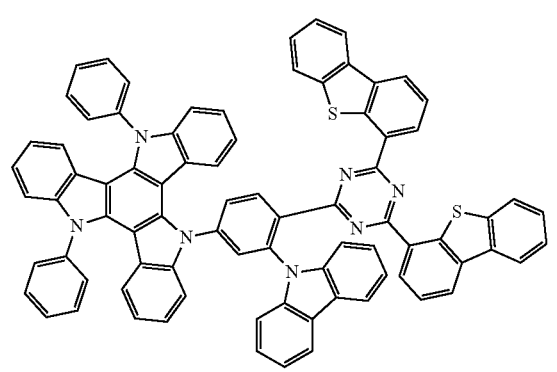
21
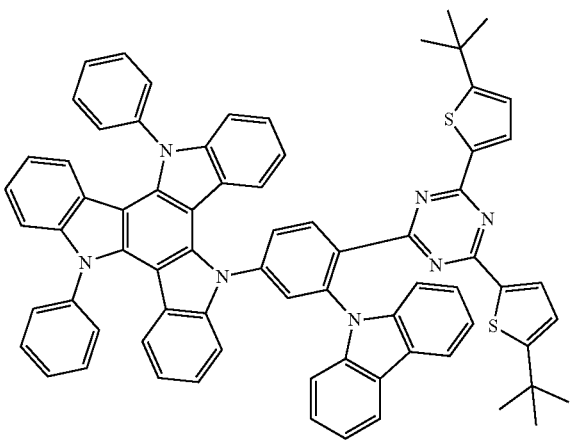
22
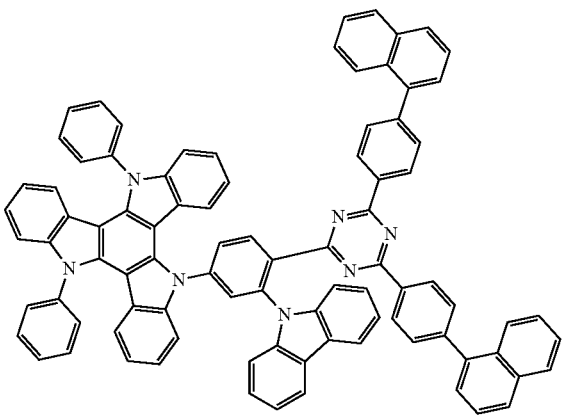
23
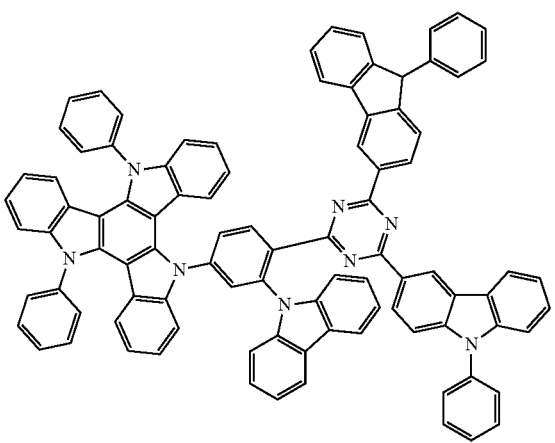

24
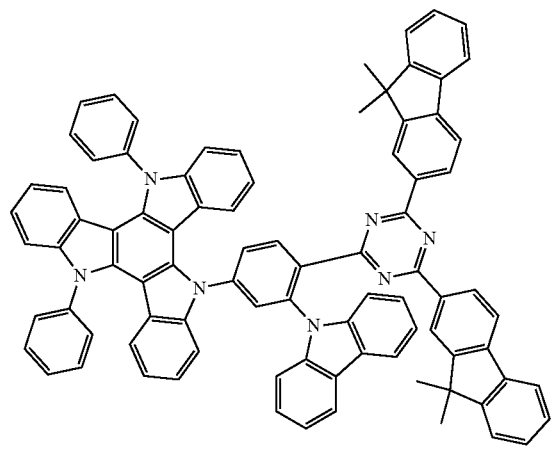
25
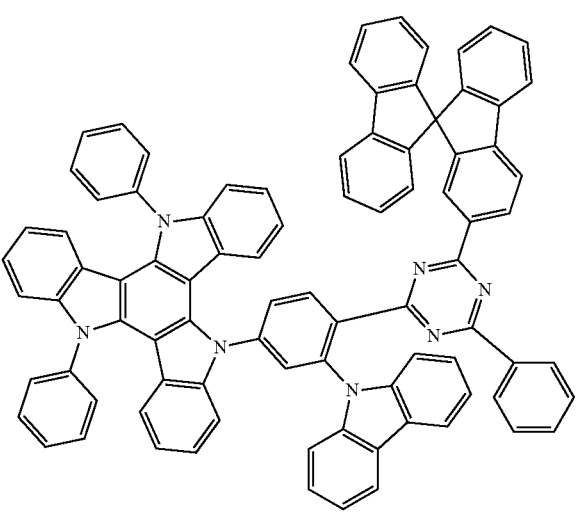
26
27
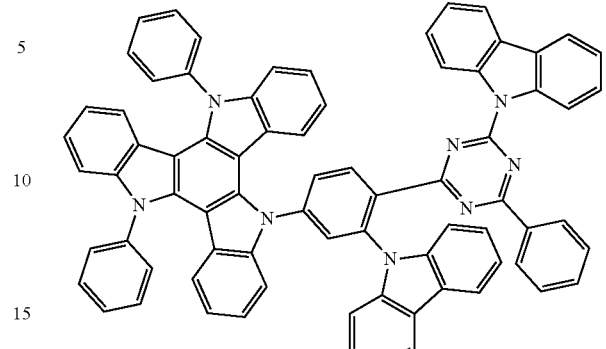
28
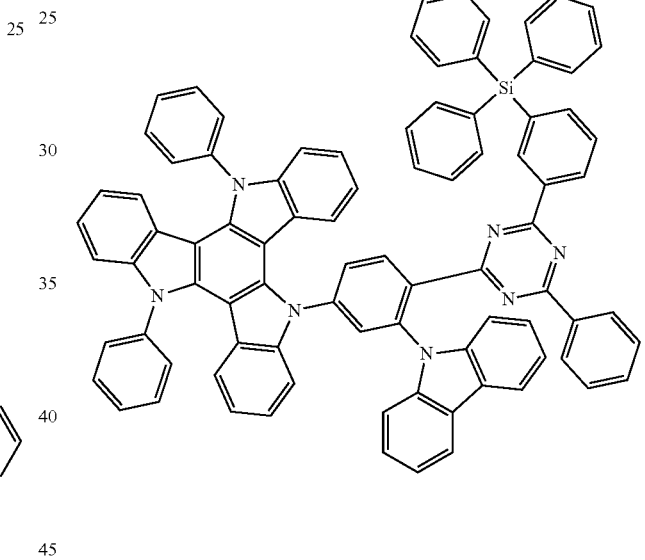
29
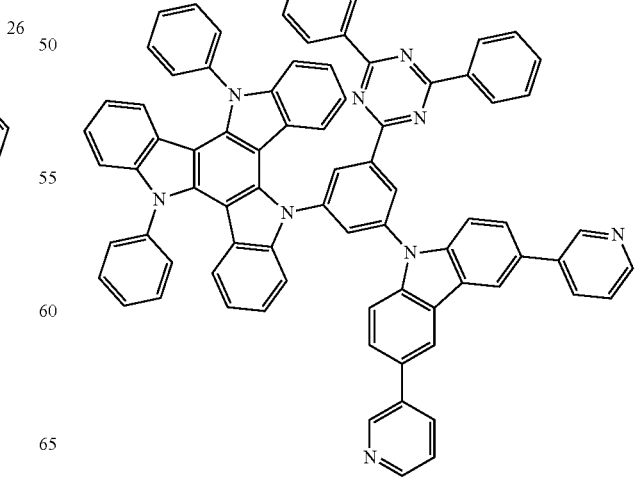

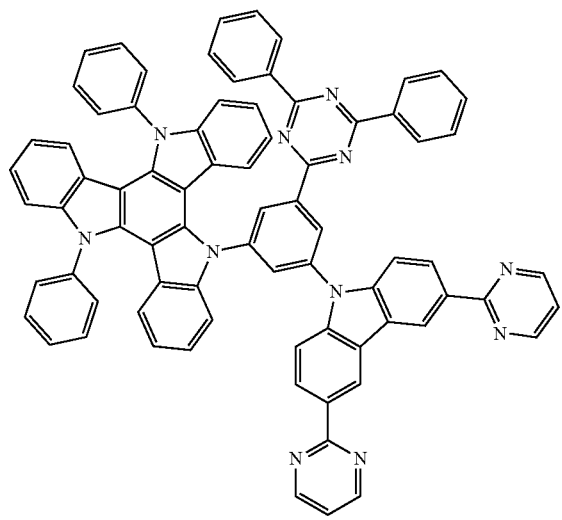
30
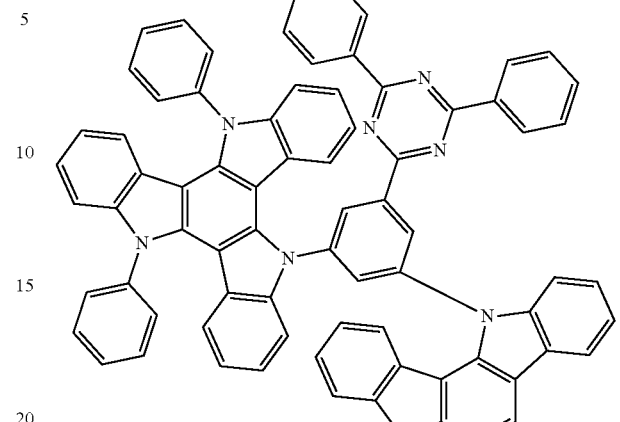
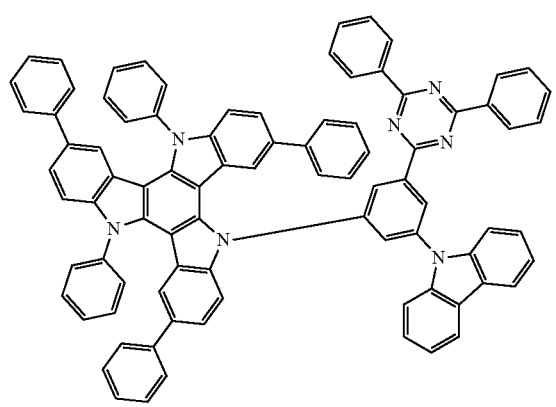
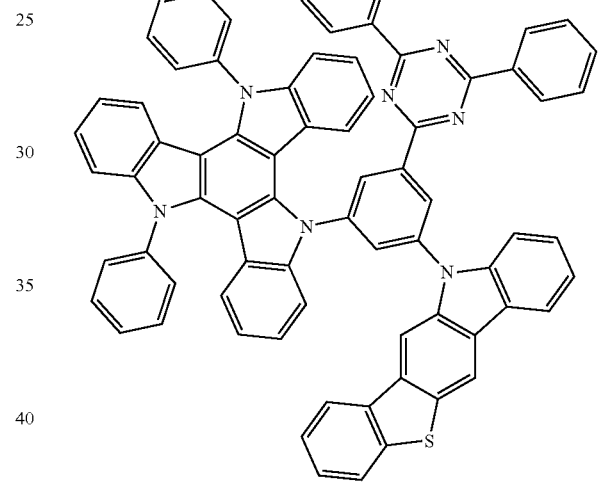
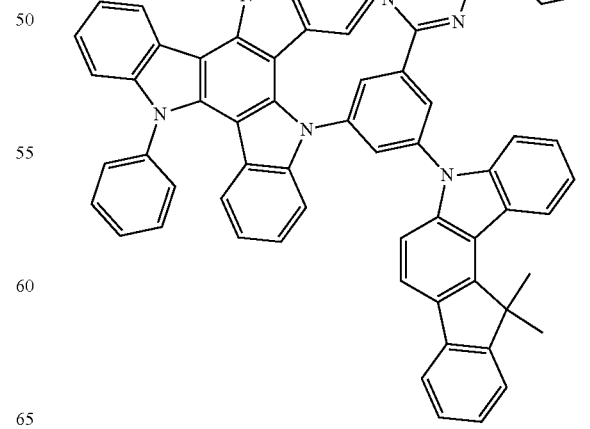

36
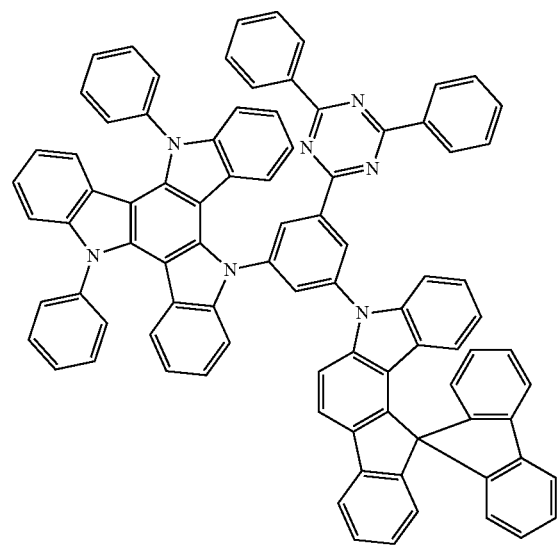
37
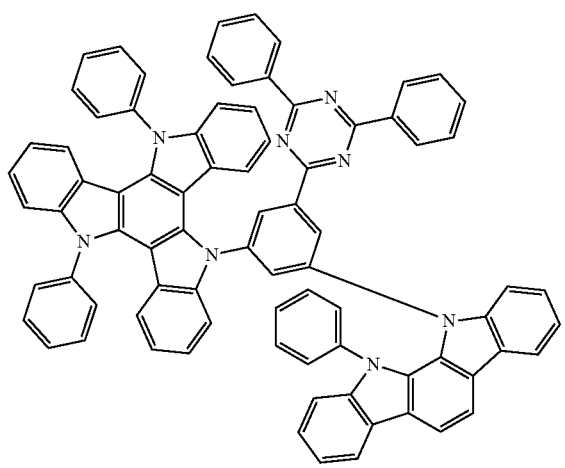
38
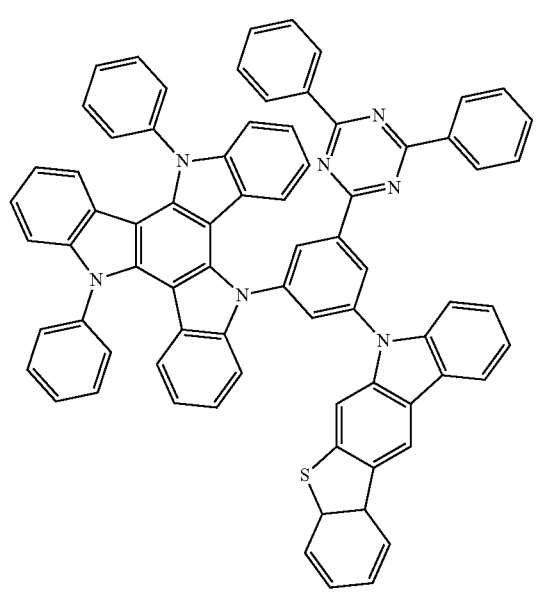
39
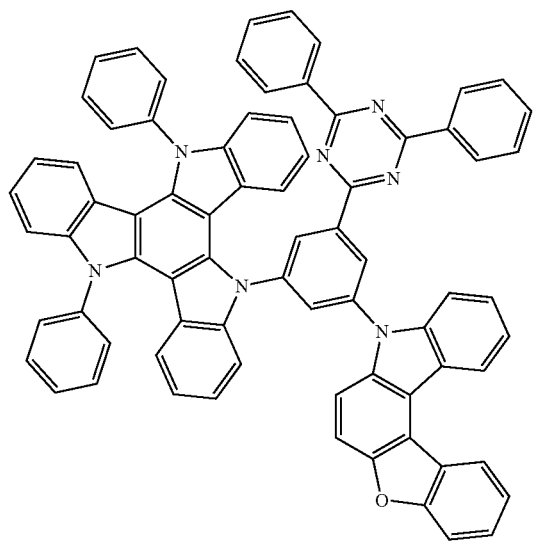
40
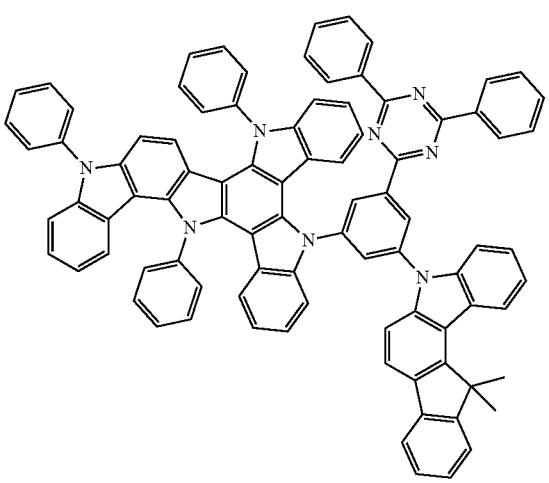
41
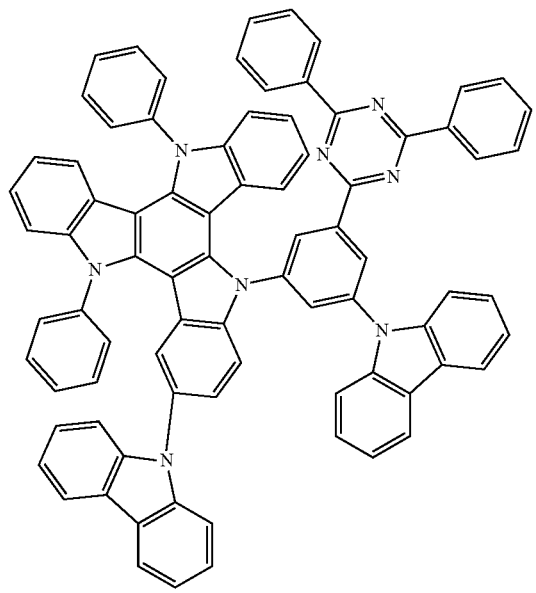

42
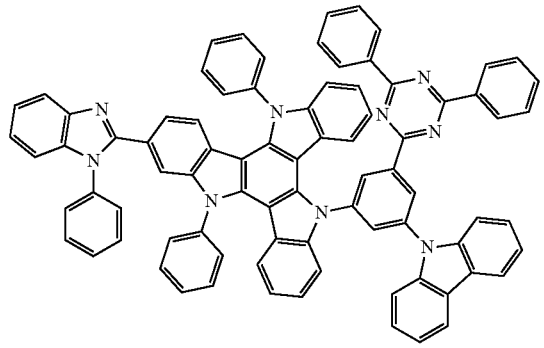
43
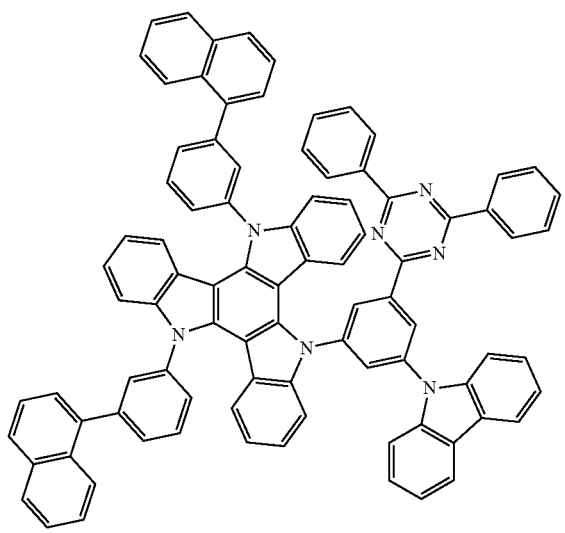
44
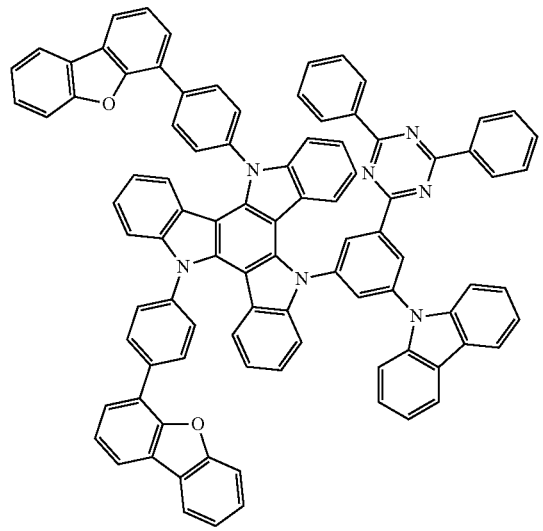
45
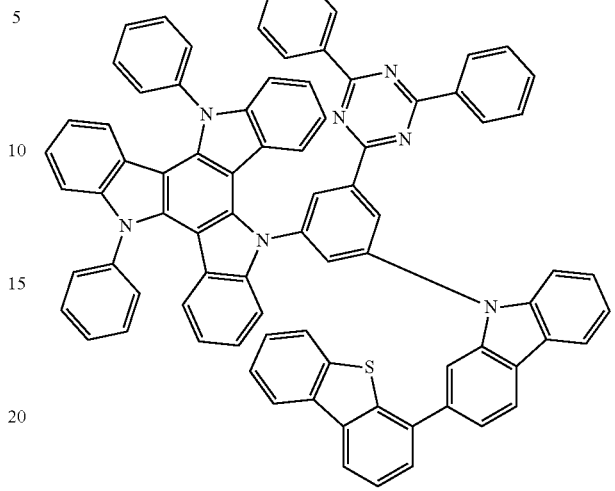
46
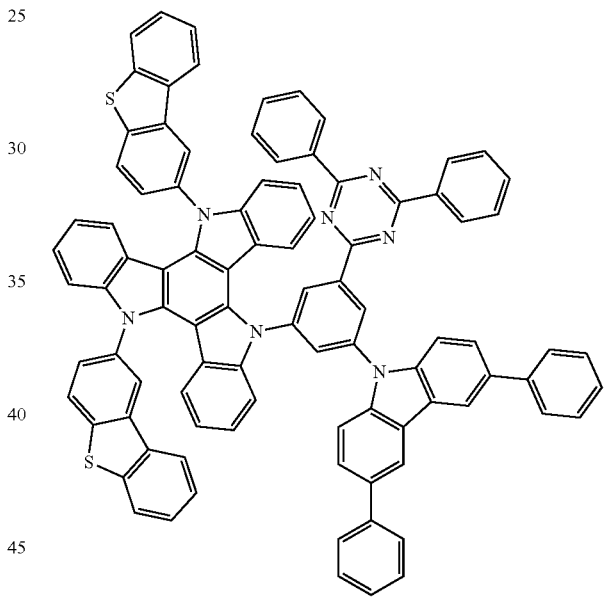
47
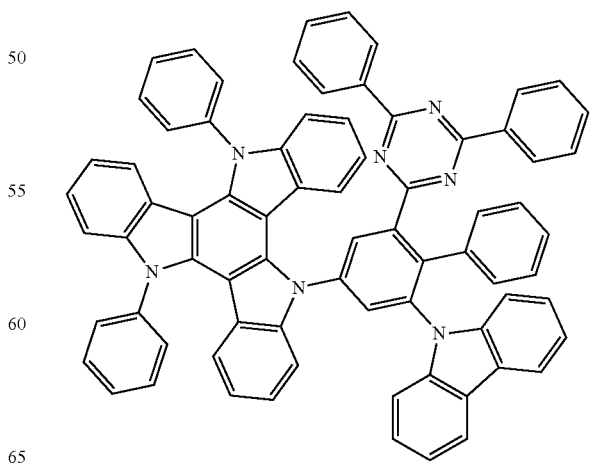

48
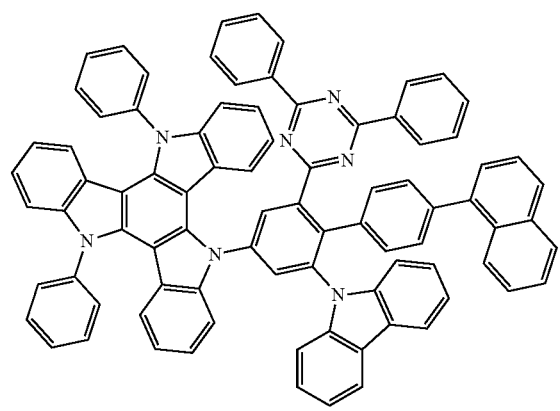
49
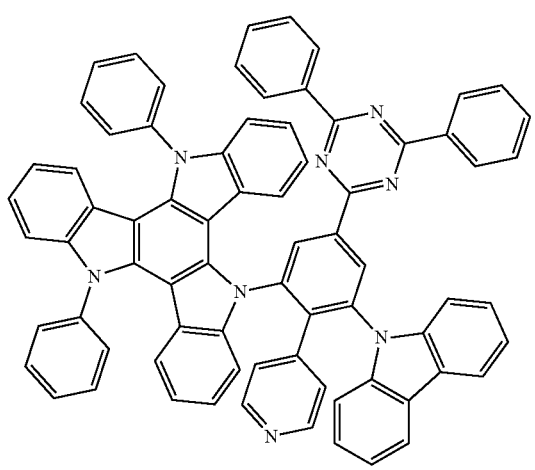
50
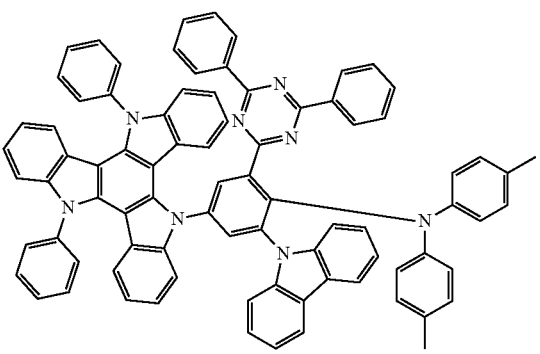
51
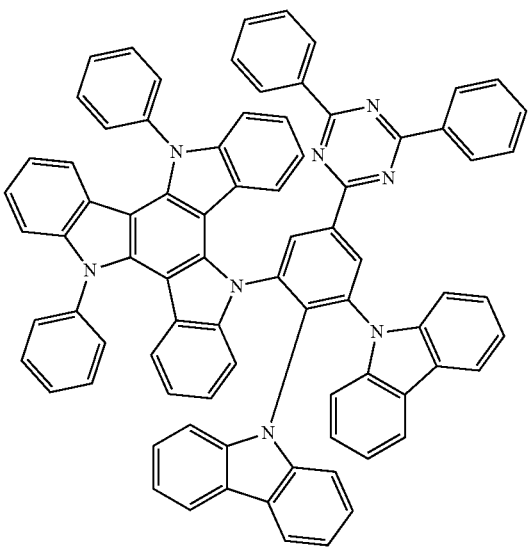
52
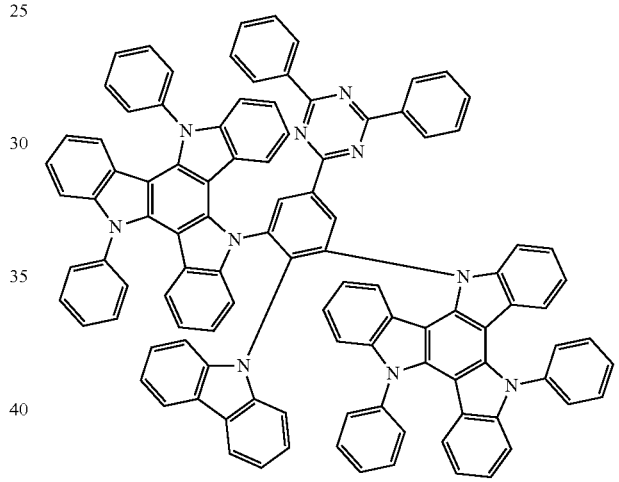
53
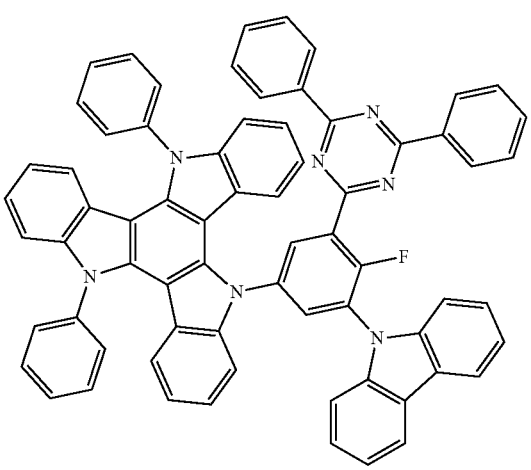

54
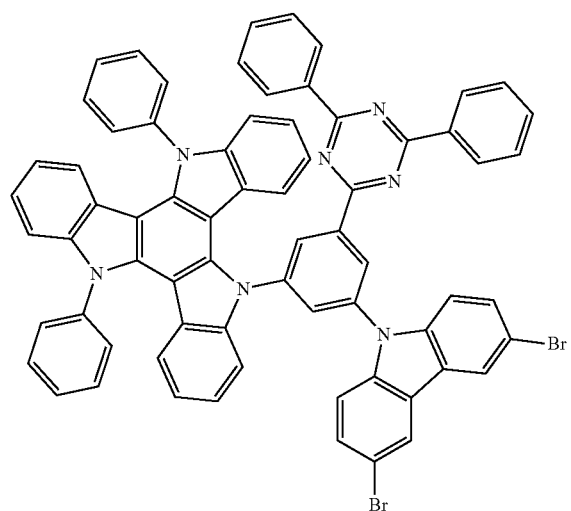
55
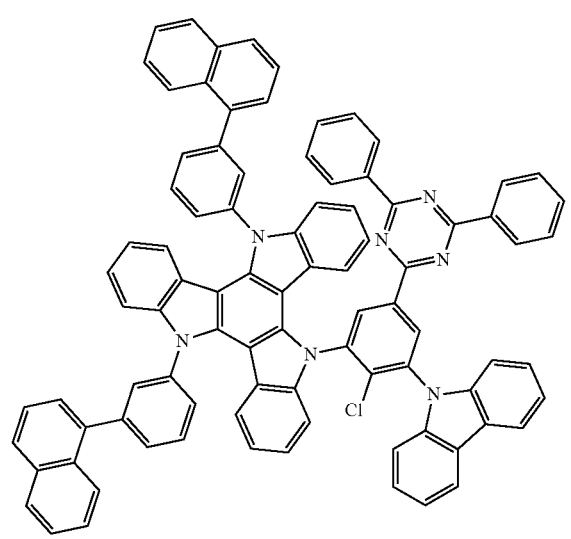
56
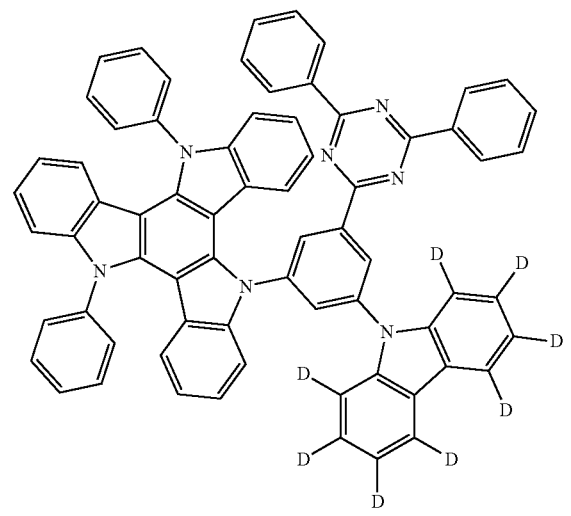
57
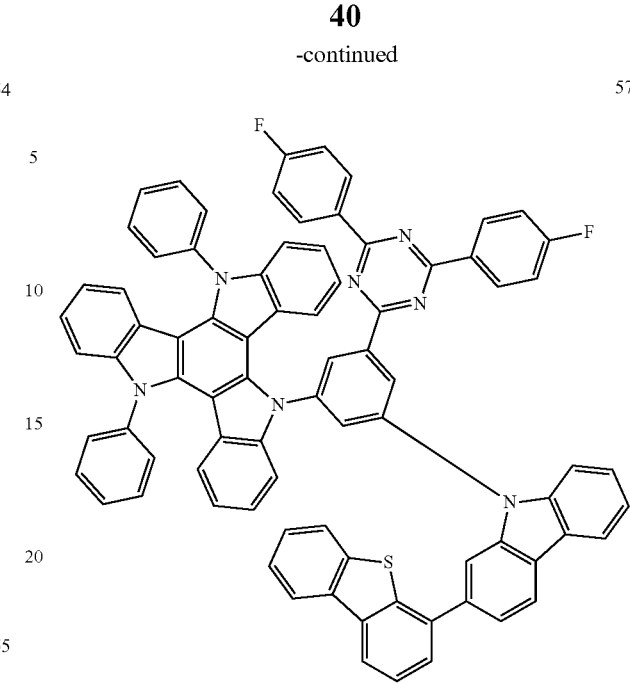
58
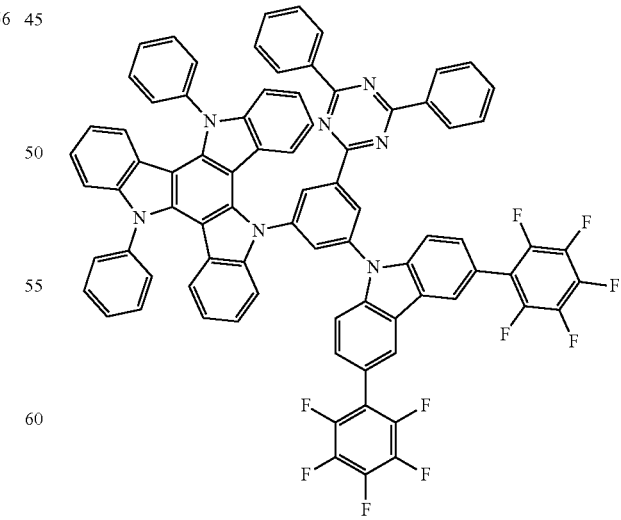

59
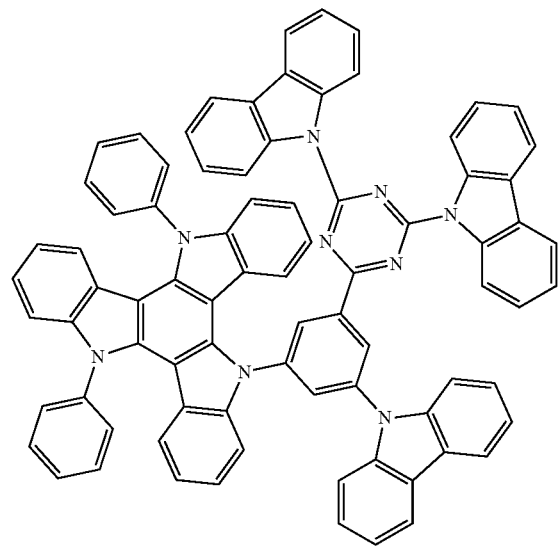
60
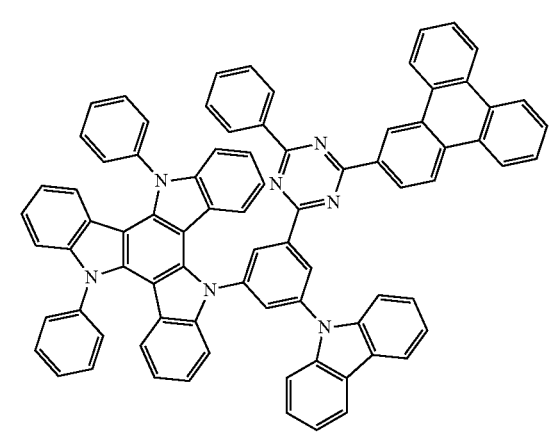
61
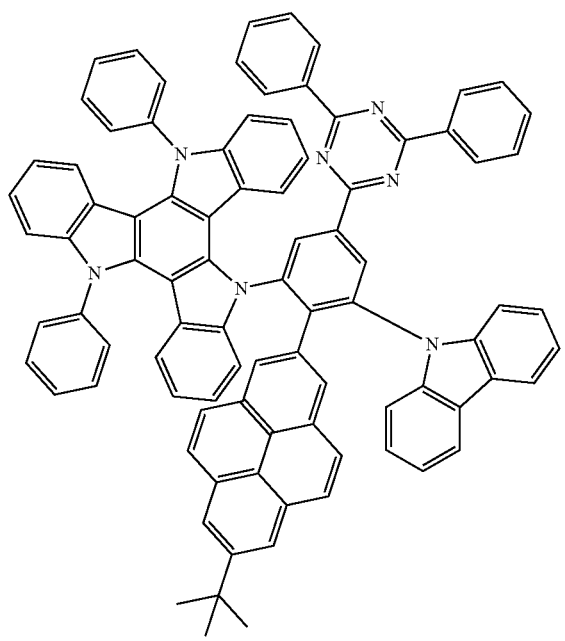
62
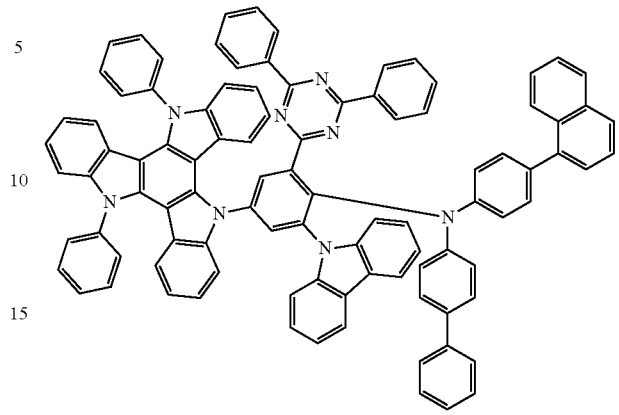
63
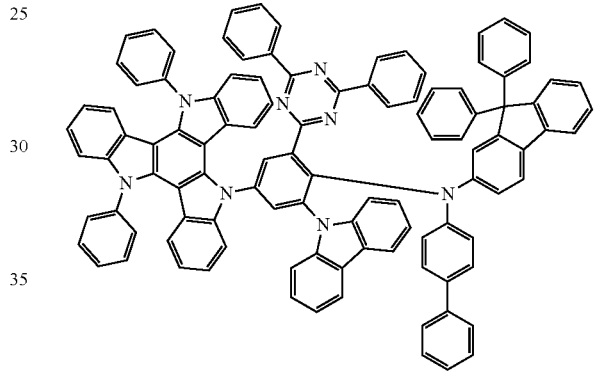
64
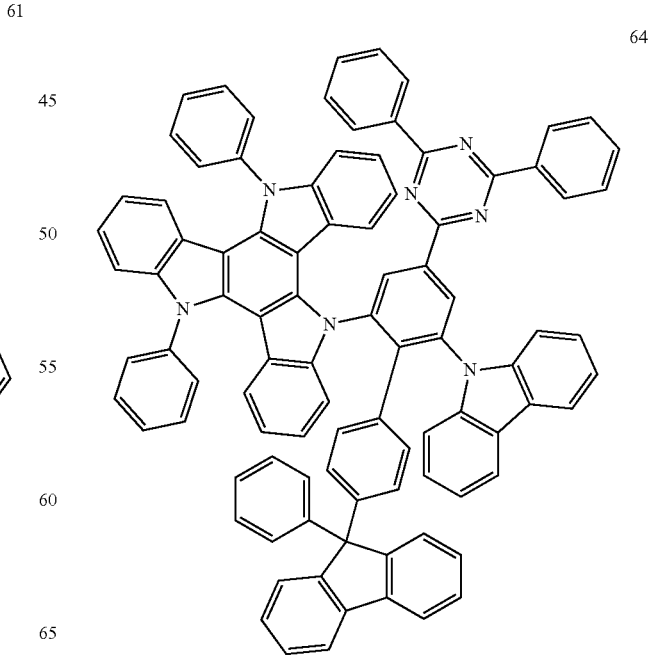

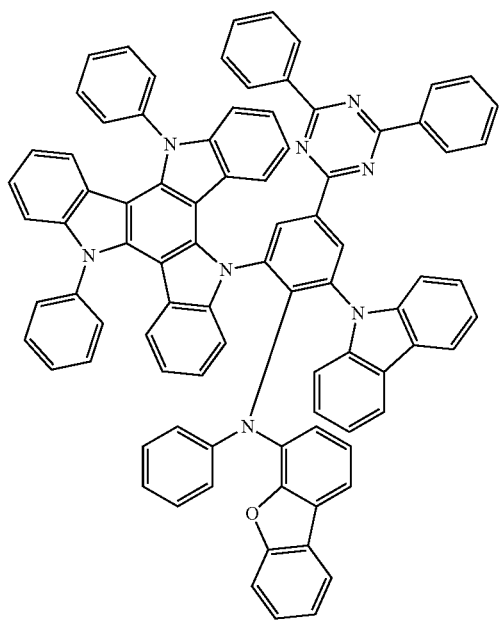

65

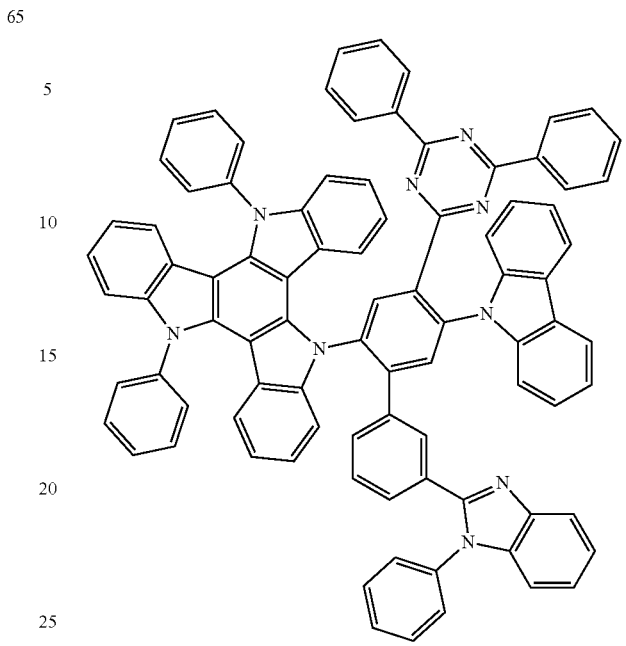

67

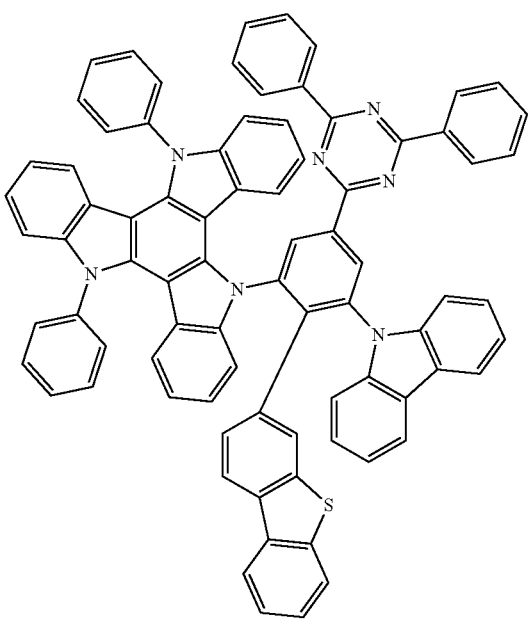

66

The above-described nitrogen-containing compound may be used in the organic electroluminescence device 10 of an embodiment to improve luminous efficiency and service life of the organic electroluminescence device. For example, the above-described nitrogen-containing compound may be used in the emission layer EML of the organic electroluminescence device 10 of an embodiment to improve the luminous efficiency and/or service life of the organic electroluminescence device.

In an embodiment, the emission layer EML may be a delayed fluorescence emission layer including a first compound and a second compound, and the nitrogen-containing compound of an embodiment represented by Formula 1 may be included in the first compound of the emission layer EML. For example, the first compound may be a dopant, and the second compound may be a host.

In an embodiment, the host may be a host to emit delayed fluorescence, and the dopant may be a dopant to emit delayed fluorescence. In some embodiments, the nitrogen-containing compound of an embodiment represented by Formula 1 may be included as a dopant material in the emission layer EML. For example, the nitrogen-containing compound of an embodiment represented by Formula 1 may be used as a TADF dopant.

In some embodiments, the organic electroluminescence device 10 of an embodiment may include a plurality of emission layers. The plurality of emission layers may be sequentially stacked, and for example, the organic electroluminescence device 10 including the plurality of emission layers may be to emit white light. The organic electroluminescence device including a plurality of emission layers may be an organic electroluminescence device having a tandem structure. When the organic electroluminescence device 10 includes a plurality of emission layers, at least one emission layer EML may include the nitrogen-containing compound according to the present disclosure as described above.

The emission layer EML may further include a dopant, and any suitable material may be used as the dopant. For example, at least one among styryl derivatives (e.g., 1,4-bis

[2-(3-N-ethylcarbazolyl)vinyl]benzene (BCzVB), 4-(di-p-tolylamino)-4-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or derivatives thereof (e.g., 2,5,8,11-tetra-t-butylperylene (TBPe)), pyrene and/or derivatives thereof (e.g., 1,1-dipyrene, 1,4-dipyrenylbenzene, 1,4-bis(N,N-diphenylamino)pyrene, and/or 1,6-bis(N,N-diphenylamino) pyrene), and/or 1,3,5-tris(1-phenyl-1H-benzo[d]imidazole-2-yl)benzene (TPBi) may be used as a dopant, but embodiments are not limited thereto.

The emission layer EML may further include any suitable material available in the art as a host material. For example, the emission layer EML may include, but is not limited to, as a host material, at least one of tris(8-hydroxyquinolino) aluminum ($Alq_3$), bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), poly(N-vinylcarbazole) (PVK), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH-2), hexaphenylcyclotrisiloxane ($DPSiO_3$), octaphenylcyclotetra siloxane ($DPSiO_4$), or 1,3,5-tris(1-phenyl-1H-benz [d]imidazole-2-yl)benzene (TPBi).

When the emission layer EML is to emit red light, the emission layer EML may further include, for example, a fluorescent material including tris(dibenzoylmethanato) phenanthroline europium ($PBD:Eu(DBM)_3(Phen)$) and/or perylene. When the emission layer EML is to emit red light, a dopant included in the emission layer EML may be, for example, a metal complex or an organometallic complex (such as bis(1-phenylisoquinoline) acetylacetonate iridium (PIQIr(acac)), tris(1-phenylquinoline) iridium (PQIr), and/or octaethylporphyrin platinum (PtOEP)), rubrene and/or derivatives thereof, and/or 4-dicyanomethylene-2-(p-dimethylaminostyryl)-6-methyl-4H-pyran (DCM) and/or derivatives thereof.

When the emission layer EML is to emit green light, the emission layer EML may further include, for example, a fluorescent material including tris(8-hydroxyquinolino)aluminum ($Alq_3$). When the emission layer EML is to emit green light, a dopant included in the emission layer EML may be, for example, selected from a metal complex or an organometallic complex (such as fac-tris(2-phenylpyridine) iridium ($Ir(ppy)_3$), and coumarins and/or derivatives thereof.

When the emission layer EML is to emit blue light, the emission layer EML may further include, for example, a fluorescent material including any one selected from the group consisting of spiro-DPVBi, spiro-6P, distyryl-benzene (DSB), distyryl-arylene (DSA), polyfluorene (PFO)-based polymer, and poly(p-phenylene vinylene) (PPV)-based polymer. When the emission layer EML is to emit blue light, the dopant contained in the emission layer EML may be, for example, a metal complex or an organometallic complex (such as $(4,6-F2ppy)_2Irpic$), or perylene and/or derivatives thereof.

In the organic electroluminescence device 10 of an embodiment illustrated in FIGS. 1 to 4, the electron transport region ETR is provided on the emission layer EML. The electron transport region ETR may include at least one of a hole blocking layer HBL, an electron transport layer ETL, or an electron injection layer EIL, but embodiments are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In some embodiments, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but embodiments of the present disclosure are not limited thereto. The thickness of the electron transport region ETR may be, for example, about 1000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.)

When the electron transport region ETR includes the electron transport layer ETL, the electron transport region ETR may include an anthracene-based compound.

However, embodiments are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate) ($Bebq_2$), 9,10-di(naphthalene-2-yl)anthracene (ADN), or a mixture thereof. The thickness of the electron transport layers ETL may be about 100 Å to about 1,000 Å, for example, about 150 Å to about 500 Å. When the thickness of the electron transport layers ETL satisfies the above-described range, satisfactory electron transport characteristics may be obtained without a substantial increase in driving voltage.

When the electron transport region ETR includes the electron injection layer EIL, the electron transport region ETR may be formed using a metal halide (such as LIF, NaCl, CsF, RbCl, and/or RbI), a lanthanide metal (such as ytterbium (Yb), a metal oxide (such as $Li_2O$ and/or BaO), or lithium quinolate (LiQ), etc., but embodiments of the present disclosure are not limited thereto. The electron injection layer EIL may also be formed of a mixture of an electron transport material and an insulating organo-metal salt. The organo-metal salt may be a material having an energy band gap of about 4 eV or more. In some embodiments, the organo-metal salt may include, for example, metal acetates, metal benzoates, metal acetoacetates, metal acetylacetonates, and/or metal stearates. The thickness of the electron injection layer EIL may be about 1 Å to about 100 Å, or about 3 Å to about 90 Å. When the thickness of the electron injection layers EIL satisfies the above-described range, satisfactory electron injection properties may be obtained without a substantial increase in driving voltage.

The electron transport region ETR may include a hole blocking layer HBL as described above. The hole blocking layer HBL may include, but is not limited to, for example, at least one of 2,9-dimethyl-4,7-diphenyl-1,10-phenanthroline (BCP), bis[2-(diphenylphosphino)phenyl]ether oxide (DPEPO), or 4,7-diphenyl-1,10-phenanthroline (Bphen).

The second electrode EL2 is provided on the electron transport region ETR. The second electrode EL2 may be a common electrode or a negative electrode. The second electrode EL2 may be a transmissive electrode, a transflective electrode, or a reflective electrode. When the second electrode EL2 is a transmissive electrode, the second electrode EL2 may be formed of transparent metal oxides, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, a mixture thereof (for example, a mixture of Ag and Mg) or an oxide thereof (e.g., ITO, IZO). In some embodiments, the second electrode EL2 may have a multilayer structure including a reflective layer or a transflective layer formed of the above-described materials, and a transparent conductive layer formed of ITO, IZO, ZnO, ITZO, etc.

In some embodiments, the second electrode EL2 may be connected with an auxiliary electrode. When the second electrode EL2 is connected to the auxiliary electrode, the resistance of the second electrode EL2 may decrease.

Referring to FIG. 4, the organic electroluminescence device 10 according to an embodiment may further include a capping layer CPL on the second electrode EL2. The capping layer CPL may include, for example, α-NPD, NPB, TPD, m-MTDATA, Alq$_3$, CuPc, N4, N4, N4', N4'-tetra (biphenyl-4-yl) biphenyl-4,4'-diamine (TPD15), 4,4',4"-Tris (carbazol-9-yl) triphenylamine (TCTA), etc.

The organic electroluminescence device 10 according to an embodiment of the present disclosure may include the nitrogen-containing compound represented by Formula 1 as described above to thereby exhibit excellent luminous efficiency and a long service life characteristics. In addition, the organic electroluminescence device 10 of an embodiment may achieve high efficiency and/or long service life characteristics in a blue wavelength region.

Hereinafter, with reference to Examples and Comparative Examples, a compound according to an embodiment of this present disclosure and an organic electroluminescence device of an embodiment will be described in more detail. The Examples shown below are illustrated only for the understanding of this present disclosure, and the scope of the present disclosure is not limited thereto.

EXAMPLES

Synthesis of Nitrogen-Containing Compound

In the following descriptions, an example synthetic method of a nitrogen-containing compound is provided, but synthetic methods of the nitrogen-containing compound according to an embodiment of the present disclosure are not limited thereto.

1. Synthesis of Compound 1

Synthesis of Intermediate A

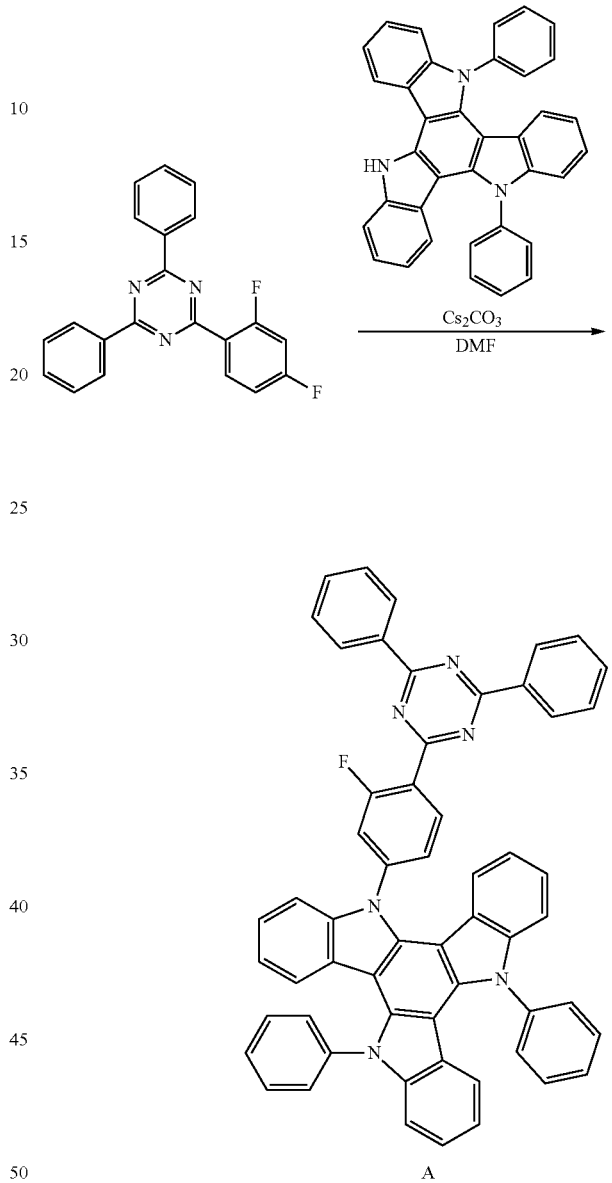

1-(2,4-difluorophenyl)-3,5-diphenyltriazine (2.0 g), 5,10-diphenyl-15-hydro-5H-diindolo [3,2-a:3',2'-c]carbazole (2.9 g) and CsCO$_3$ (3.8 g) were added to a 300-mL three-necked flask and replaced with an Ar atmosphere. Then, 120 mL of dehydrated DMF was added thereto, and the reactant was heated and stirred at 120° C. for 4 hours. The resulting reaction solution was quenched with water, and an organic layer was extracted with dichloromethane, dried with MgSO$_4$, concentrated with an evaporator, and recrystallized with toluene and ethanol to obtain a pale yellow solid (3.5 g, yield 74%). The obtained solid had a molecular weight of 823 m/z in FAB-MS measurement, and thus it was confirmed that Intermediate A was obtained.

Synthesis of Compound 1

2. Synthesis of Compound 3

Synthesis of Intermediate B

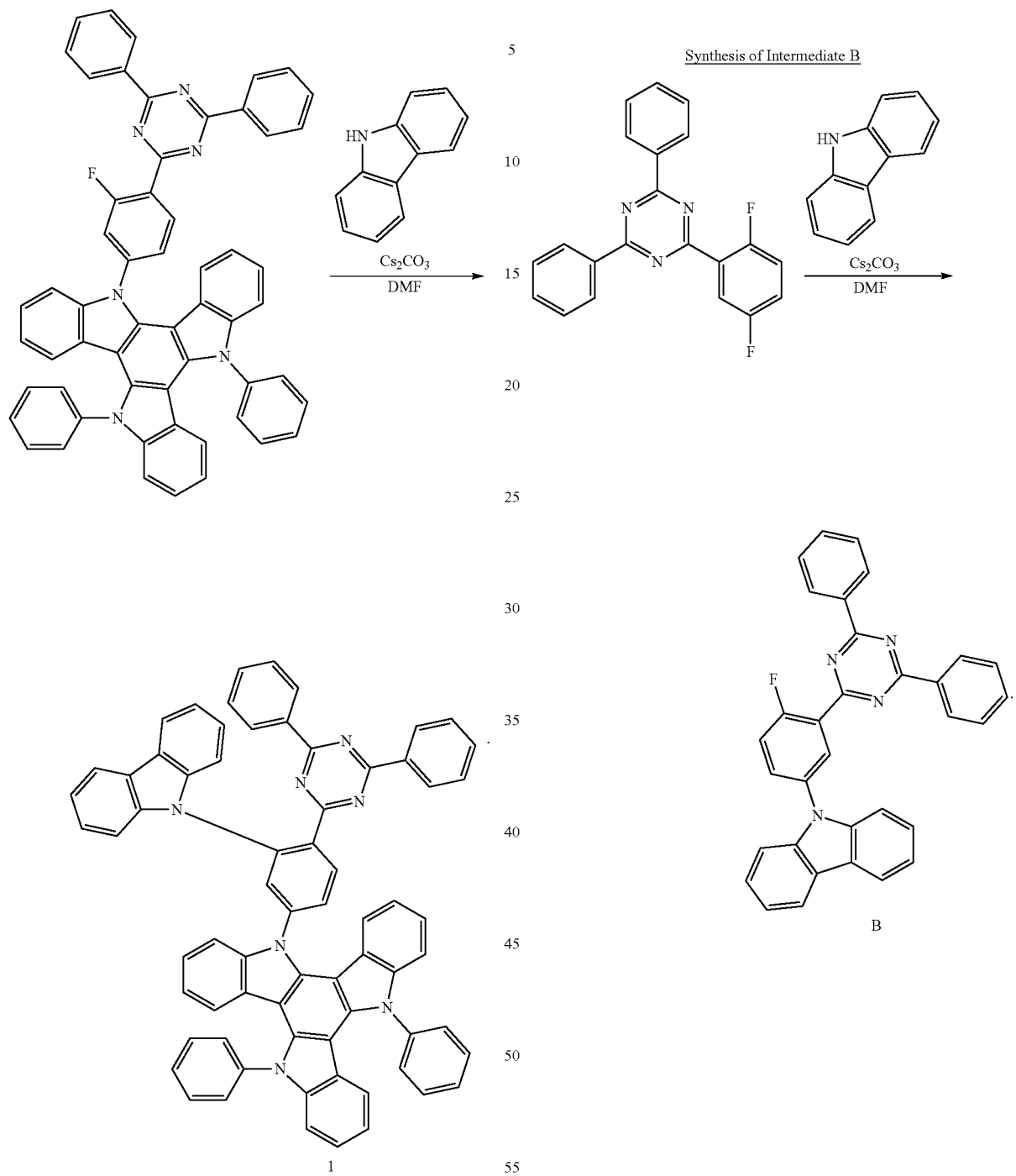

The synthetic sequence of Intermediate A was performed using Intermediate A (3.0 g) and carbazole (0.6 g) instead of 1-(2,4-difluorophenyl)-3,5-diphenyltriazine, and 5,10-diphenyl-15-hydro-5H-diindolo [3,2-a:3',2'-c]carbazole to obtain a pale yellow solid (2.4 g, yield 68%). The obtained solid had a molecular weight of 970 m/z in FAB-MS measurement, and thus it was confirmed that Compound 1 was obtained.

The synthetic sequence of Intermediate A was performed using 1-(2,5-difluorophenyl)-3,5-diphenyltriazine (3.0 g) and carbazole (1.5 g) instead of 1-(2,4-difluorophenyl)-3,5-diphenyltriazine, and 5,10-diphenyl-15-hydro-5H-diindolo [3,2-a:3',2'-c]carbazole to obtain a pale yellow solid (4.4 g, yield 62%). The obtained solid had a molecular weight of 493 m/z in FAB-MS measurement, and thus it was confirmed that Intermediate B was obtained.

Synthesis of Compound 3

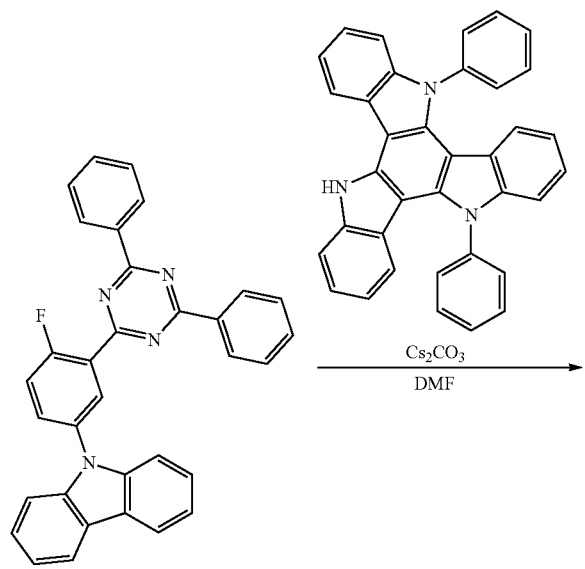

3. Synthesis of Compound 4

Synthesis of Intermediate C

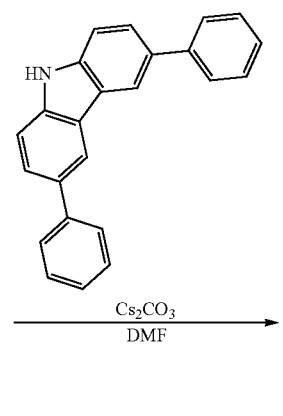

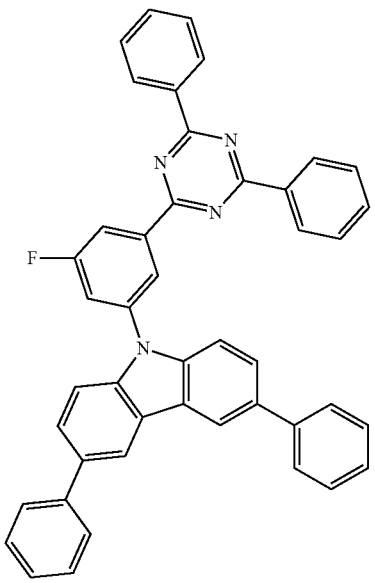

C

The synthetic sequence of Intermediate A was performed at 150° C. using Intermediate B (4.0 g) instead of 1-(2,4-difluorophenyl)-3,5-diphenyltriazine to obtain a pale yellow solid (1.7 g, yield 22%). The obtained solid had a molecular weight of 970 m/z in FAB-MS measurement, and thus it was confirmed that Compound 3 was obtained.

The synthetic sequence of Intermediate A was performed using 1-(3,5-difluorophenyl)-3,5-diphenyltriazine (3.0 g) and 3,6-diphenylcarbazole (2.8 g) instead of 1-(2,4-difluorophenyl)-3,5-diphenyltriazine and 5,10-diphenyl-15-hydro-5H-diindolo[3,2-a:3',2'-c]carbazole to obtain a pale yellow solid (4.6 g, yield 83%). The obtained solid had a molecular weight of 645 m/z in FAB-MS measurement, and thus it was confirmed that Intermediate C was obtained.

Synthesis of Compound 4

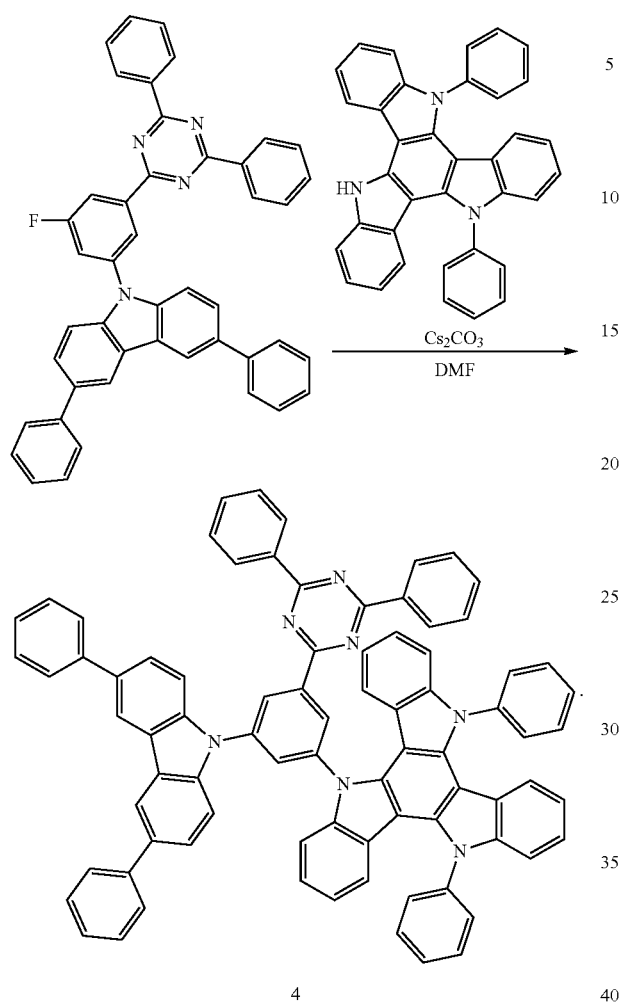

4

The synthetic sequence of Intermediate A was performed using Intermediate C (4.0 g) instead of 1-(2,4-difluorophenyl)-3,5-diphenyltriazine to obtain a pale yellow solid (4.0 g, yield 77%). The obtained solid had a molecular weight of 970 m/z in FAB-MS measurement, and thus it was confirmed that Compound 4 was obtained.

4. Synthesis of Compound 5

Synthesis of Intermediate D

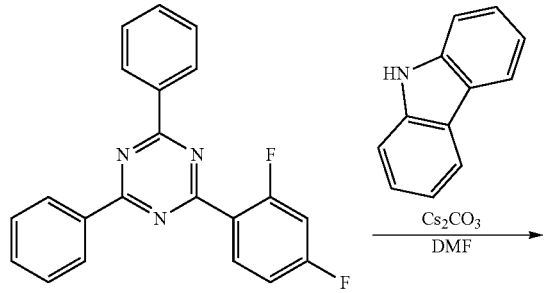

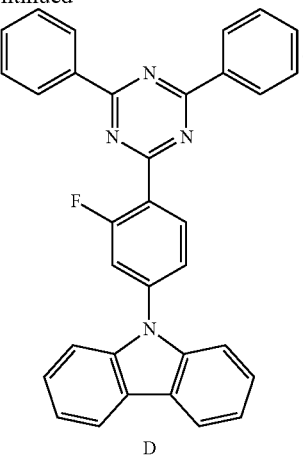

D

The synthetic sequence of Intermediate A was performed using carbazole (1.5 g) instead of 5,10-diphenyl-15-hydro-5H-diindolo[3,2-a:3',2'-c]carbazole to obtain a white solid (4.6 g, yield 80%). The obtained solid had a molecular weight of 493 m/z in FAB-MS measurement, and thus it was confirmed that Intermediate D was obtained.

Synthesis of Compound 5

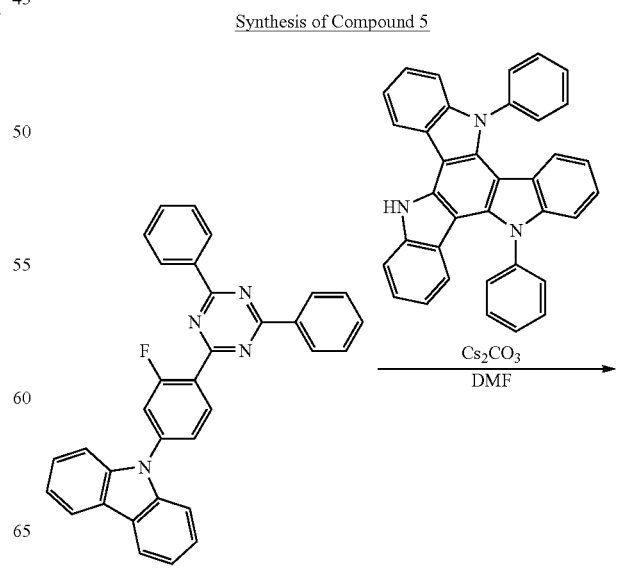

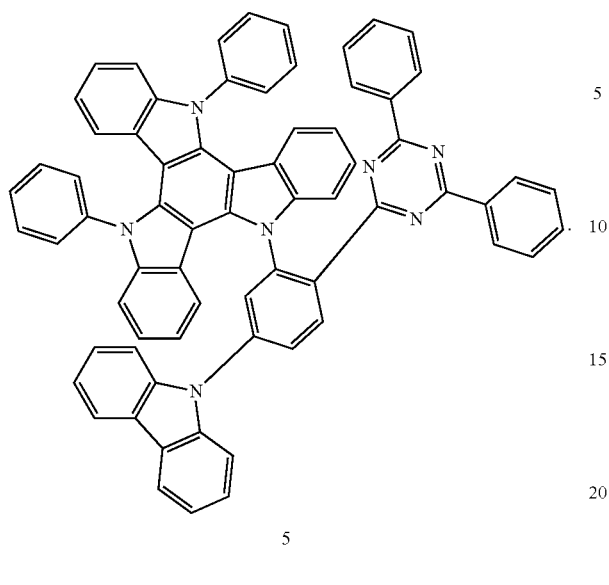

E

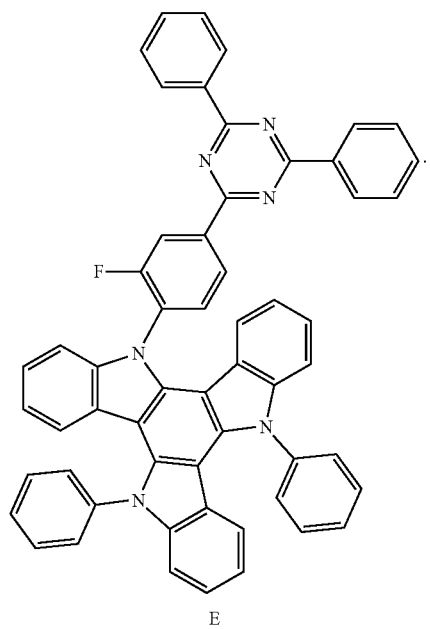

The synthetic sequence of Intermediate A was performed at 170° C. using Intermediate D (4.0 g) instead of 1-(2,4-difluorophenyl)-3,5-diphenyltriazine to obtain a pale yellow solid (1.3 g, yield 17%). The obtained solid had a molecular weight of 970 m/z in FAB-MS measurement, and thus it was confirmed that Compound 5 was obtained.

5. Synthesis of Compound 8

The synthetic sequence of Intermediate A was performed using 1-(3,4-difluorophenyl)-3,5-diphenyltriazine (3.0 g) instead of 1-(2,4-difluorophenyl)-3,5-diphenyltriazine to obtain a pale yellow solid (5.9 g, yield 82%). The obtained solid had a molecular weight of 823 m/z in FAB-MS measurement, and thus it was confirmed that Intermediate E was obtained.

Synthesis of Intermediate E

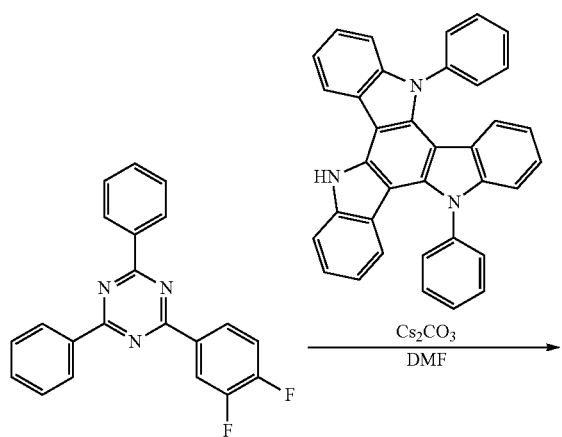

Synthesis of Compound 8

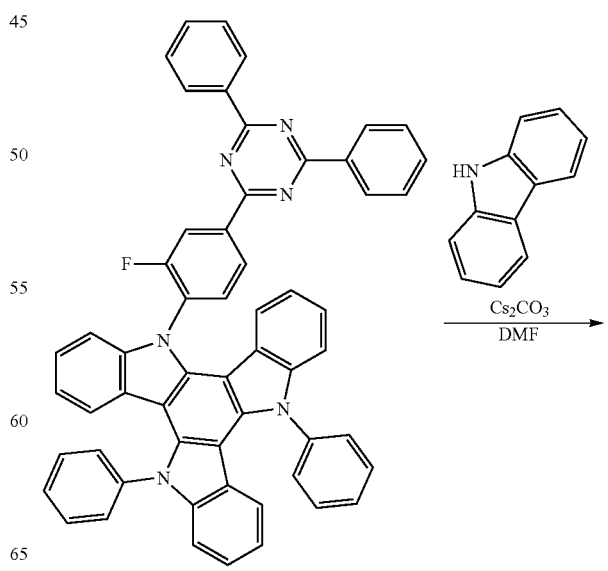

-continued

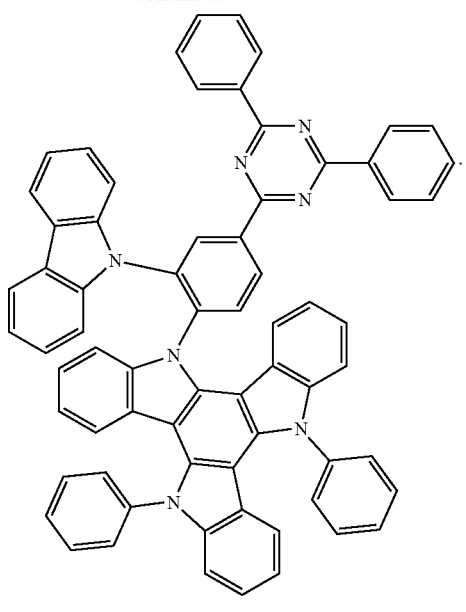

8

-continued

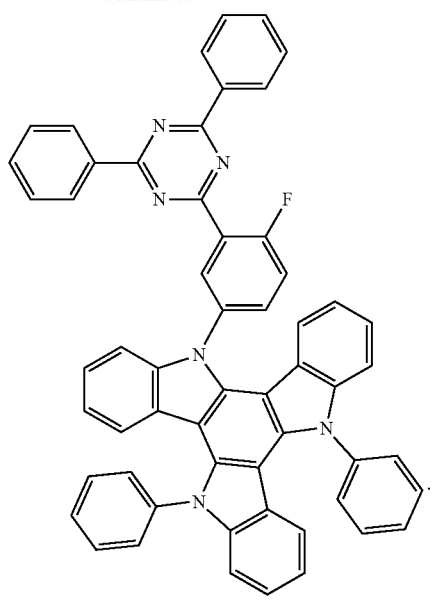

F

The synthetic sequence of Intermediate A was performed using Intermediate E (5.0 g) and carbazole (1.0 g) instead of 1-(2,4-difluorophenyl)-3,5-diphenyltriazine, 5,10-diphenyl-15-hydro-5H-diindolo[3,2-a:3',2'-c]carbazole to obtain a pale yellow solid (4.1 g, yield 70%). The obtained solid had a molecular weight of 970 m/z in FAB-MS measurement, and thus it was confirmed that Compound 8 was obtained.

The synthetic sequence of Intermediate A was performed using 1-(2,5-difluorophenyl)-3,5-diphenyltriazine (4.0 g) instead of 1-(2,4-difluorophenyl)-3,5-diphenyltriazine to obtain a pale yellow solid (6.8 g, yield 71%). The obtained solid had a molecular weight of 823 m/z in FAB-MS measurement, and thus it was confirmed that Intermediate F was obtained.

6. Synthesis of Compound 9

Synthesis of Intermediate F

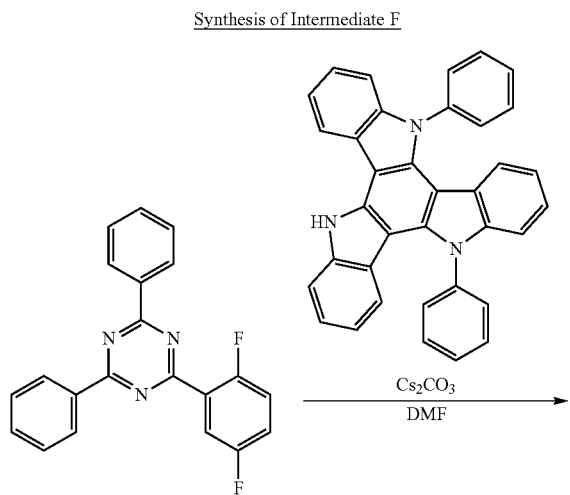

Synthesis of Compound 9

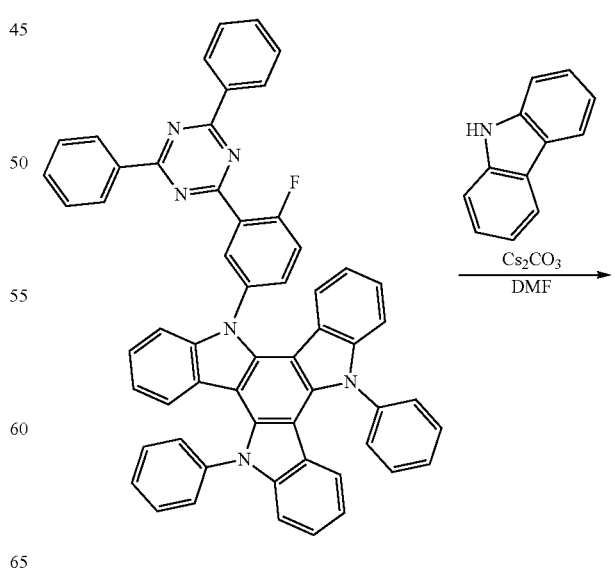

-continued

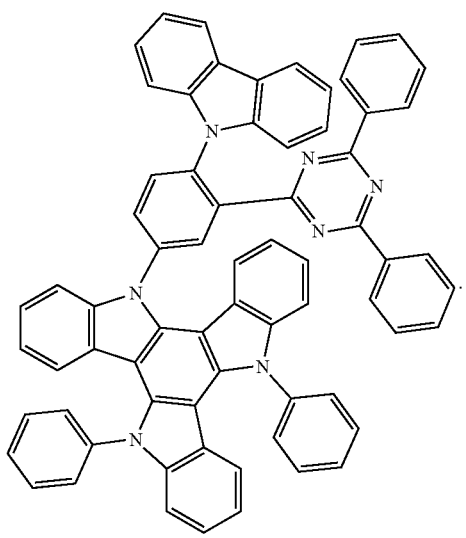

9

-continued

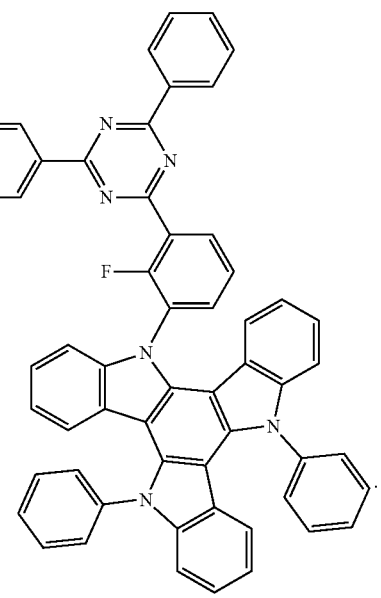

G

The synthetic sequence of Intermediate A was performed using Intermediate F (6.0 g) and carbazole (1.2 g) instead of 1-(2,4-difluorophenyl)-3,5-diphenyltriazine and 5,10-diphenyl-15-hydro-5H-diindolo[3,2-a:3',2'-c]carbazole to obtain a pale yellow solid (5.0 g, yield 70%). The obtained solid had a molecular weight of 970 m/z in FAB-MS measurement, and thus it was confirmed that Compound 9 was obtained.

The synthetic sequence of Intermediate A was performed using 1-(2,3-difluorophenyl)-3,5-diphenyltriazine (4.0 g) instead of 1-(2,4-difluorophenyl)-3,5-diphenyltriazine to obtain a pale yellow solid (6.4 g, yield 68%). The obtained solid had a molecular weight of 823 m/z in FAB-MS measurement, and thus it was confirmed that Intermediate G was obtained.

7. Synthesis of Compound 13

Synthesis of Intermediate G

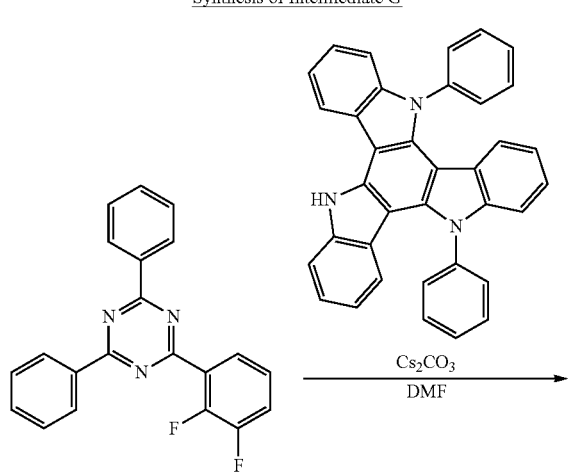

Synthesis of Compound 13

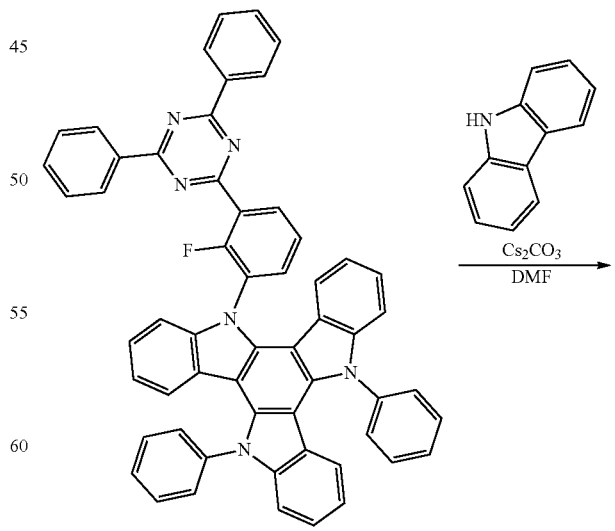

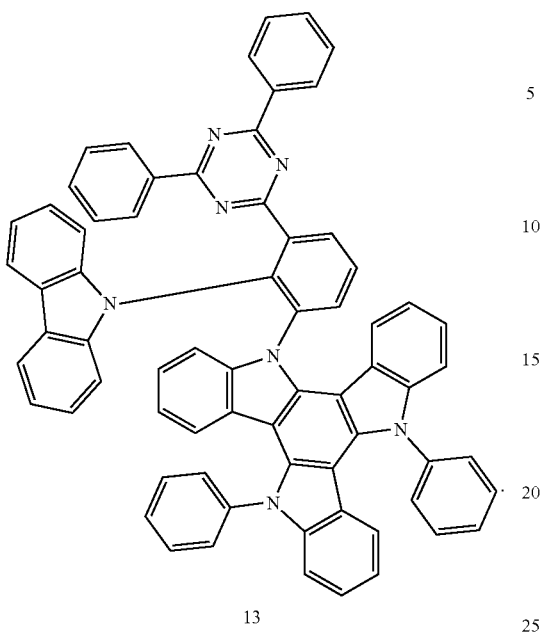

13

The synthetic sequence of Intermediate A was performed using Intermediate G (6.0 g) and carbazole (1.2 g) instead of 1-(2,4-difluorophenyl)-3,5-diphenyltriazine and 5,10-diphenyl-15-hydro-5H-diindolo[3,2-a:3',2'-c]carbazole to obtain a pale yellow solid (5.7 g, yield 80%). The obtained solid had a molecular weight of 970 m/z in FAB-MS measurement, and thus it was confirmed that Compound 13 was obtained.

8. Synthesis of Compound 14

Synthesis of Intermediate H

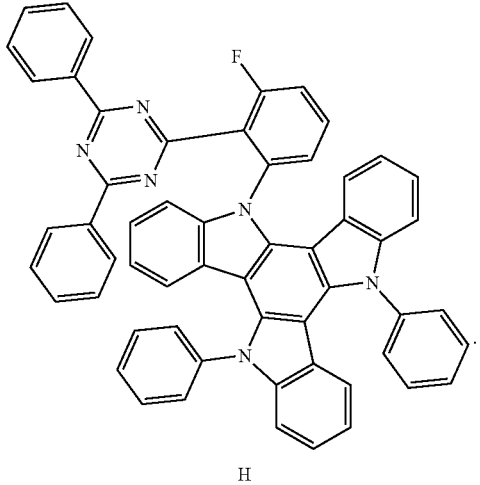

H

The synthetic sequence of Intermediate A was performed using 1-(2,6-difluorophenyl)-3,5-diphenyltriazine (4.0 g) instead of 1-(2,4-difluorophenyl)-3,5-diphenyltriazine to obtain a pale yellow solid (6.7 g, yield 70%). The obtained solid had a molecular weight of 823 m/z in FAB-MS measurement, and thus it was confirmed that Intermediate H was obtained.

Synthesis of Compound 14

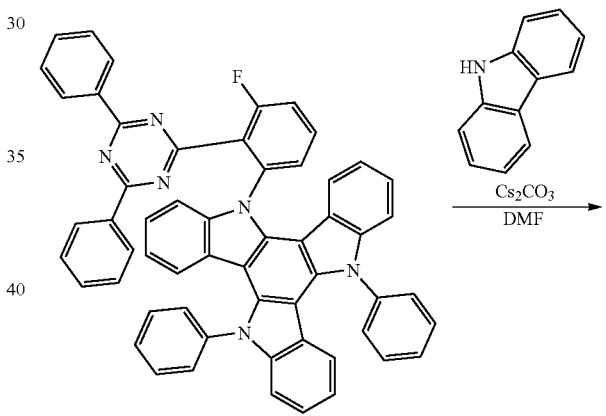

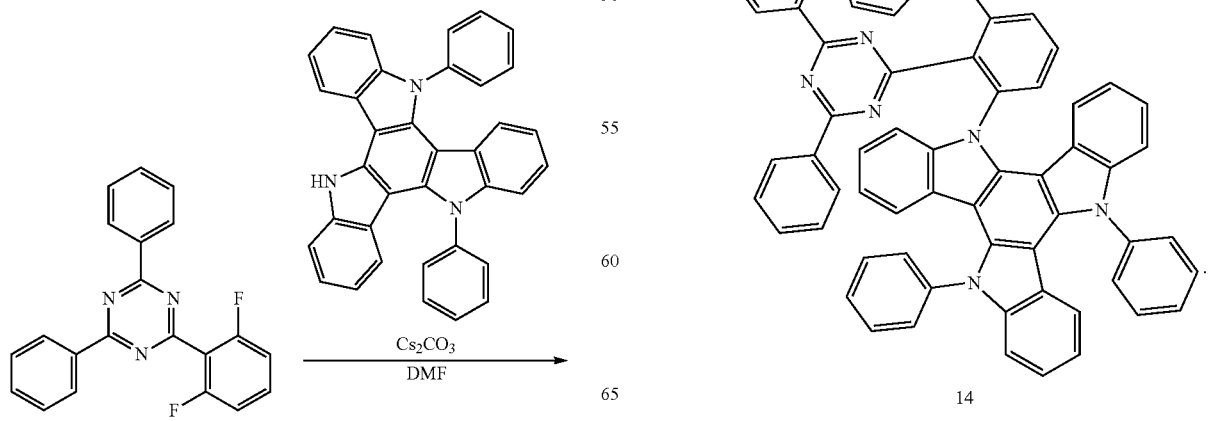

14

The synthetic sequence of Intermediate A was performed using Intermediate H (6.0 g) and carbazole (1.2 g) instead of 1-(2,4-difluorophenyl)-3,5-diphenyltriazine and 5,10-diphenyl-15-hydro-5H-diindolo[3,2-a:3',2'-c]carbazole to obtain a pale yellow solid (0.9 g, yield 13%). The obtained solid had a molecular weight of 970 m/z in FAB-MS measurement, and thus it was confirmed that Compound 14 was obtained.

9. Synthesis of Compound 15

Synthesis of Intermediate I

Synthesis of Compound 15

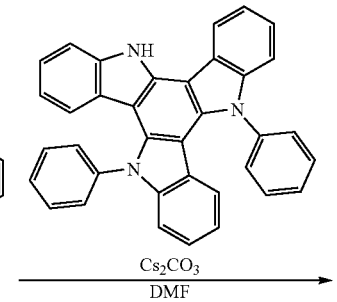

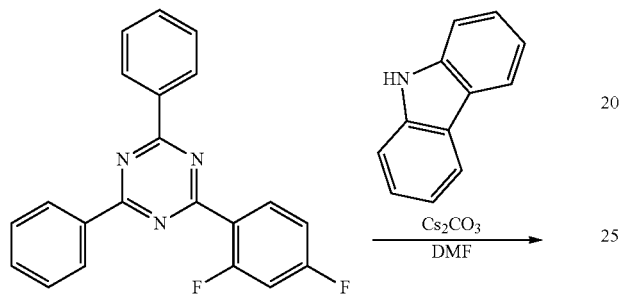

The synthetic sequence of Intermediate A was performed using carbazole (1.0 g) instead of 5,10-diphenyl-15-hydro-5H-diindolo[3,2-a:3',2'-c]carbazole to obtain a pale yellow solid (2.0 g, yield 70%). The obtained solid had a molecular weight of 493 m/z in FAB-MS measurement, and thus it was confirmed that Intermediate I was obtained.

The synthetic sequence of Intermediate A was performed using Intermediate I (2.0 g) instead of 1-(2,4-difluorophenyl)-3,5-diphenyltriazine to obtain a pale yellow solid (1.8 g, yield 45%). The obtained solid had a molecular weight of 970 m/z in FAB-MS measurement, and thus it was confirmed that Compound 15 was obtained.

10. Synthesis of Compound 16

Synthesis of Intermediate J

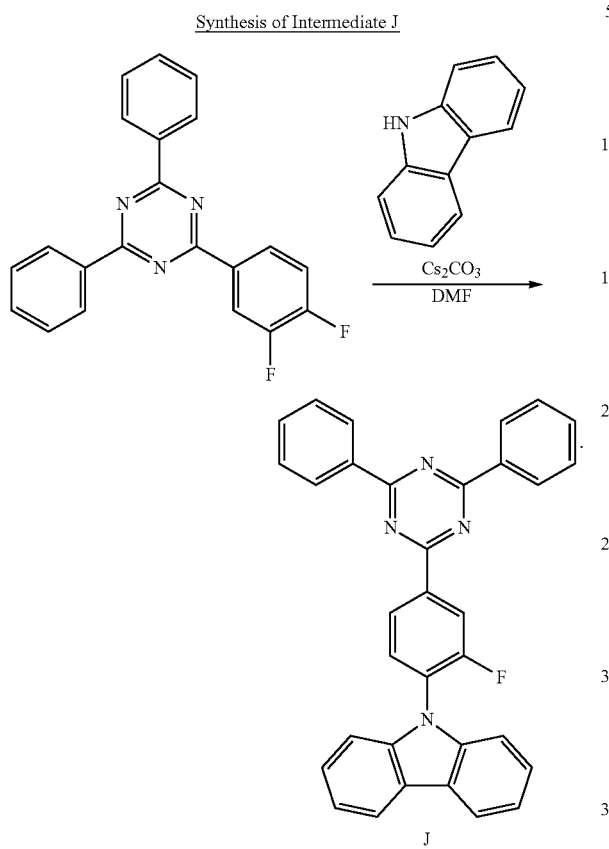

J

The synthetic sequence of Intermediate A was performed using carbazole (1.0 g) instead of 5,10-diphenyl-15-hydro-5H-diindolo[3,2-a:3',2'-c]carbazole to obtain a pale yellow solid (2.2 g, yield 76%). The obtained solid had a molecular weight of 493 m/z in FAB-MS measurement, and thus it was confirmed that Intermediate J was obtained.

Synthesis of Compound 15

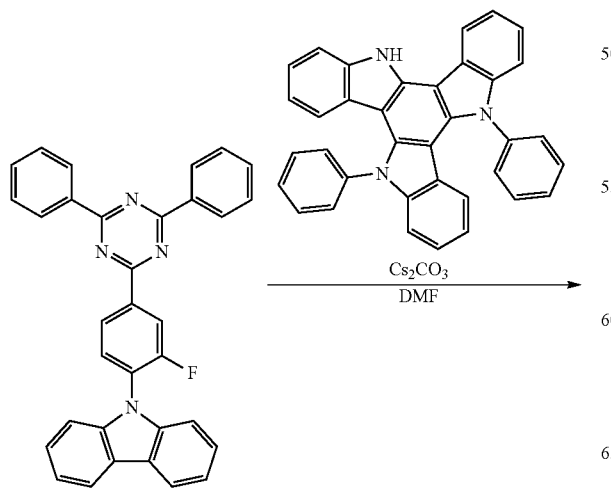

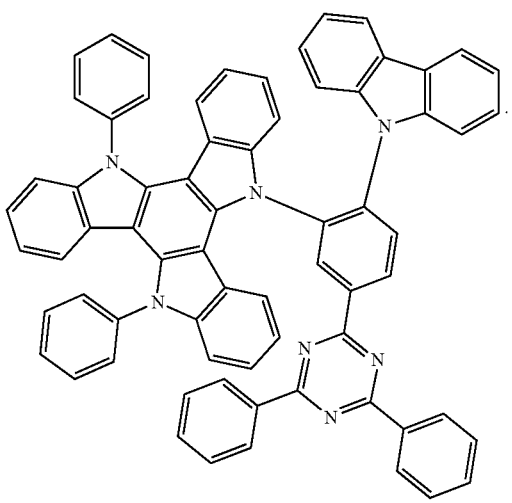

16

The synthetic sequence of Intermediate A was performed using Intermediate J. (2.0 g) instead of 1-(2,4-difluorophenyl)-3,5-diphenyltriazine to obtain a pale yellow solid (2.6 g, yield 65%). The obtained solid had a molecular weight of 970 m/z in FAB-MS measurement, and thus it was confirmed that Compound 16 was obtained.

Manufacture of Organic Electroluminescence Device

Organic electroluminescence devices according to Examples 1 to 10 were manufactured using the above-described Compounds as emission layer materials:

Example Compounds

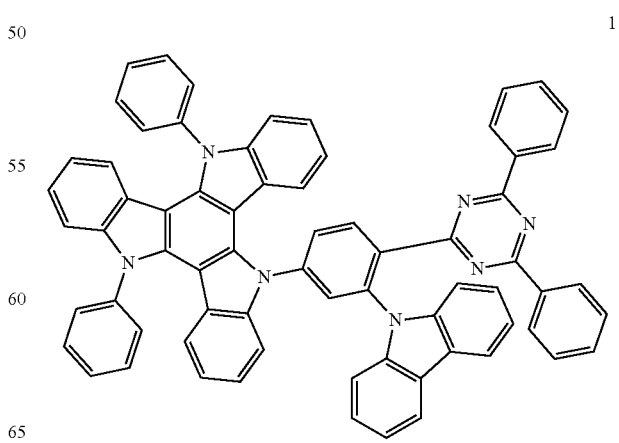

1

-continued
3
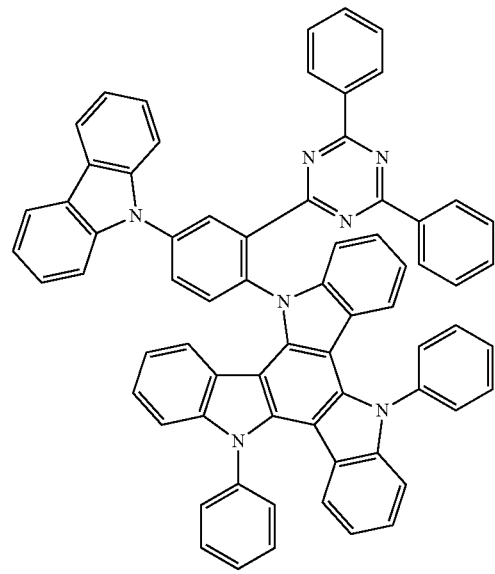
5
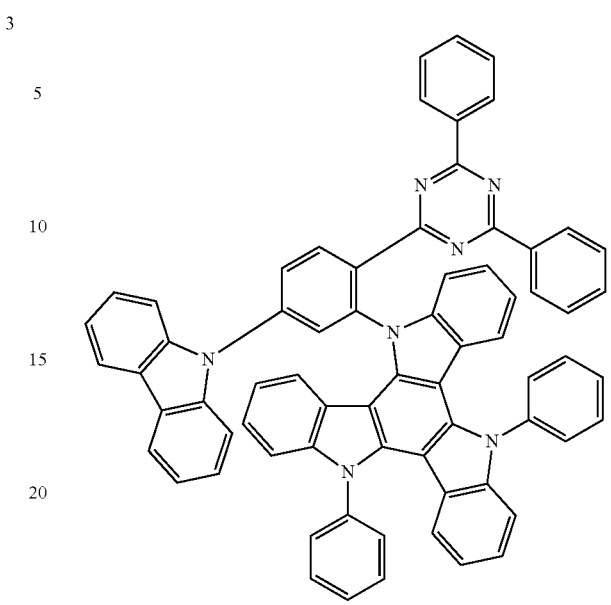
8
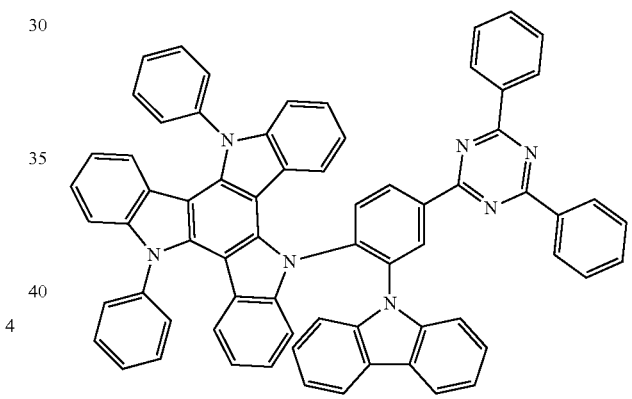
4
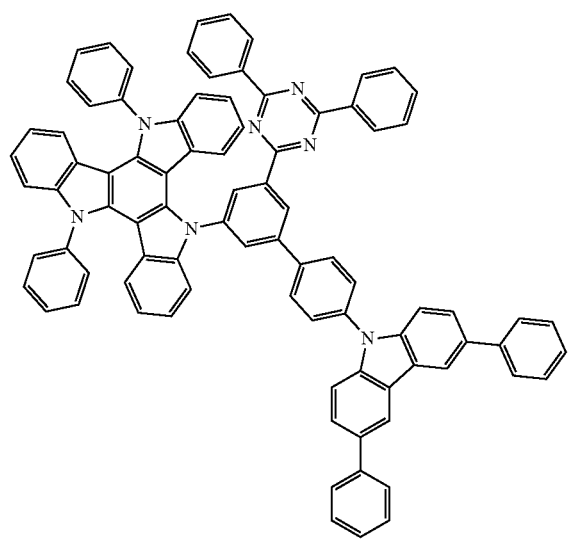
9
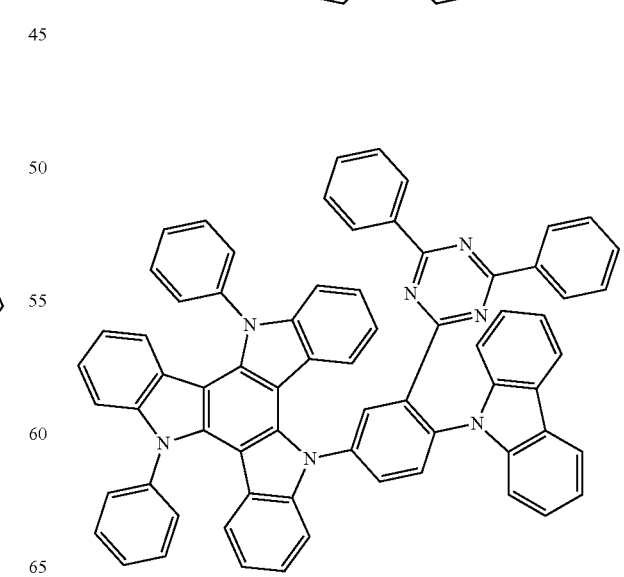

13
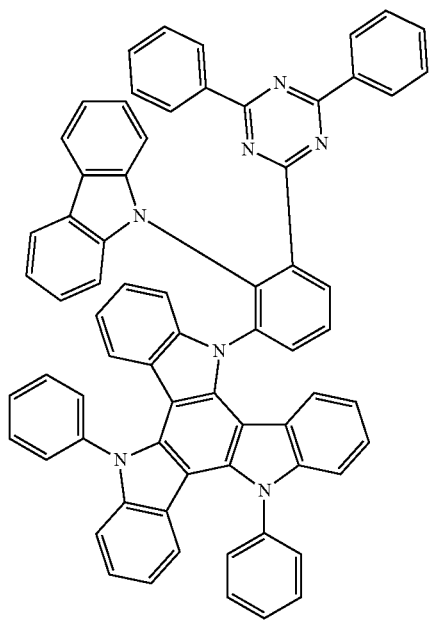
14
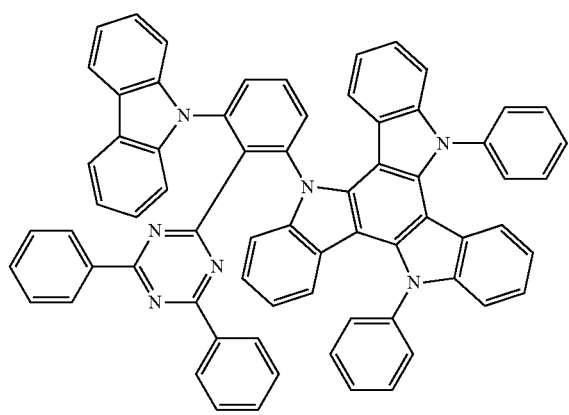
15
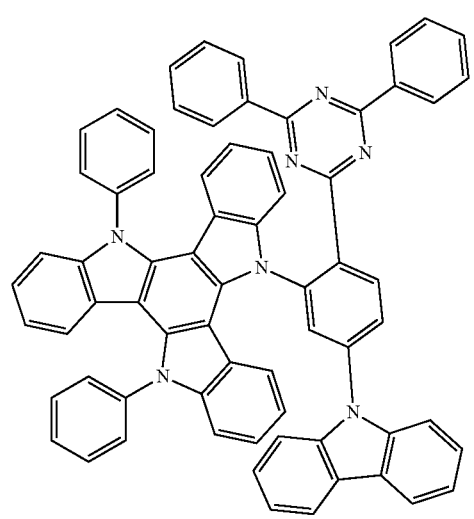
16
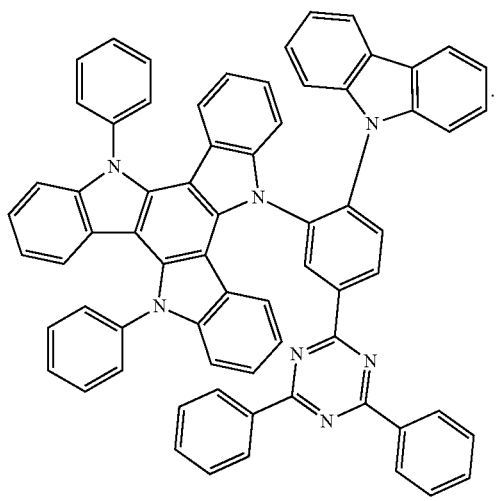
Organic electroluminescence devices according to Comparative Example 1 to 5 were manufactured using Comparative Example Compounds as emission layer materials.
Comparative Example Compounds
X-1
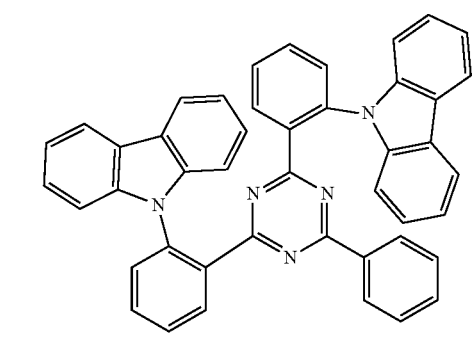
X-2
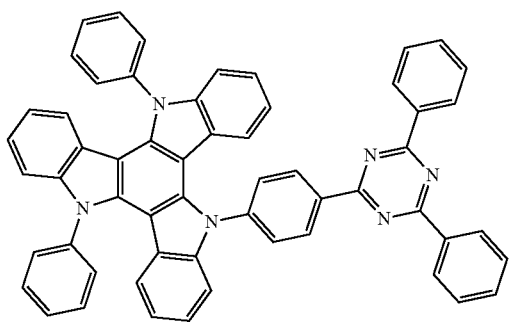

X-3

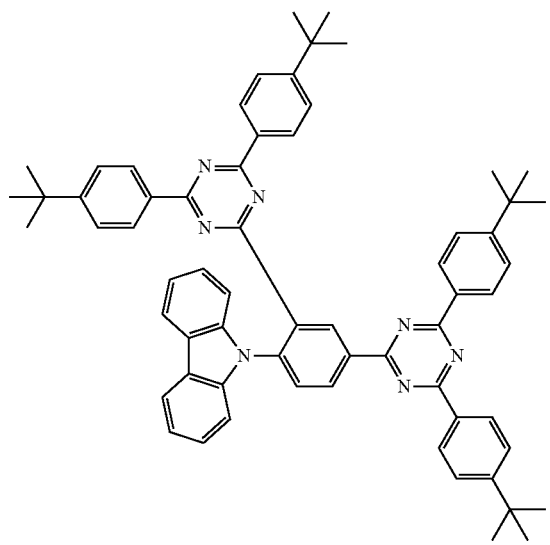

X-4

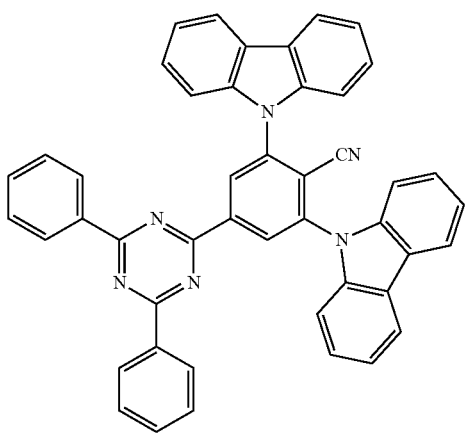

X-5

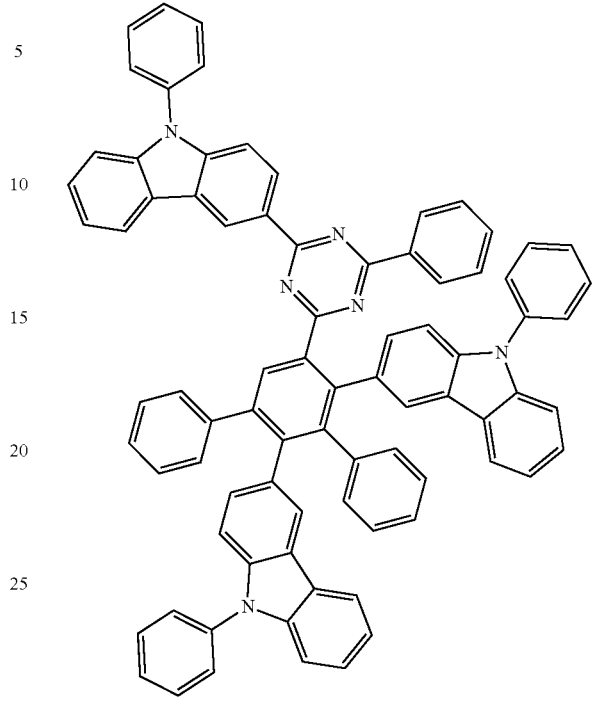

The fluorescence luminescence characteristics of the Example Compounds and the Comparative Example Compounds were evaluated. A JASCO V-670 spectrometer was used to evaluate the room temperature and 77K emission spectra of a mixed thin film containing 18% of fluorescent material in DPEPO, prepared to have a thickness of 50 nm. Through this, the T1 energy level was calculated and evaluated with $\Delta E_{ST}$. The fluorescence lifetime was measured by Hamamatsu Photonics Quantaurus-Tau to evaluate the delayed fluorescence lifetime.

TABLE 1

|  | T1 energy level (eV) | $\Delta$EST | Delayed fluorescence lifetime (usec) |
|---|---|---|---|
| Example Compound 1 | 2.65 | 0.09 | 5.2 |
| Example Compound 3 | 2.60 | 0.05 | 3.1 |
| Example Compound 4 | 2.63 | 0.05 | 4.3 |
| Example Compound 5 | 2.61 | 0.06 | 4.8 |
| Example Compound 8 | 2.62 | 0.10 | 4.9 |
| Example Compound 9 | 2.64 | 0.08 | 4.9 |
| Example Compound 13 | 2.61 | 0.04 | 2.9 |
| Example Compound 14 | 2.63 | 0.04 | 4.6 |
| Example Compound 15 | 2.59 | 0.03 | 2.6 |
| Example Compound 16 | 2.62 | 0.05 | 4.8 |
| Comparative Example Compound X-1 | 2.66 | 0.11 | 5.4 |
| Comparative Example Compound X-2 | 2.69 | 0.19 | 7.0 |
| Comparative Example Compound X-3 | 2.62 | 0.21 | 9.4 |
| Comparative Example Compound X-4 | 2.36 | 0.14 | 9.1 |
| Comparative Example Compound X-5 | 2.58 | 0.31 | 28.5 |

Referring to the results of Table 1, all the Example Compounds show a small $\Delta E_{ST}$ value of at most 0.1 and a delayed fluorescence lifetime of at most 5.2 usec, and thus may be appropriately or suitably used as a thermally activated delayed fluorescence material, but Comparative Example Compounds show a relatively large $\Delta E_{ST}$ value and a delayed fluorescence lifetime of at least 5.4 usec, and thus are not considered to be suitable for a thermally activated delayed fluorescence material.

The organic electroluminescence devices of Examples and Comparative Examples were manufactured by the following method.

ITO having a thickness of about 1,500 Å was patterned on a glass substrate, washed with ultrapure water, and UV/ozone-treated for about 10 minutes. Thereafter, HAT-CN was deposited to a thickness of 100 Å, α-NPD was deposited to a thickness of 800 Å, and mCP was deposited to a thickness of 50 Å to form a hole transport region.

Next, when forming an emission layer, a nitrogen-containing compound of an Example or a Comparative Example Compound and DPEPO were co-deposited in a ratio of 18:82 to form a 200 Å-thick layer.

A 300 Å-thick layer was formed on the emission layer with TPBi and a 5 Å-thick layer was formed with LiF to form an electron transport region. Next, a second electrode having a thickness of about 1000 Å was formed with aluminum (Al).

In the Examples, the hole transport region, the emission layer, the electron transport region, and the second electrode were formed using a vacuum deposition apparatus.

Evaluation of Organic Electroluminescence Device Characteristics

For the evaluation of the characteristics of an organic electroluminescence device according to the Examples and Comparative Examples, the maximum emission wavelength (nm), the maximum external quantum yield (%), and the external quantum efficiency (%) at a luminance of 1000 cd/m² were measured.

TABLE 2

| | Dopant | Maximum emission wavelength (nm) | Maximum external quantum yield % |
|---|---|---|---|
| Example 1 | Example Compound 1 | 489 | 26 |
| Example 2 | Example Compound 3 | 515 | 27 |
| Example 3 | Example Compound 4 | 510 | 29 |
| Example 4 | Example Compound 5 | 515 | 28 |
| Example 5 | Example Compound 8 | 495 | 26 |
| Example 6 | Example Compound 9 | 497 | 28 |
| Example 7 | Example Compound 13 | 516 | 28 |
| Example 8 | Example Compound 14 | 497 | 25 |
| Example 9 | Example Compound 15 | 523 | 30 |
| Example 10 | Example Compound 16 | 509 | 31 |
| Comparative Example 1 | Comparative Example Compound X-1 | 474 | 17 |
| Comparative Example 2 | Comparative Example Compound X-2 | 497 | 22 |
| Comparative Example 3 | Comparative Example Compound X-3 | 471 | 2.6 |
| Comparative Example 4 | Comparative Example Compound X-4 | 510 | 16 |
| Comparative Example 5 | Comparative Example Compound X-5 | 453 | 1.6 |

Referring to the results of Table 2, when the nitrogen-containing compound according to an example was included in the emission layer, it is confirmed that the luminous efficiency of the device was improved by increasing the external quantum yield compared to Comparative Examples.

Without being bound by the correctness of any theory or explanation, it is believed that because the Example Compounds each include a plurality of electron donating substituents of different kinds, the rate constant of reverse-intersystem crossing (RISC) via higher-order triplet was increased, and thereby the luminous efficiency of the device was improved.

In comparison, Comparative Examples 1 and 4 include compounds that are substituted with a plurality of electron donating carbazole groups having the same structure, but good device luminous efficiency was not shown (e.g., compared to the Examples, which include different kinds of electron donating groups). It is confirmed that Comparative Example 2 includes a compound that is substituted with a (e.g. a single) triazatruxene group, but does not exhibit high-efficiency luminescence like the nitrogen-containing compound of the present disclosure. Comparative Example 3 includes a compound that is substituted with a plurality of electron-accepting substituents (e.g., triazine), and the delayed fluorescence lifetime was largely increased, thereby resulting in deterioration of device luminous efficiency. In Comparative Example 5, although a plurality of electron donating groups were bonded, the delayed fluorescence lifetime was largely increased, thereby resulting in deterioration of device luminous efficiency.

The organic electroluminescent device of an example may improve a service life of the device by using the nitrogen-containing compound represented by Formula 1 as an emission layer material.

The organic electroluminescence device according to an embodiment of the present disclosure may achieve high efficiency and a long service life.

The nitrogen-containing compound according to an embodiment of the present disclosure may improve efficiency and service life of the organic electroluminescence device.

Although the present disclosure has been described with reference to various embodiments, it will be understood that the present disclosure should not be limited to these embodiments, but that various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and equivalents thereof.

What is claimed is:

1. An organic electroluminescence device comprising:

a first electrode;

a hole transport region on the first electrode;

an emission layer on the hole transport region;

an electron transport region on the emission layer; and a second electrode on the electron transport region, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide thereof, wherein the emission layer contains a nitrogen-containing compound represented by Formula 1, the nitrogen-containing compound being a delayed fluorescence emitter:

Formula 1

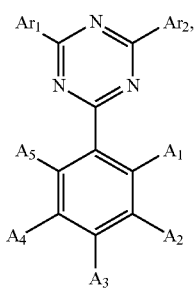

wherein, in Formula 1,

Ar₁ and Ar₂ are each independently a substituted or unsubstituted aryl group having 6 to 30 ring-forming carbon atoms, or a substituted or unsubstituted heteroaryl group having 2 to 30 ring-forming carbon atoms, and $A_1$ to $A_5$ are each independently a hydrogen atom, a deuterium atom, a halogen atom, a substituted or unsubstituted amine group, an unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or represented by Formula 2 or Formula 3:

at least one of $A_1$ to $A_5$ is represented by Formula 2, and at least another one of $A_1$ to $A_5$ is represented by Formula 3:

Formula 2

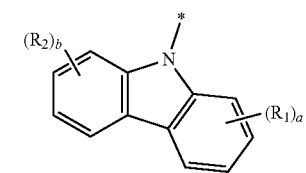

Formula 3

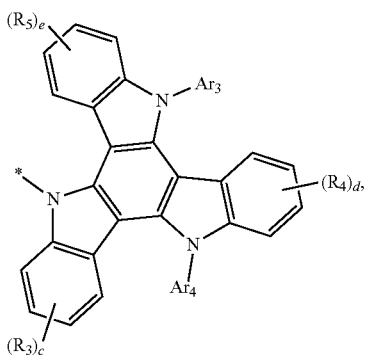

and wherein, in Formula 2 and Formula 3,

Ar₃ and Ar₄ are each independently a substituted or unsubstituted aryl group having 6 to 30 ring-forming carbon atoms, or a substituted or unsubstituted heteroaryl group having 2 to 30 ring-forming carbon atoms, $R_1$ to $R_5$ are each independently a hydrogen atom, a deuterium atom, a halogen atom, a substituted or unsubstituted amine group, a substituted or unsubstituted thiol group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent ring to form a ring, and a to e are each independently an integer of 0 to 4.

2. The organic electroluminescence device of claim 1, wherein the emission layer is to emit delayed fluorescence.

3. The organic electroluminescence device of claim 1, wherein the emission layer is a delayed fluorescence emission layer comprising a first compound and a second compound, and the first compound comprises the nitrogen-containing compound.

4. The organic electroluminescence device of claim 1, wherein Formula 1 is represented by any one among Formula 4-1 to Formula 4-4:

Formula 4-1

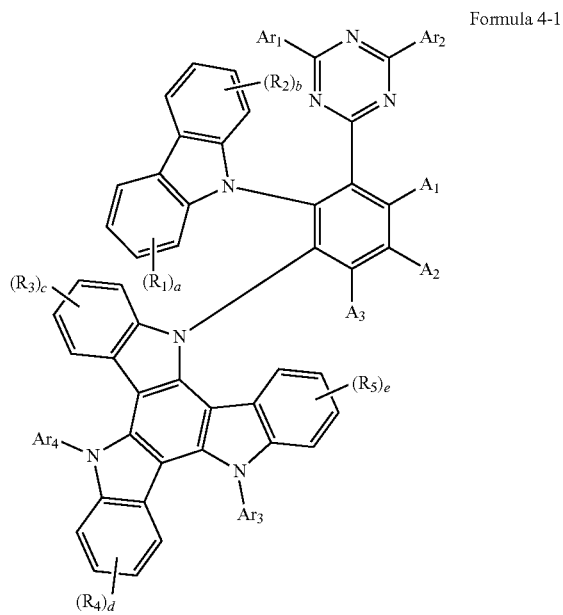

Formula 4-2

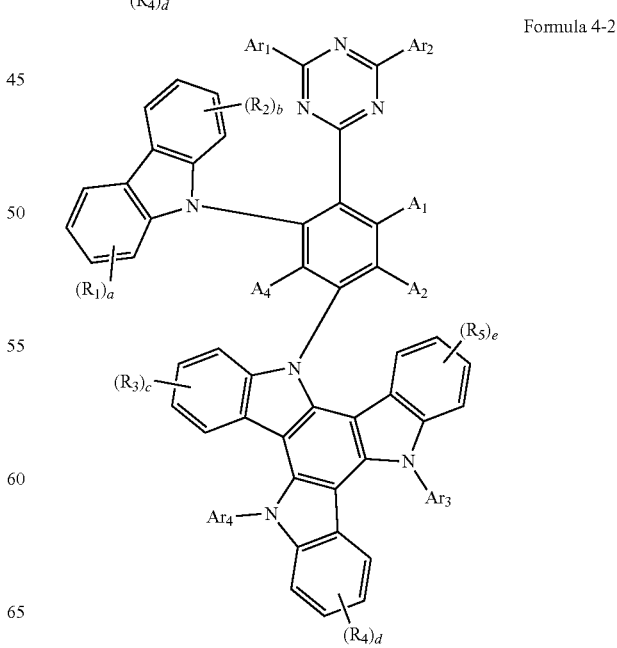

Formula 4-3

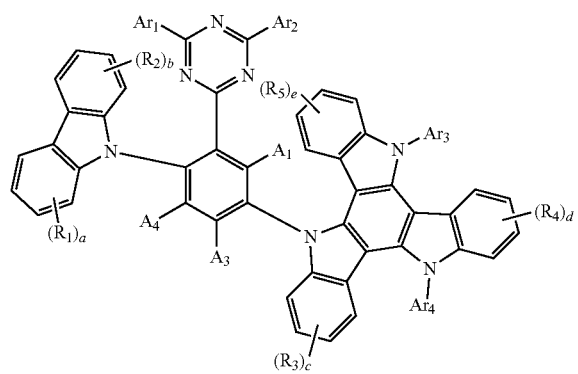

Formula 4-4

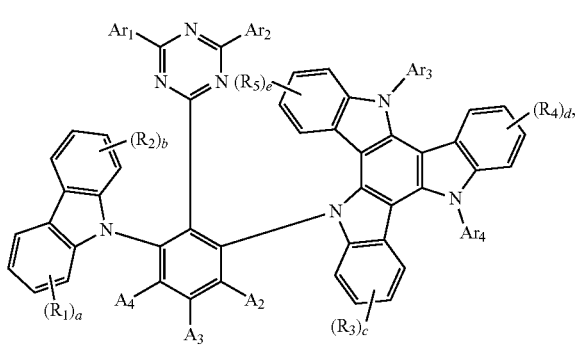

wherein in Formula 4-1 to Formula 4-4,

Ar₁ to Ara, A₁ to A₅, R₁ to R₅, and a to e are each independently the same as defined in Formula 1 to Formula 3.

5. The organic electroluminescence device of claim 1, wherein Formula 1 is represented by any one among Formula 5-1 to Formula 5-4:

Formula 5-1

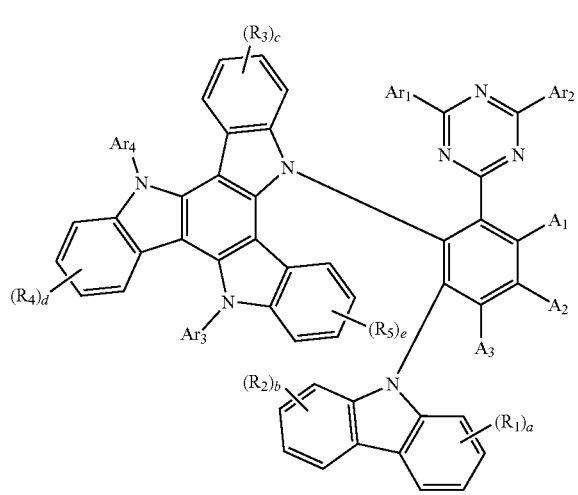

Formula 5-2

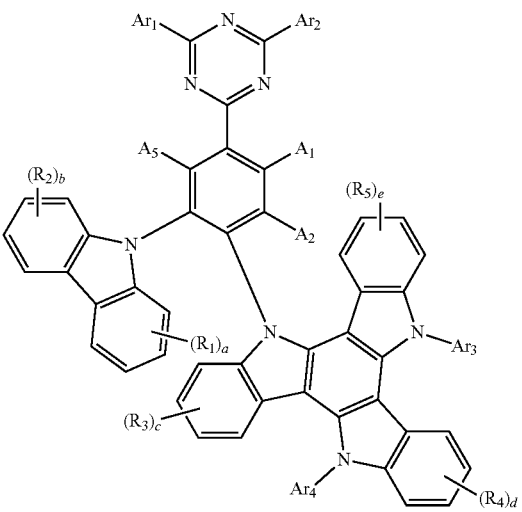

Formula 5-3

Formula 5-4

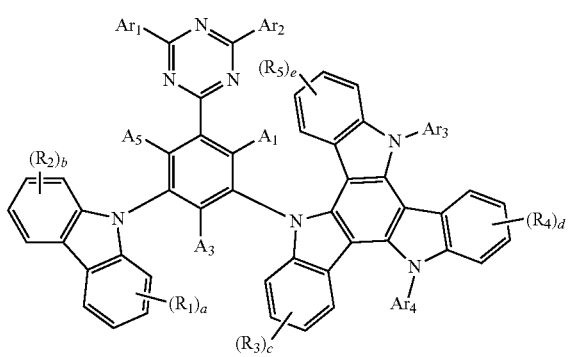

wherein in Formula 5-1 to Formula 5-4,

Ar₁ to Ar₄, A₁ to A₃, A₅, R₁ to R₅, and a to e are each independently the same as defined in Formula 1 to Formula 3.

6. The organic electroluminescence device of claim 1, wherein Formula 1 is represented by Formula 6-1 or Formula 6-2:

Formula 6-1

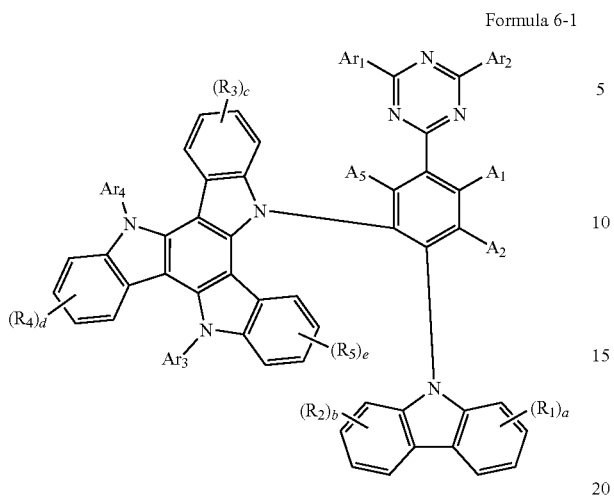

Formula 7-2

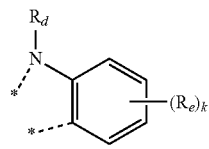

Formula 7-3

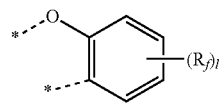

Formula 7-4

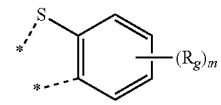

Formula 6-2

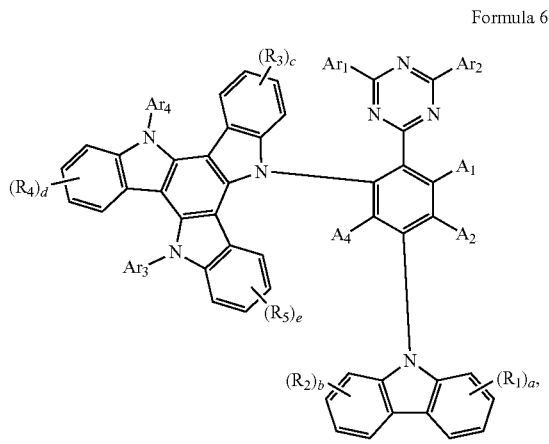

in Formula 6-1 and Formula 6-2, $Ar_1$ to $Ar_4$, $A_1$, $A_2$, $A_4$, $A_5$, $R_1$ to $R_5$, and a to e are each independently the same as defined in Formula 1 to Formula 3.

7. The organic electroluminescence device of claim 1, wherein, when a is an integer of 2 or more, a pair of adjacent $R_1$'s forms a condensed ring structure according to any one among Formula 7-1 to Formula 7-4:

Formula 7-1

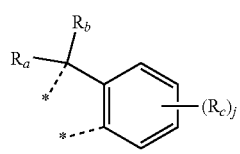

wherein in Formula 7-1 to Formula 7-4, $R_a$ to $R_g$ are each independently a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and j to m are each independently an integer of 0 to 4.

8. The organic electroluminescence device of claim 1, $Ar_1$ to $Ar_4$ are each independently represented by Formula 8:

Formula 8

$$Y_1=Y_2 \atop *-Y_5-Y_4 \diagdown Y_3$$

wherein in Formula 8, $Y_1$ to $Y_5$ are each independently CX or N, and

X is a hydrogen atom, a deuterium atom, an alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or is bonded to an adjacent ring to form a ring.

9. The organic electroluminescence device of claim 1, wherein the compound represented by Formula 1 is any one among the compounds represented by Compound Group 1:

Compound Group 1
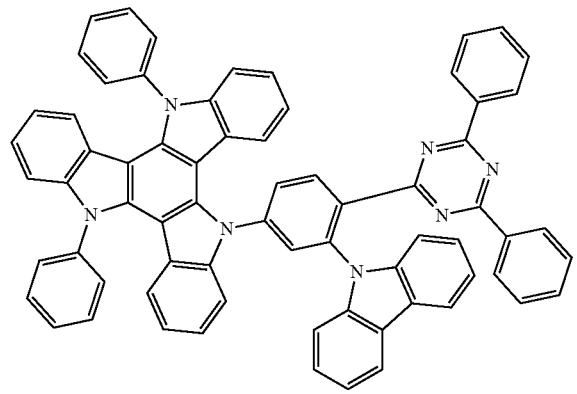
1
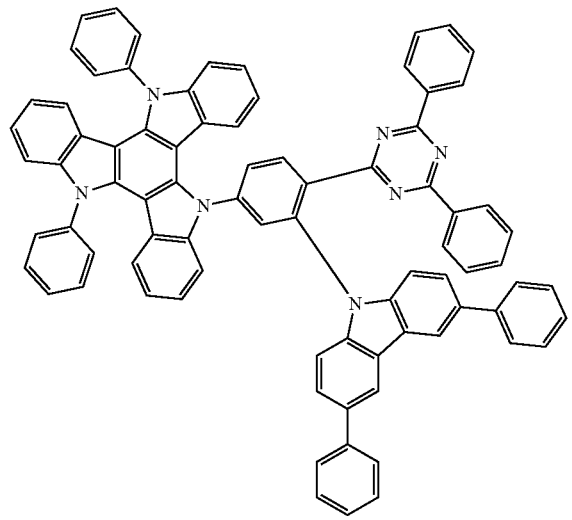
2
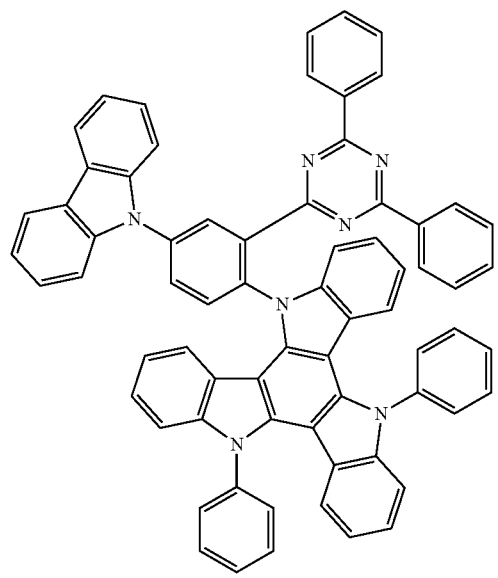
3
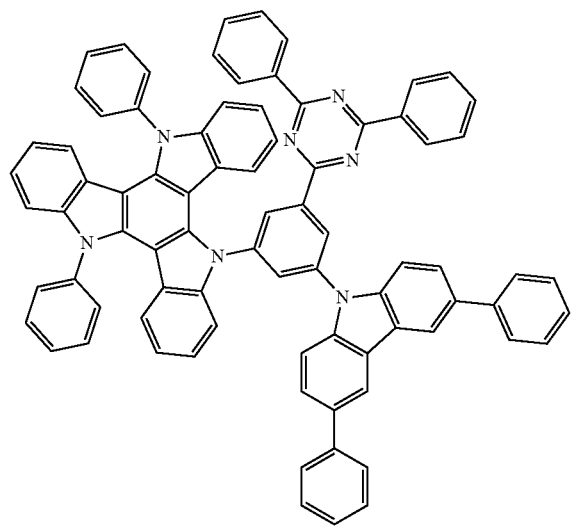
4

5
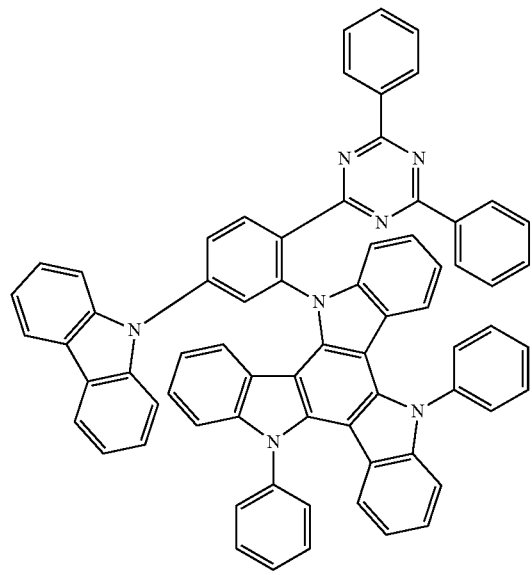
6
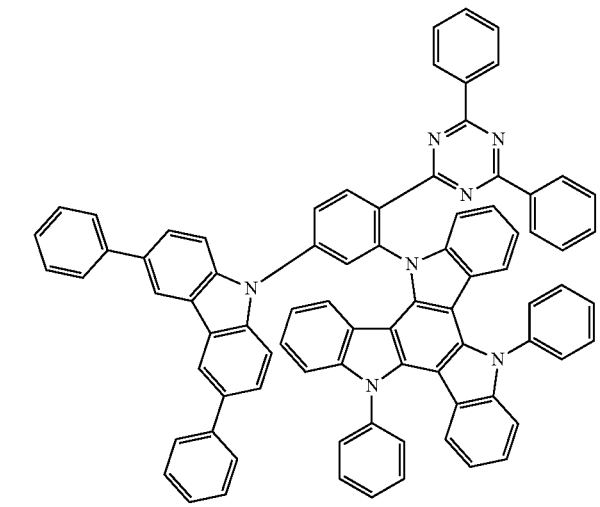
7
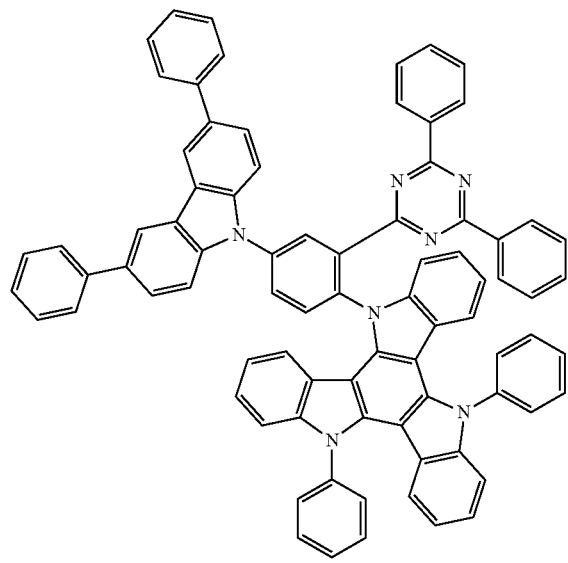
8
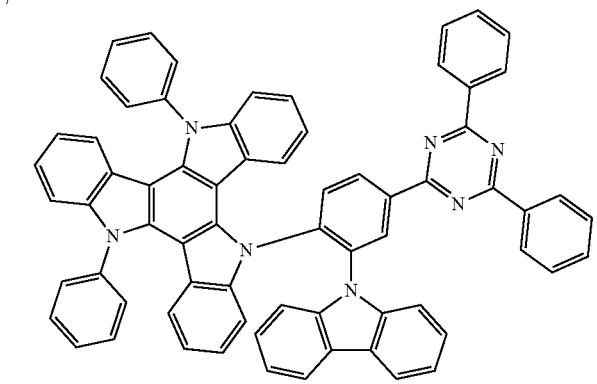
9
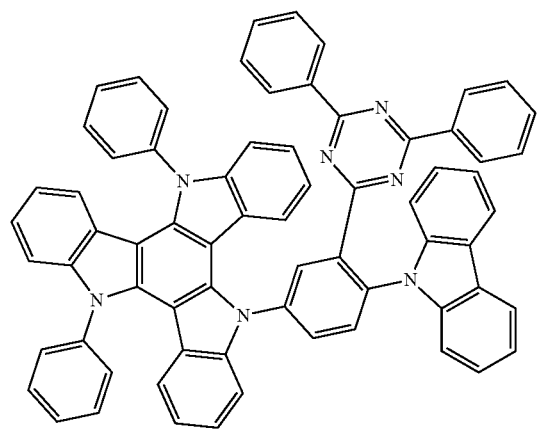
10
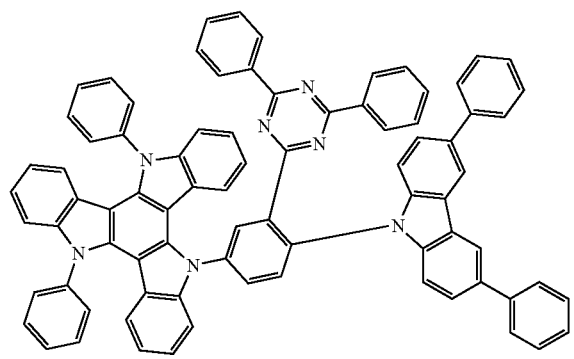

-continued
11
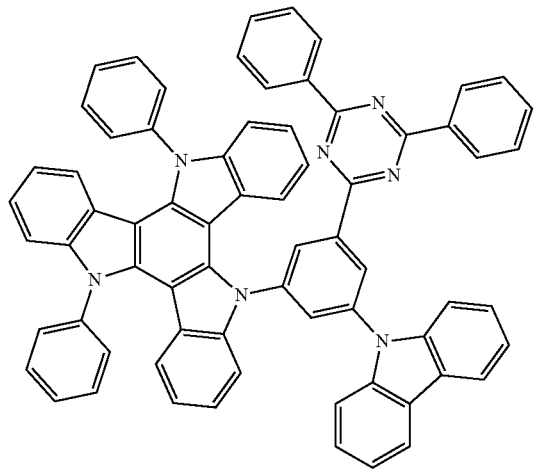
12
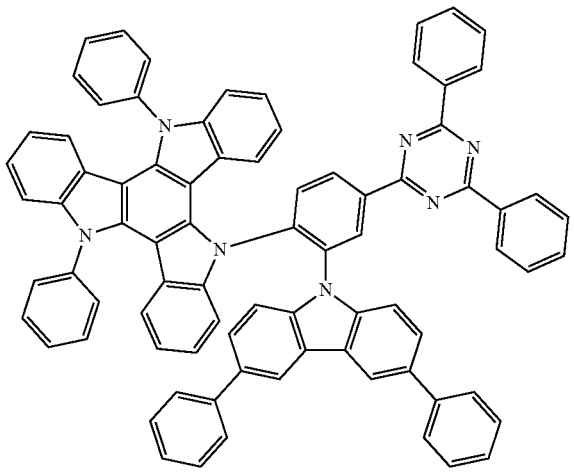
13
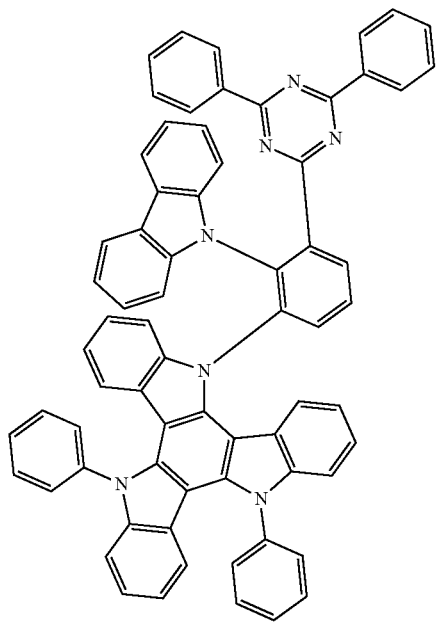
14
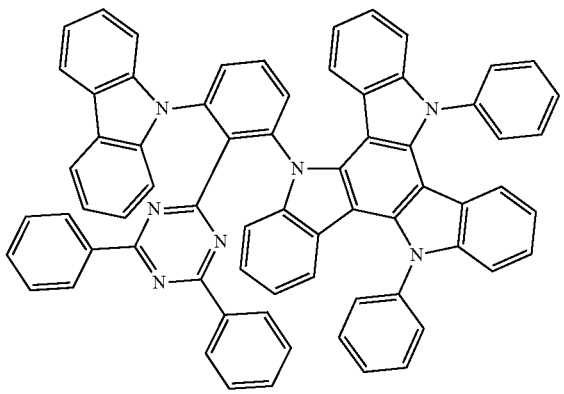
15
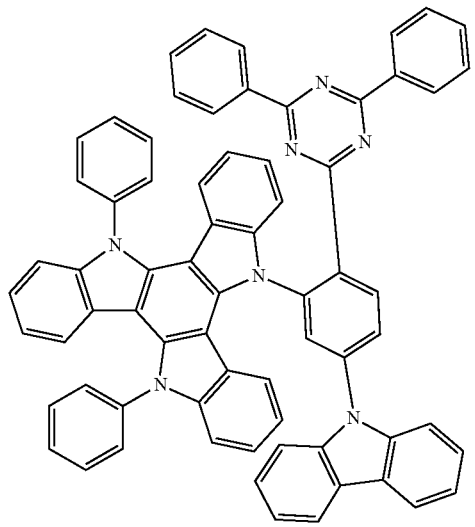
16
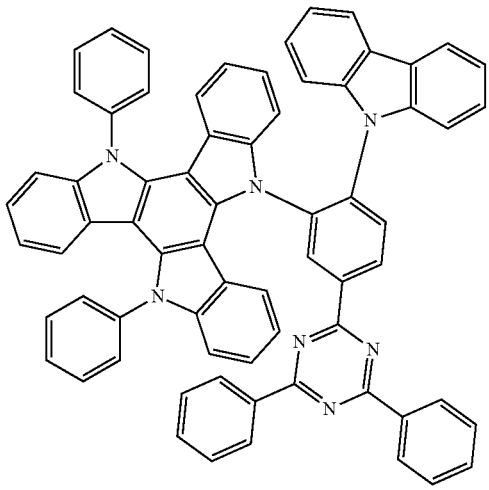

-continued
17
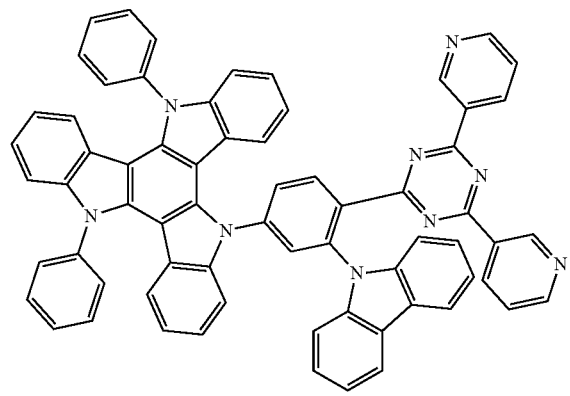
18
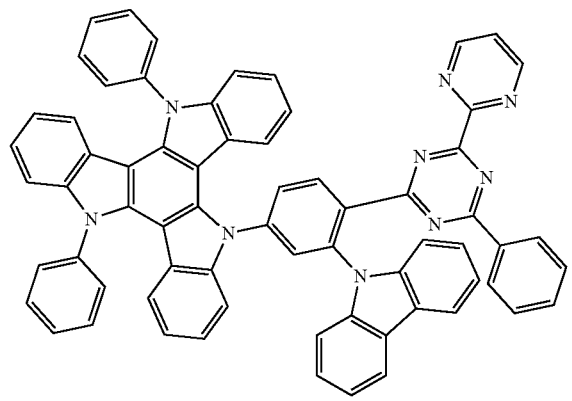
19
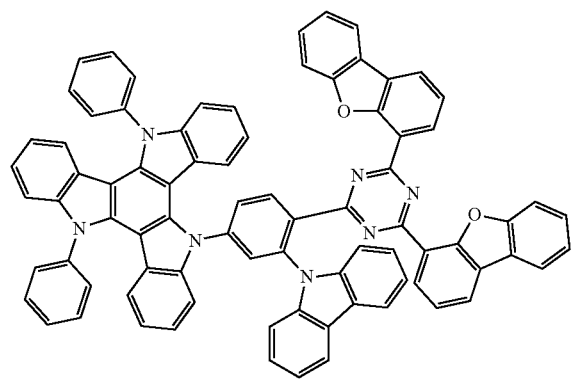
20
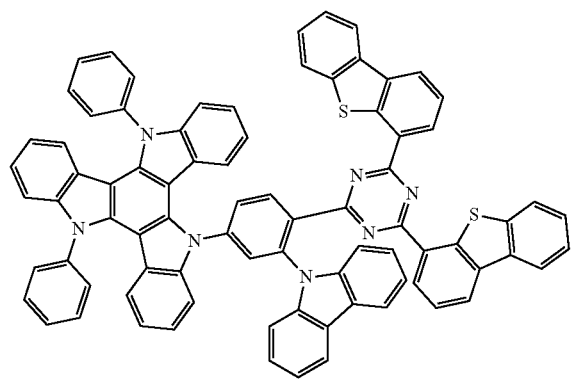
21
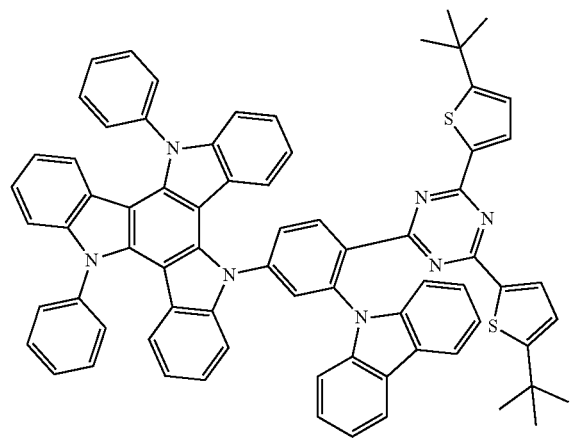
22
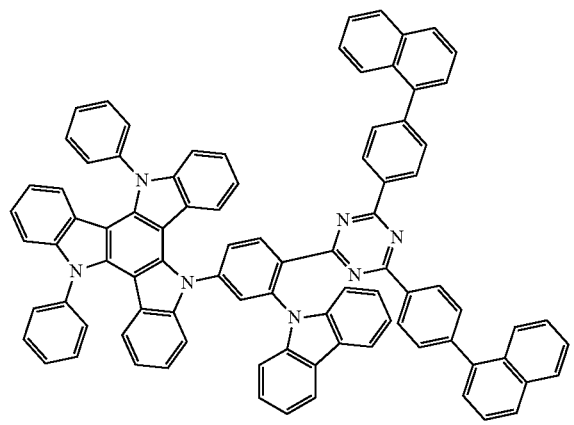

-continued
23
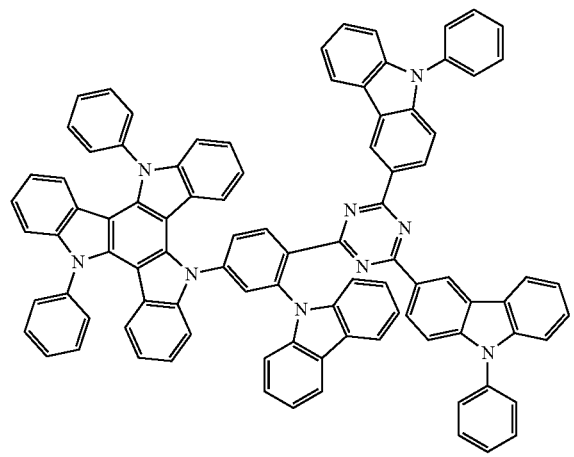
24
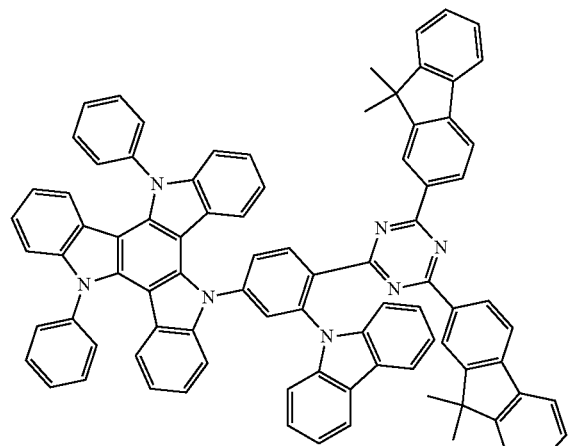
25
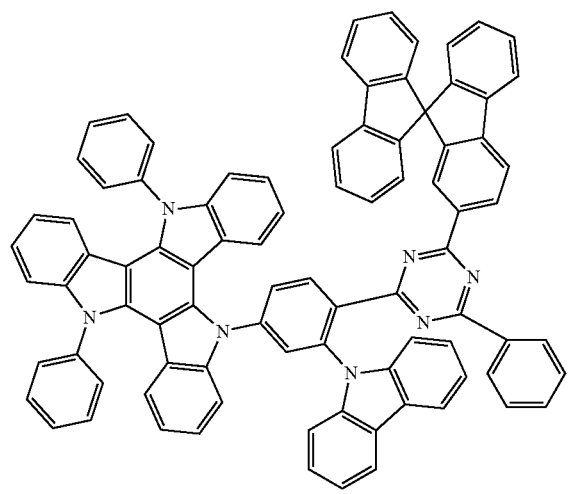
26
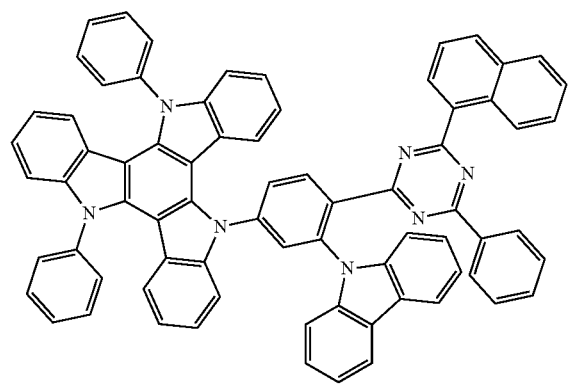
27
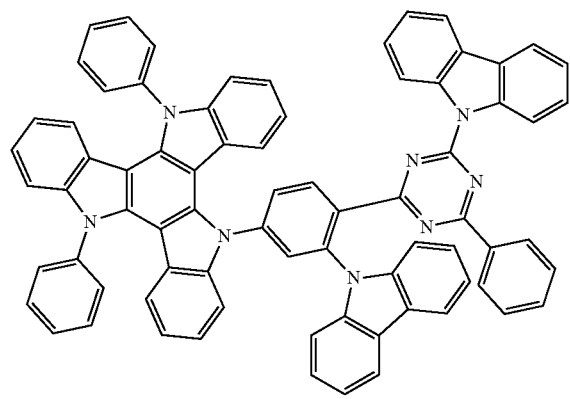
28
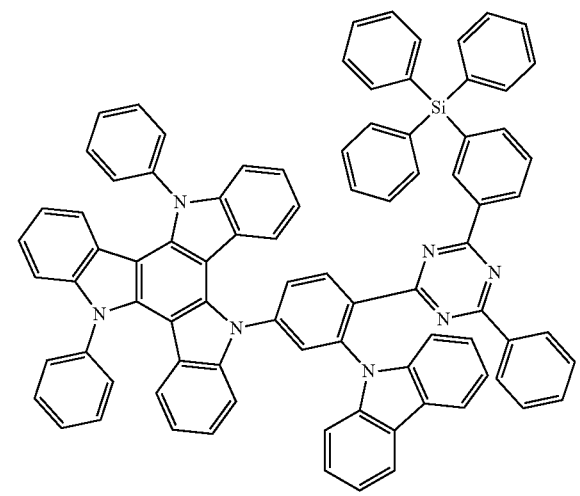

-continued
29
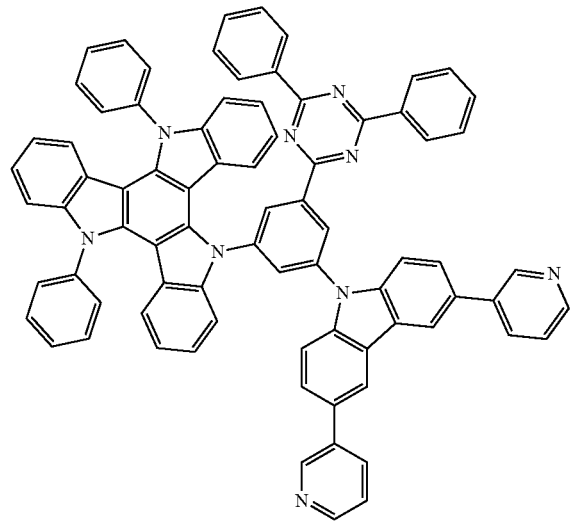
30
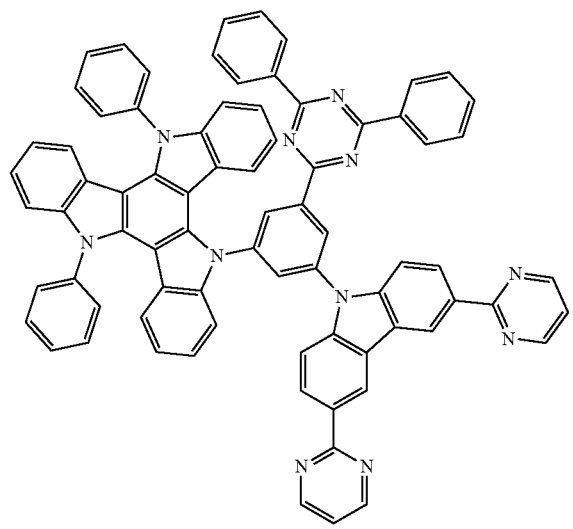
31
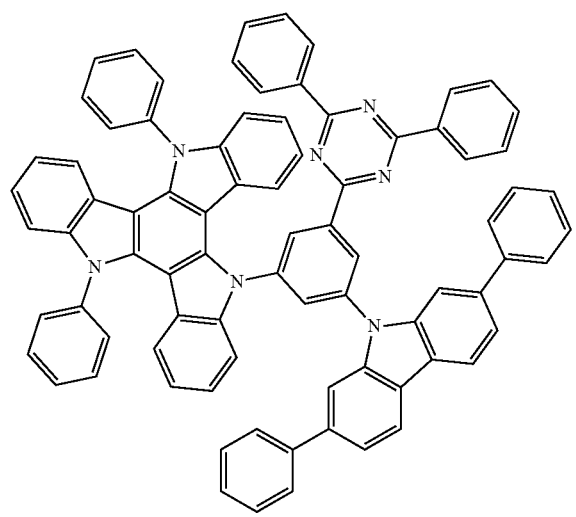
32
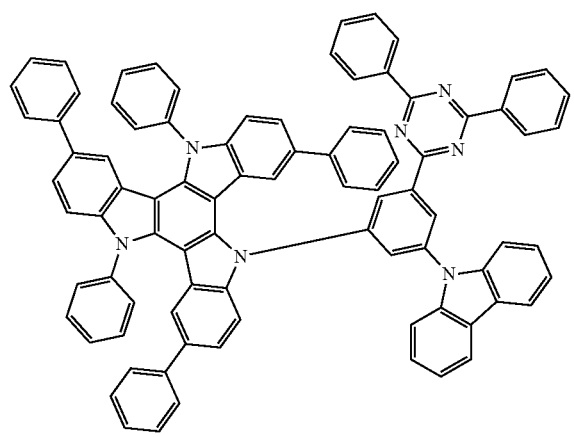
33
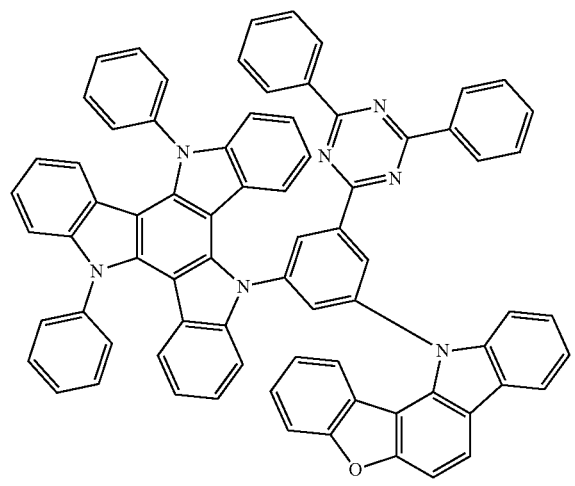
34
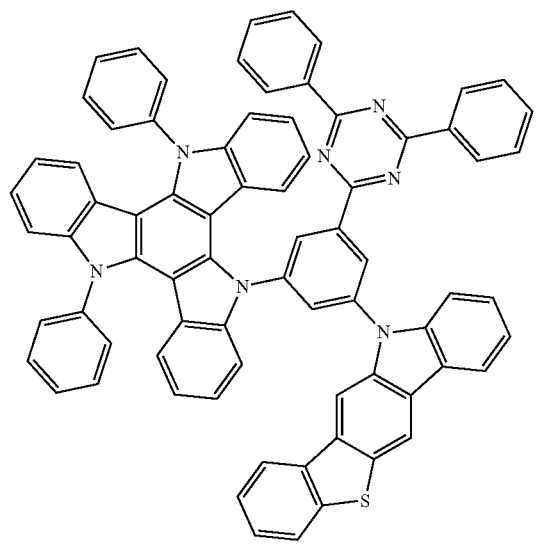

35
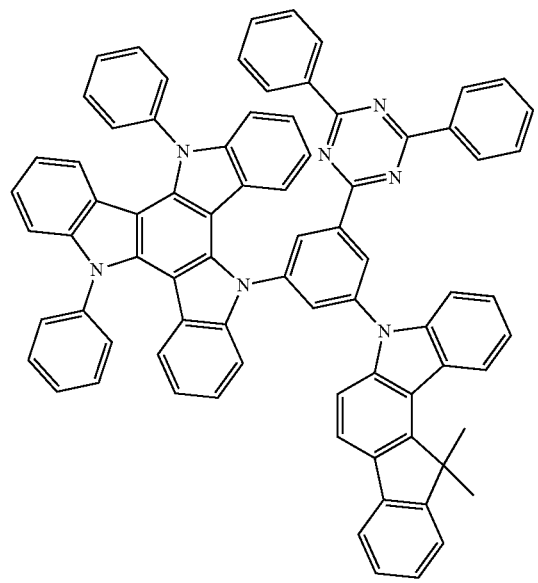
36
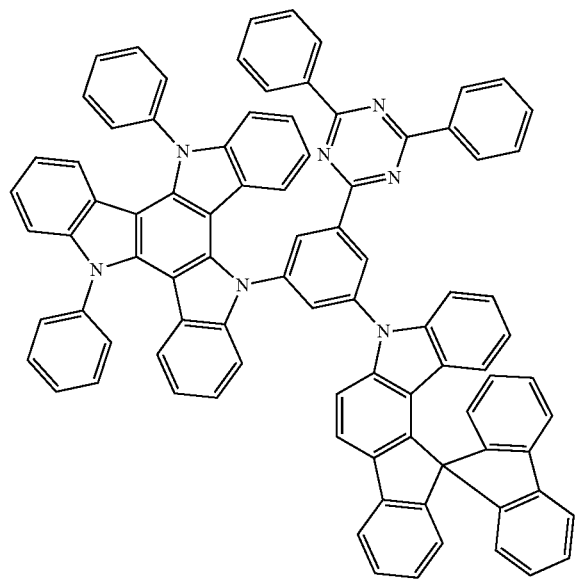
37
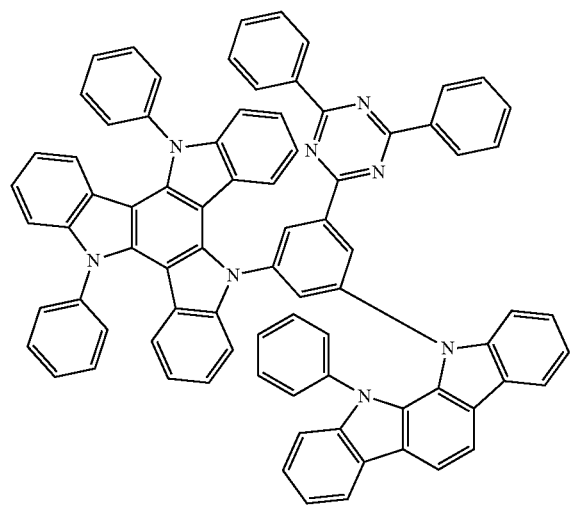
38
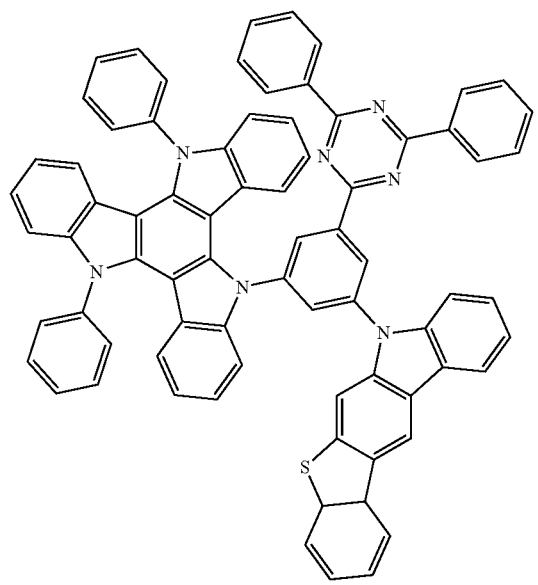

39
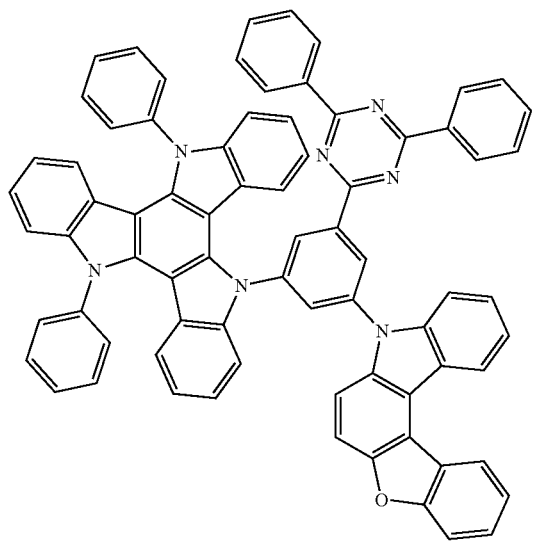
40
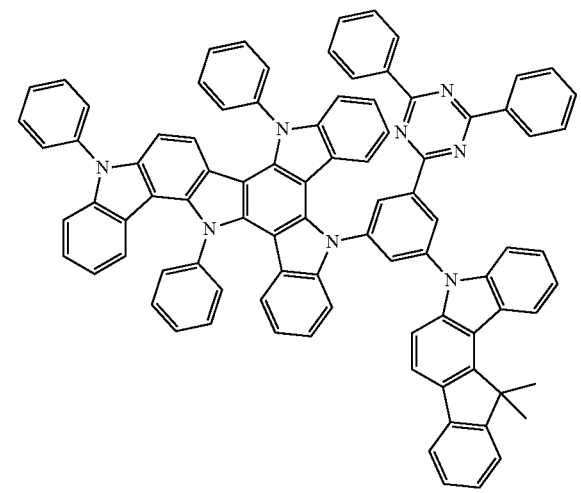
41
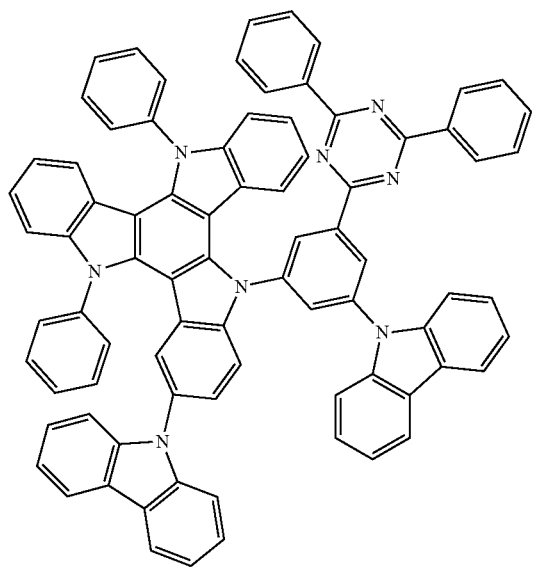
42
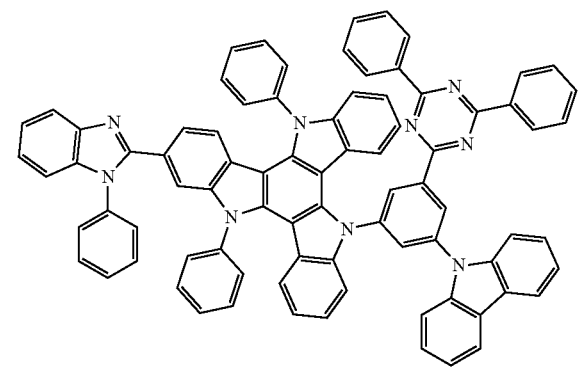

-continued
43
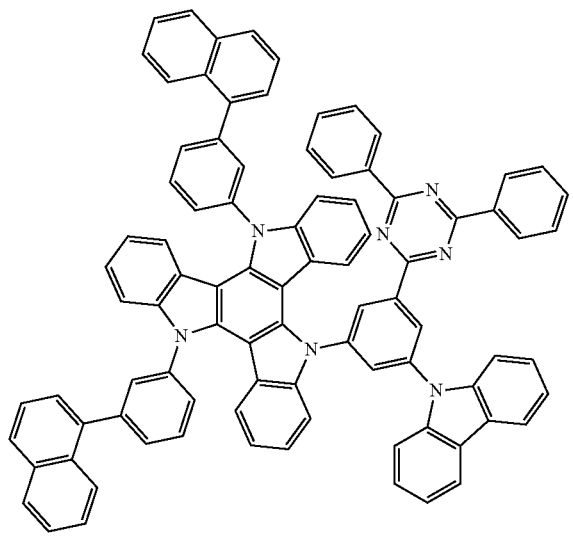
44
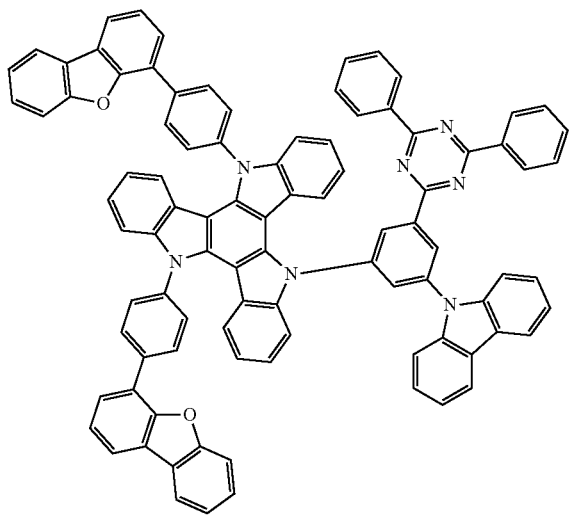
45
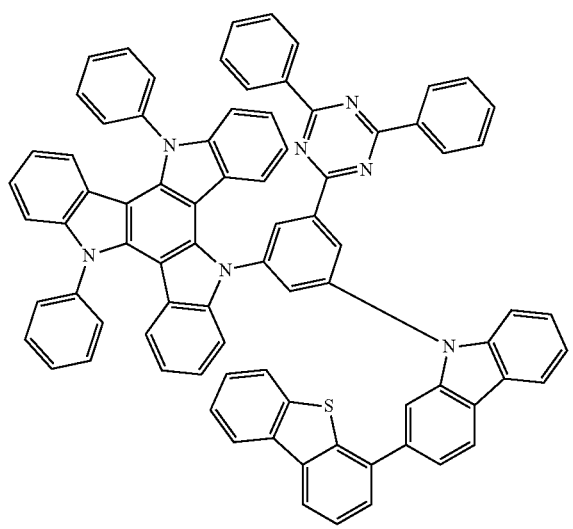
46
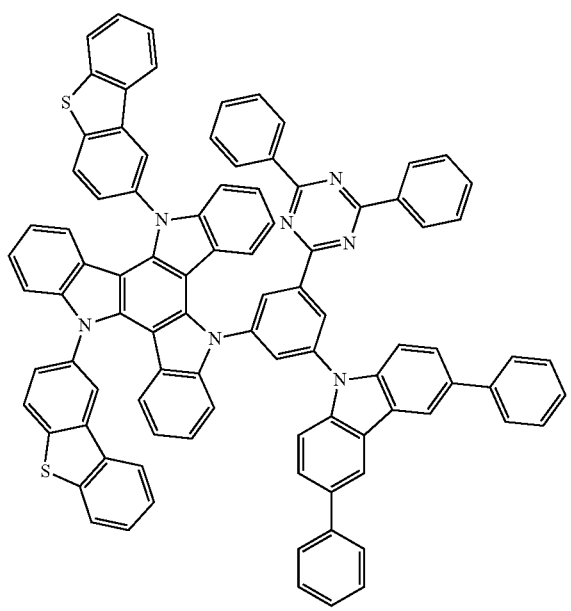
47
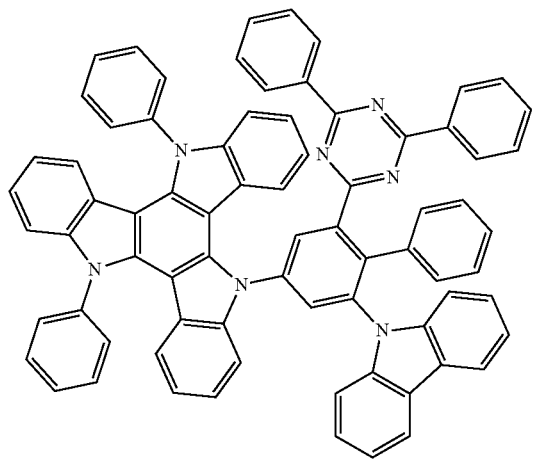
48
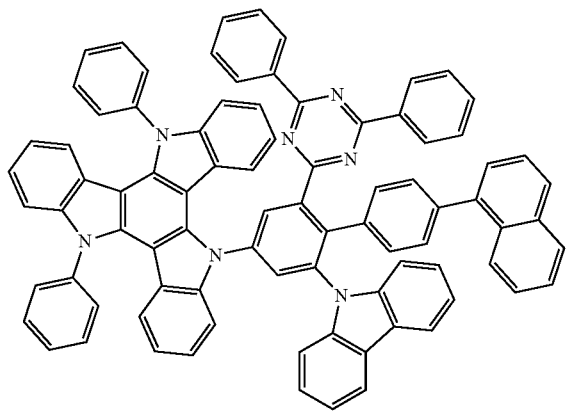

-continued
49
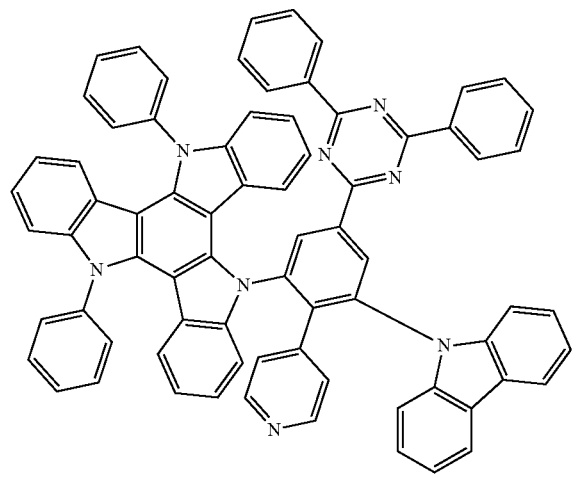
50
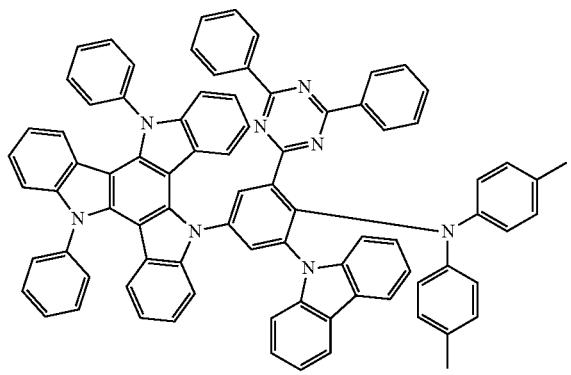
51
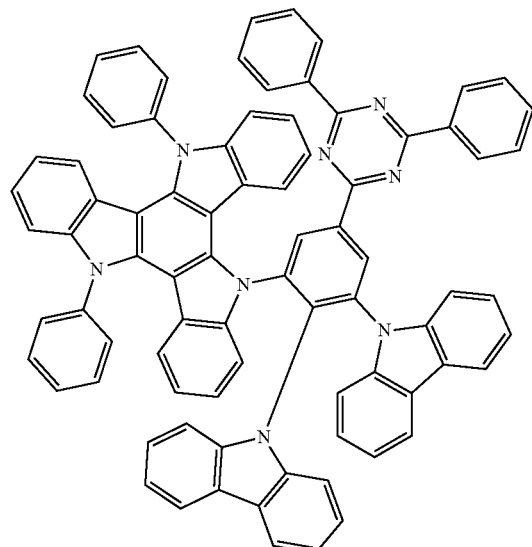
52
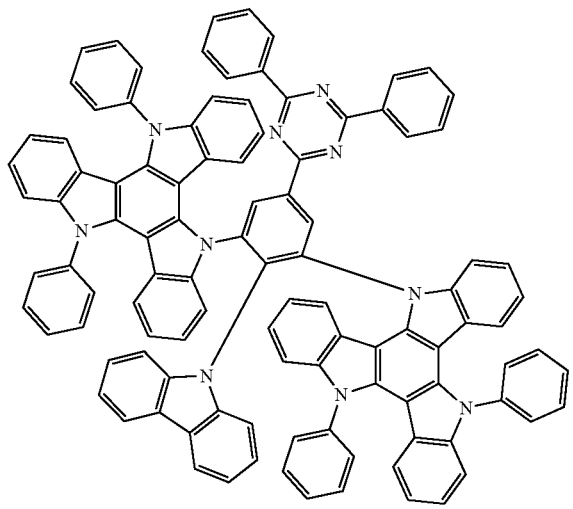
53
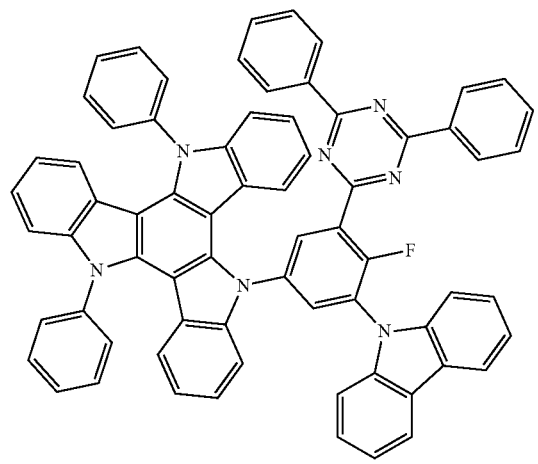
54
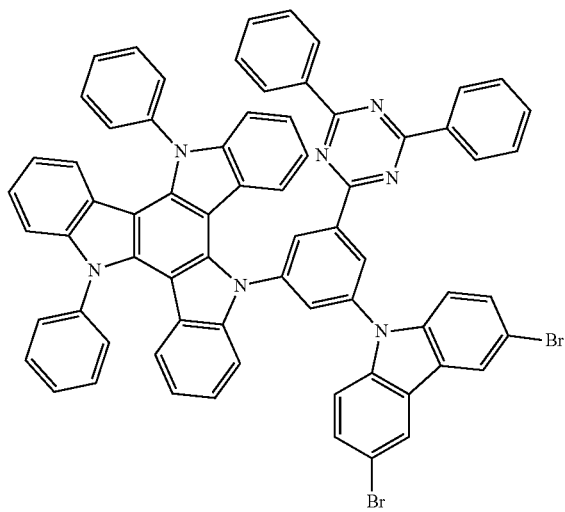

101
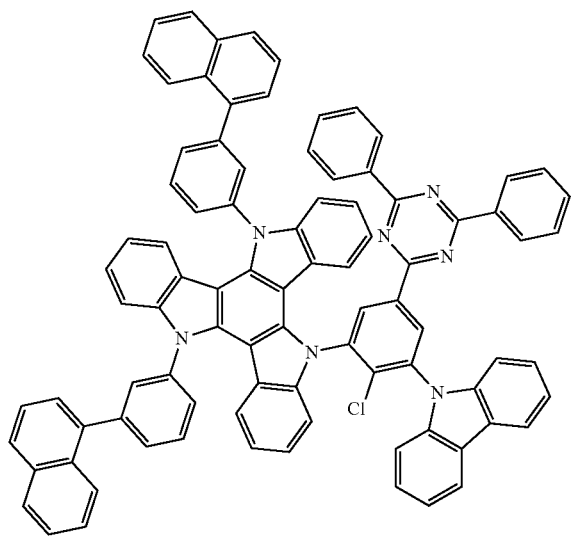
102
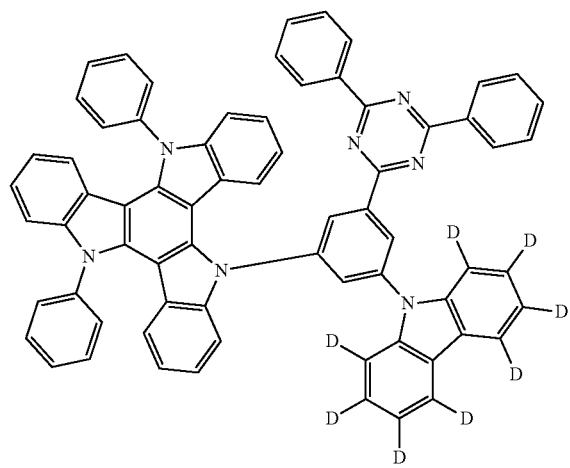
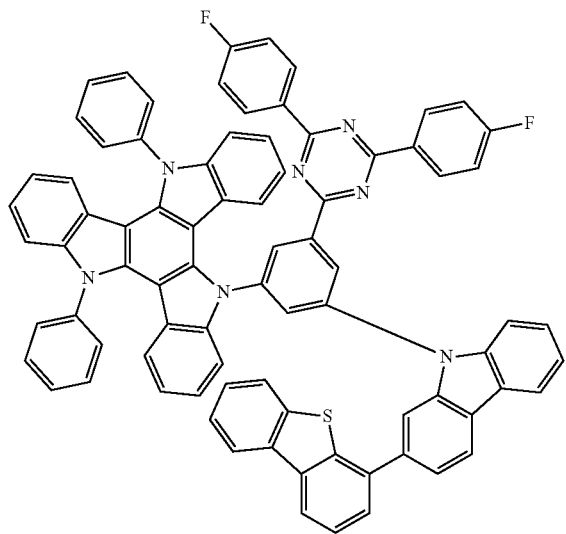
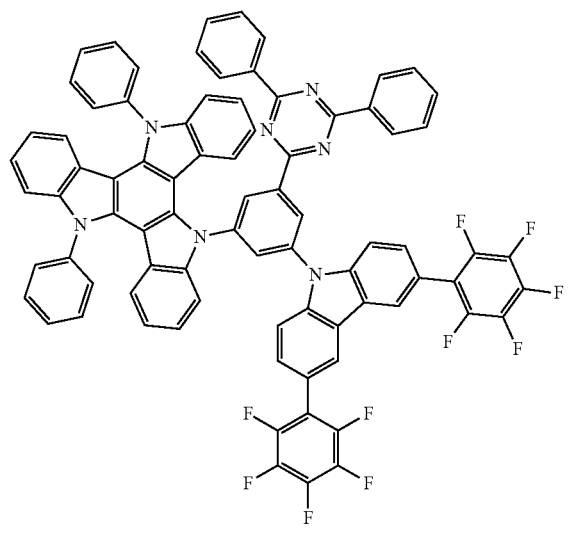

59
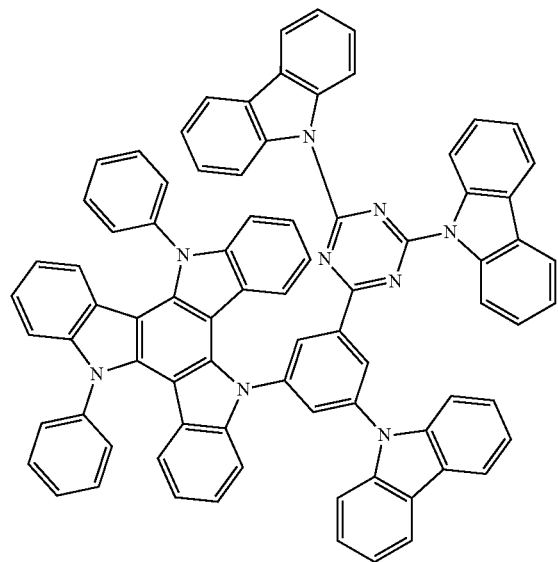
60
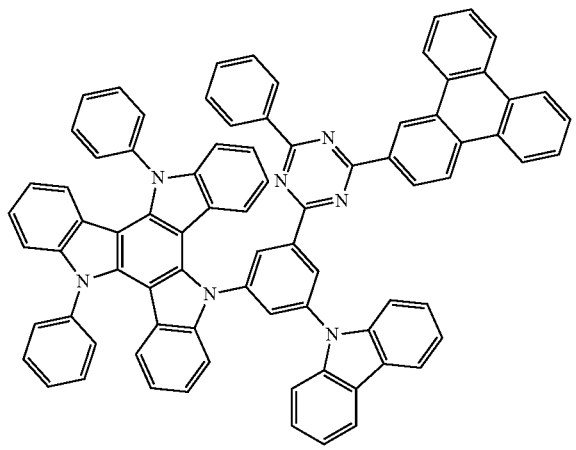
61
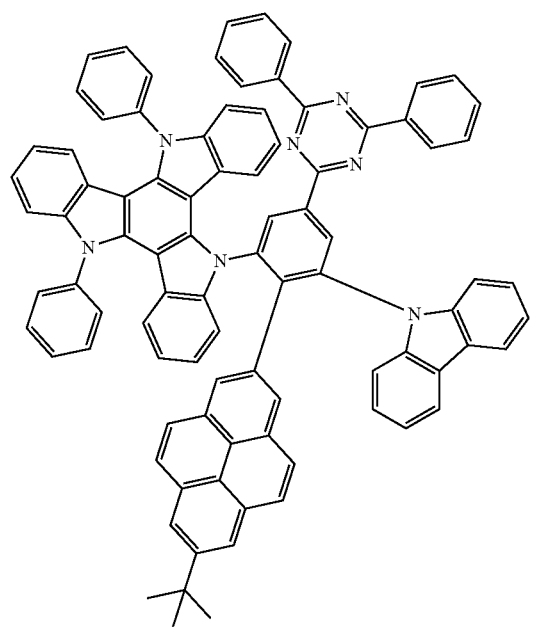

-continued
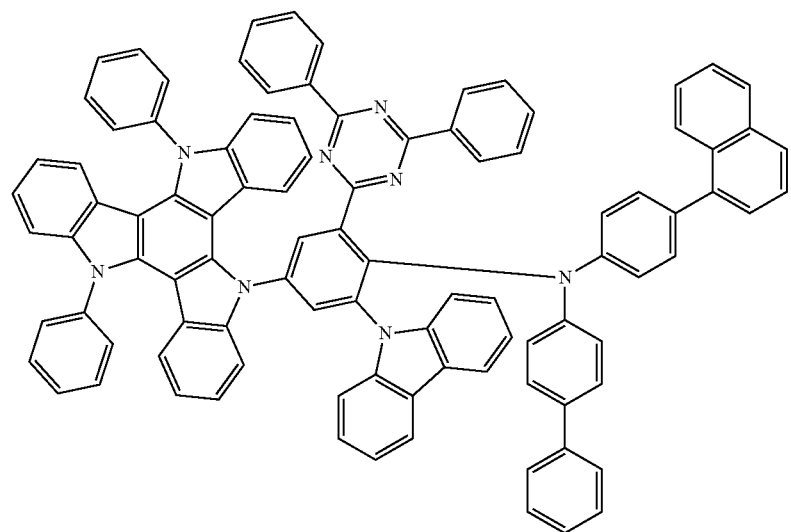
62
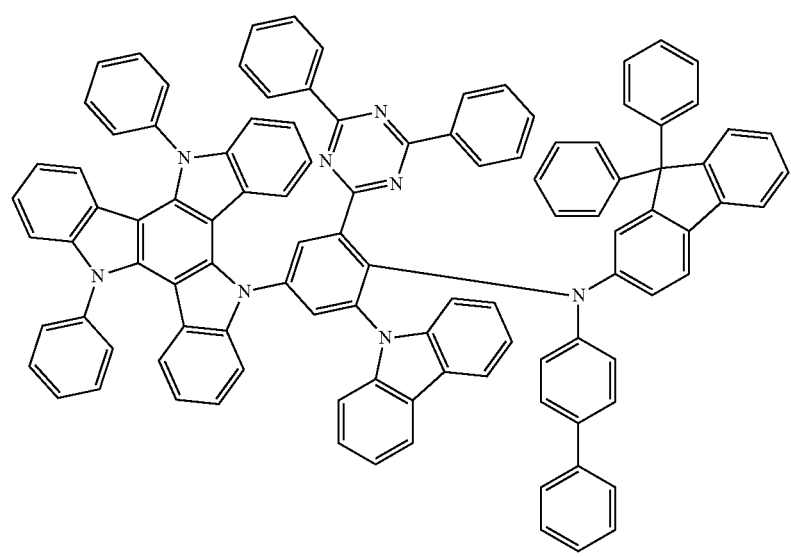
63

64

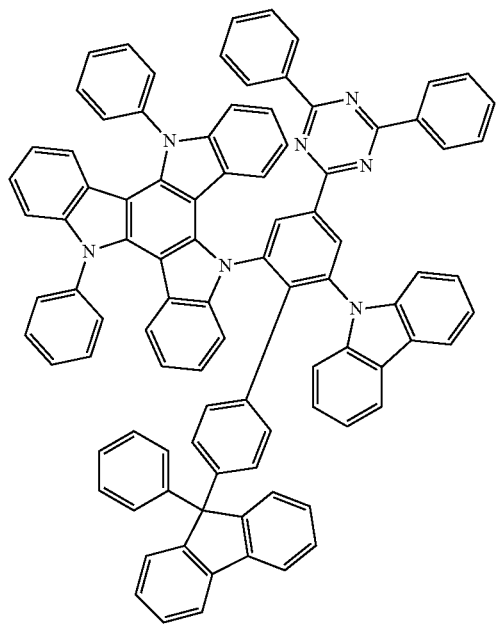

65

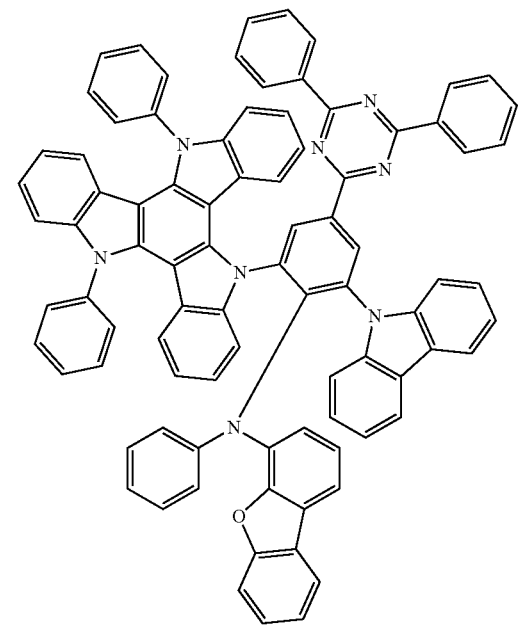

66

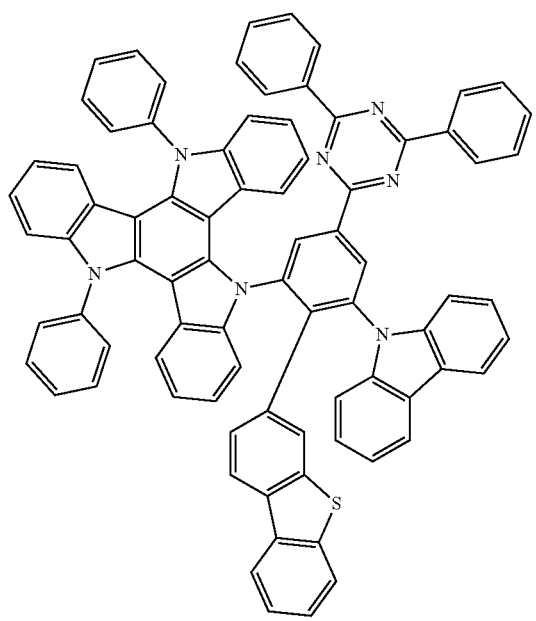

67

10. A nitrogen-containing compound represented by Formula 1:

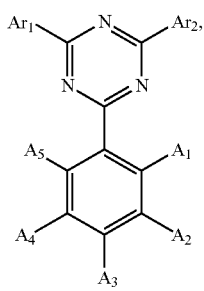

Formula 1 wherein in Formula 1,
$Ar_1$ and $Ar_2$ are each independently a substituted or unsubstituted aryl group having 6 to 30 carbon atoms for forming a ring, or a substituted or unsubstituted heteroaryl group having 2 to 30 carbon atoms for forming a ring, and
$A_1$ to $A_5$ are each independently a hydrogen atom, a deuterium atom, a halogen atom, a substituted or unsubstituted amine group, an unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or are represented by Formula 2 or Formula 3:
at least one of $A_1$ to $A_5$ is represented by Formula 2, and at least another one of $A_1$ to $A_5$ is represented by Formula 3:

Formula 2

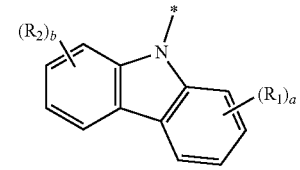

Formula 3

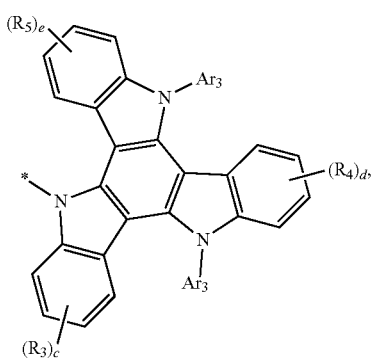

wherein in Formula 2 and Formula 3,
Ar₃ and Ar₄ are each independently a substituted or unsubstituted aryl group having 6 to 30 ring-forming carbon atoms, or a substituted or unsubstituted heteroaryl group having 2 to 30 ring-forming carbon atoms,
R₁ to R₅ are each independently a hydrogen atom, a deuterium atom, a halogen atom, a substituted or unsubstituted amine group, a substituted or unsubstituted thiol group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent ring to form a ring, and
a to e are each independently an integer of 0 to 4.

11. The nitrogen-containing compound of claim 10, wherein Formula 1 is represented by any one among Formula 4-1 to Formula 4-4:

Formula 4-1

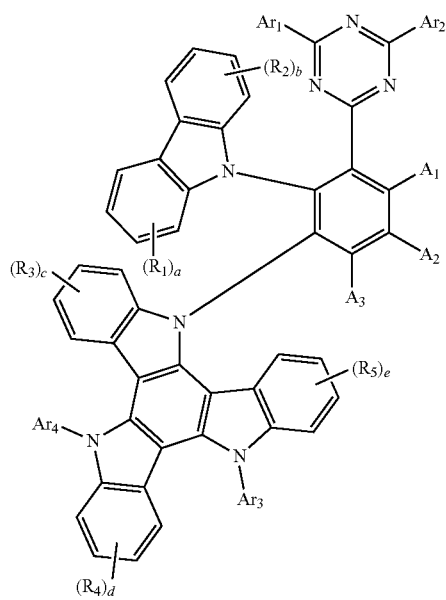

Formula 4-2

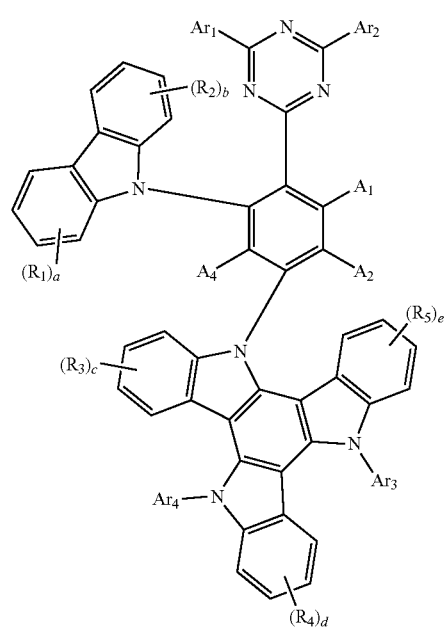

Formula 4-3

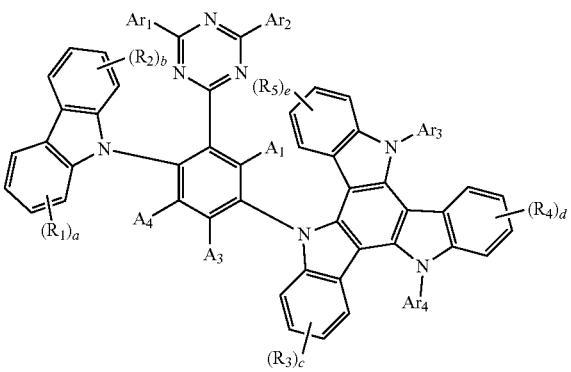

Formula 4-4

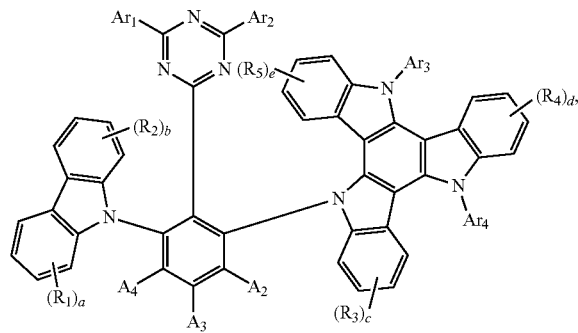

wherein in Formula 4-1 to Formula 4-4,

Ar$_1$ to Ar$_4$, A$_1$ to A$_4$, R$_1$ to R$_5$, and a to e are each independently the same as defined in Formula 1 to Formula 3.

12. The nitrogen-containing compound of claim 10, wherein Formula 1 is represented by any one among Formula 5-1 to Formula 5-4:

Formula 5-1

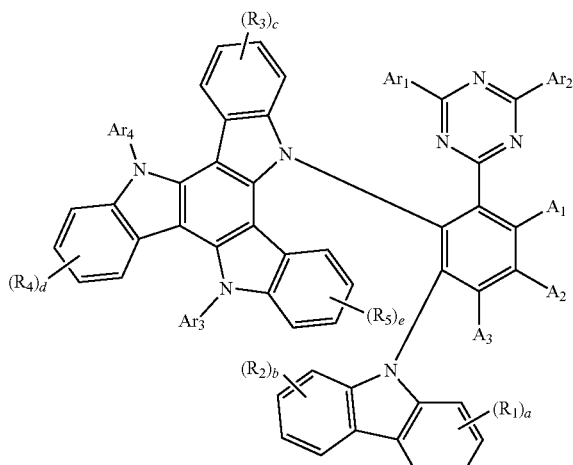

Formula 5-2

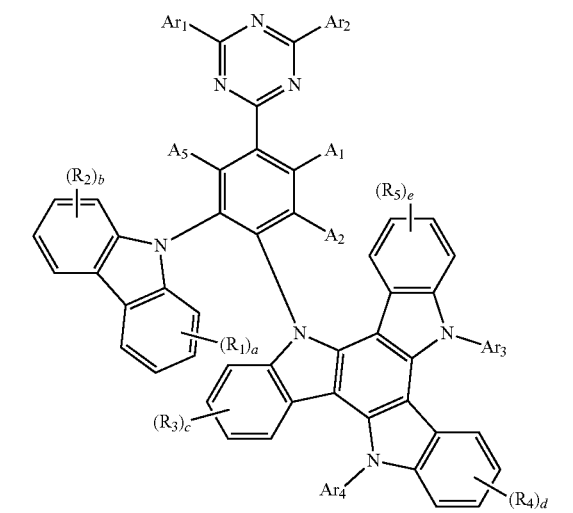

Formula 5-3

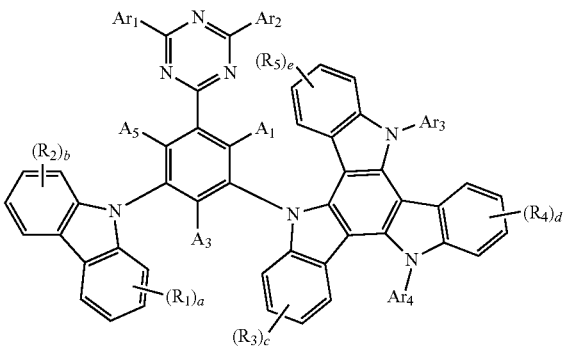

Formula 5-4

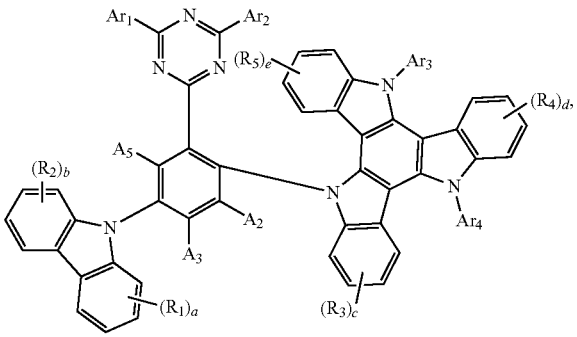

wherein in Formula 5-1 to Formula 5-4,

Ar$_1$ to Ar$_4$, A$_1$ to A$_3$, A$_5$, R$_1$ to R$_5$, and a to e are each independently the same as defined in Formula 1 to Formula 3.

13. The nitrogen-containing compound of claim 10, wherein Formula 1 is represented by Formula 6-1 or Formula 6-2:

Formula 6-1

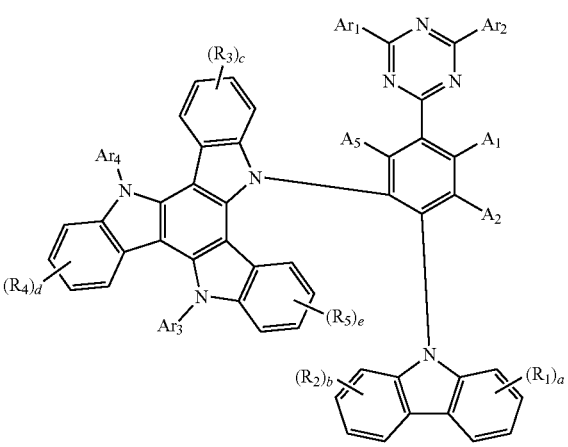

-continued

Formula 6-2

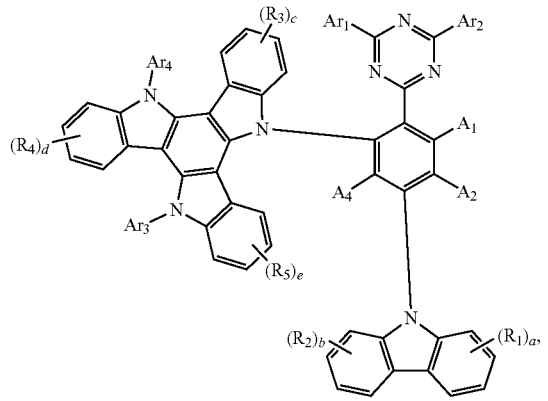

wherein in Formula 6-1 and Formula 6-2, $Ar_1$ to $Ar_4$, $A_1$, $A_2$, $A_4$, $A_5$, $R_1$ to $R_5$, and a to e are each independently the same as defined in Formula 1 to Formula 3.

14. The nitrogen-containing compound of claim 10, wherein, when a is an integer of 2 or more, a pair of adjacent $R_1$'s forms a condensed ring structure according to any one among Formula 7-1 to Formula 7-4:

Formula 7-1

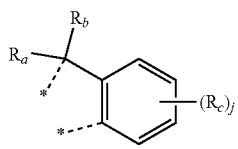

-continued

Formula 7-2

Formula 7-3

Formula 7-4

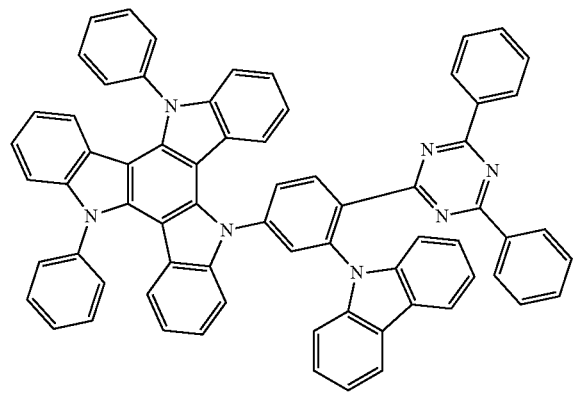

wherein in Formula 7-1 to Formula 7-4, $R_a$ to $R_g$ are each independently a hydrogen atom, a deuterium atom, a halogen atom, a nitro group, a cyano group, a hydroxy group, a substituted or unsubstituted amine group, a substituted or unsubstituted thiol group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and j to m are each independently an integer of 0 to 4.

15. The nitrogen-containing compound of claim 10, wherein the compound represented by Formula 1 is any one among the compounds represented by Compound Group 1:

Compound Group 1

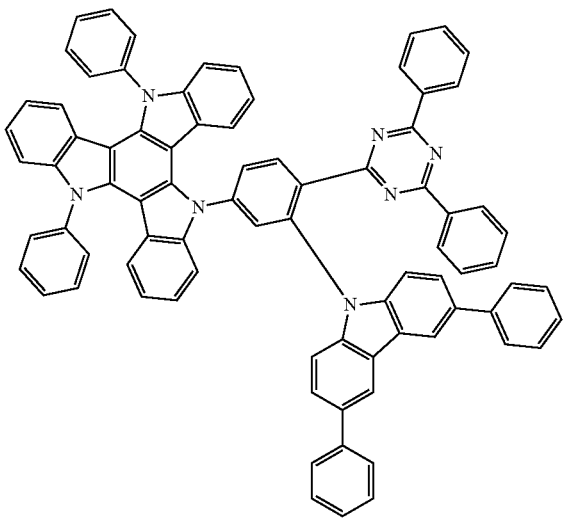

-continued
3
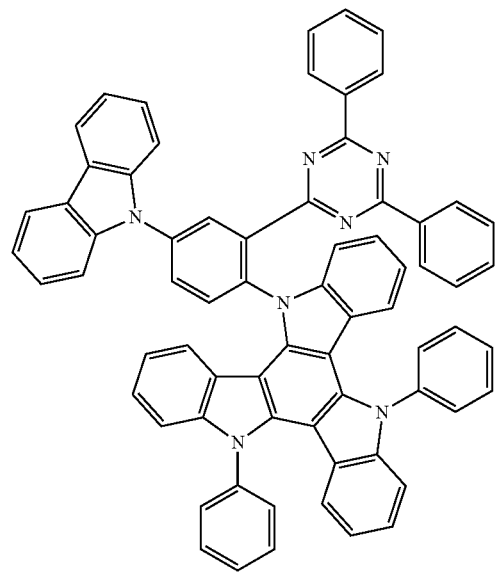
4
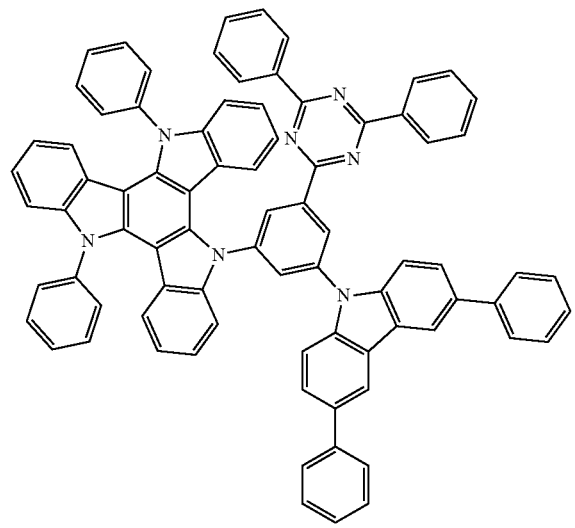
5
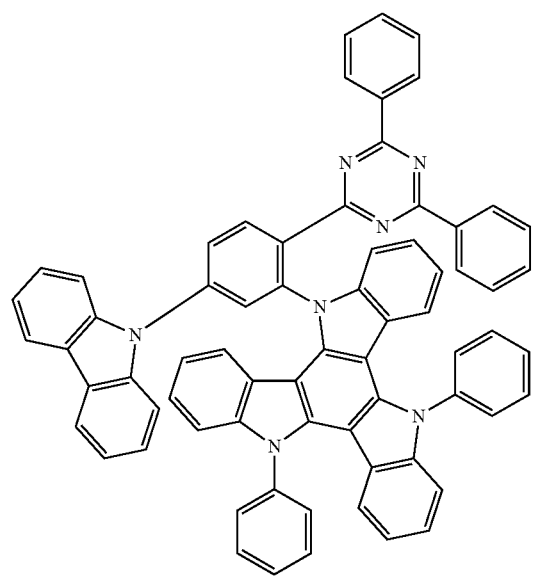
6
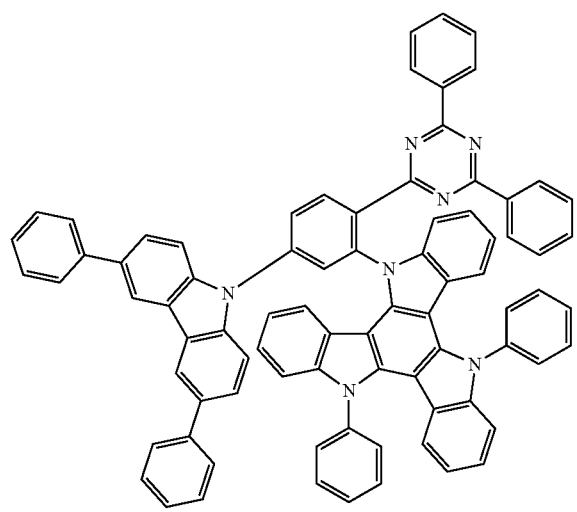

-continued
7
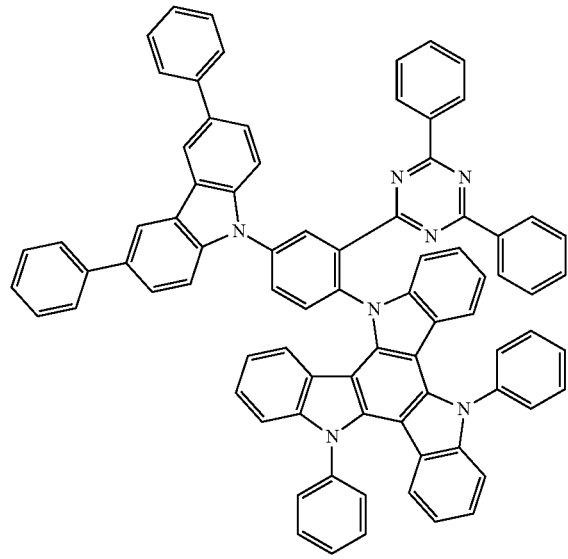
8
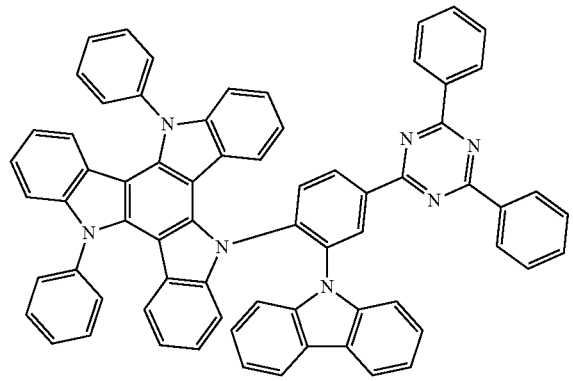
9
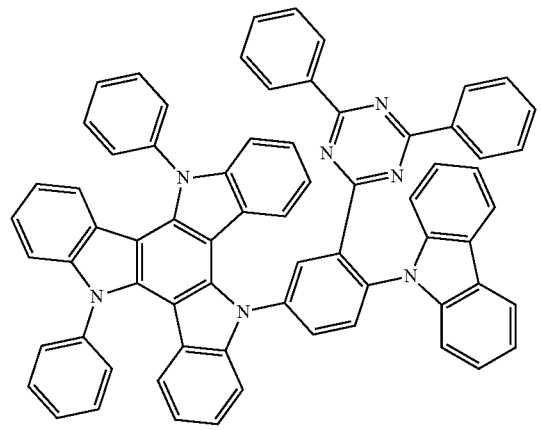
10
11
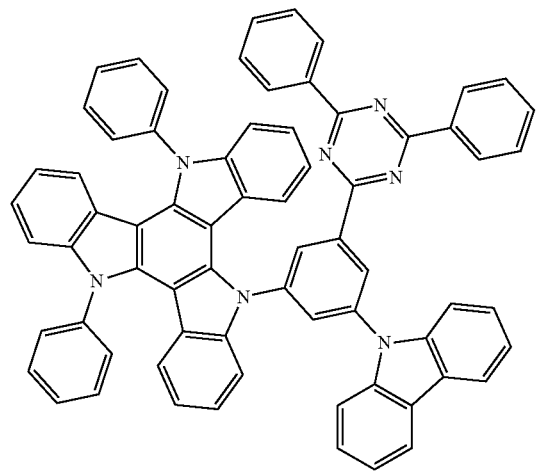
12
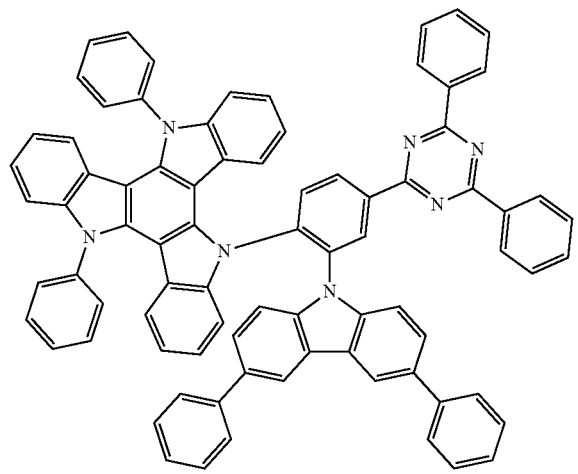

-continued
13
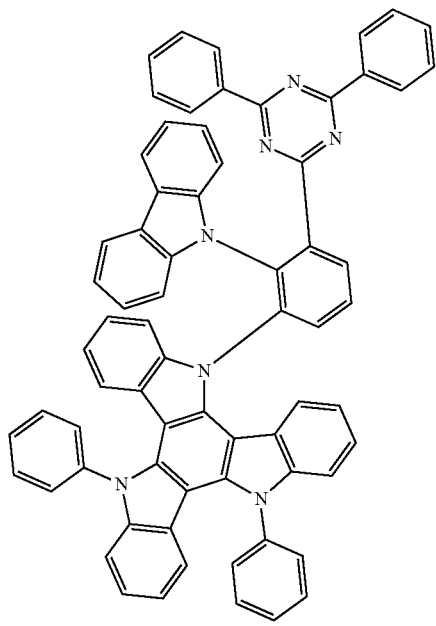
14
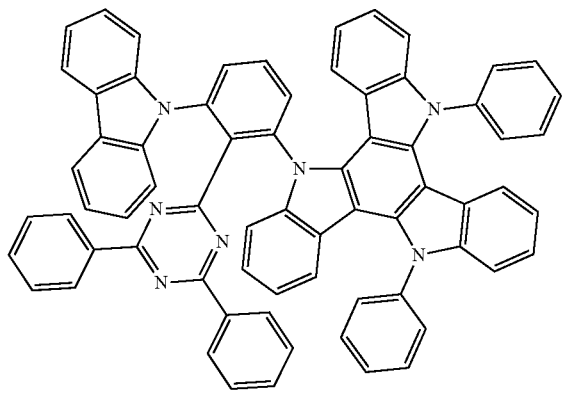
15
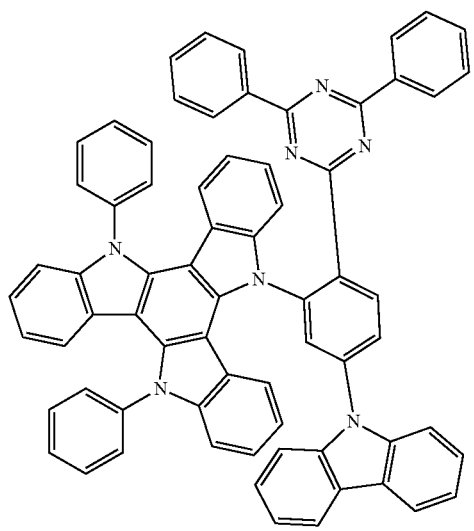
16
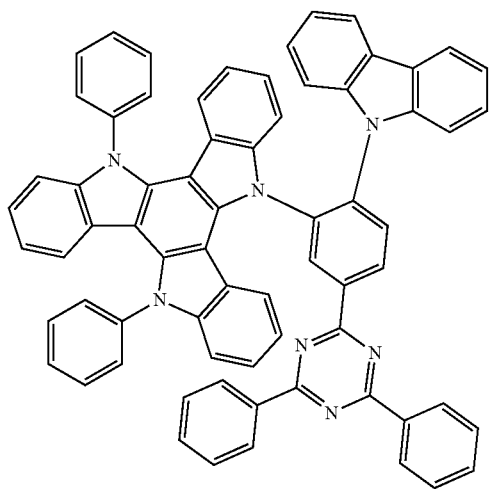
17
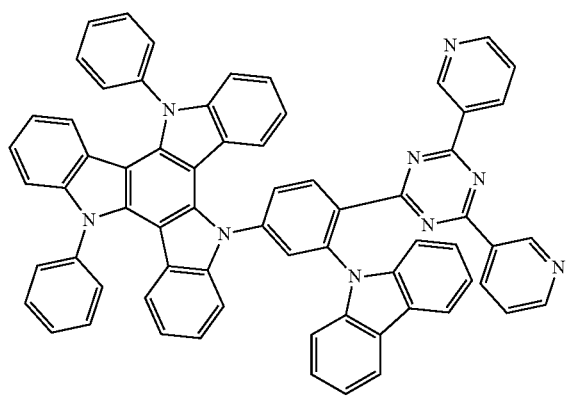
18
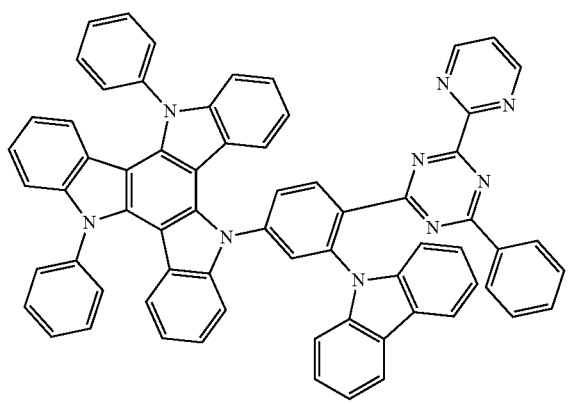

-continued
19
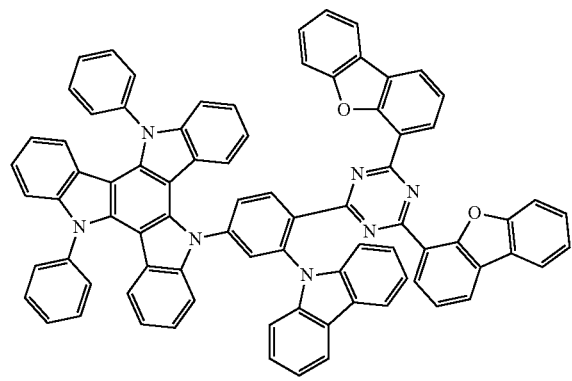
20
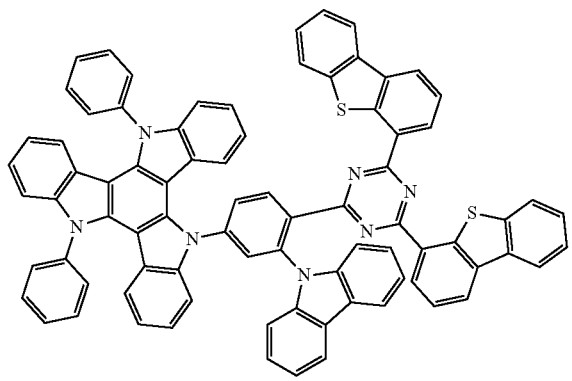
21
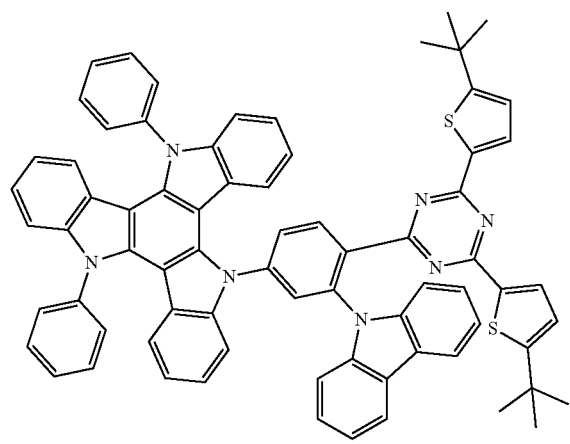
22
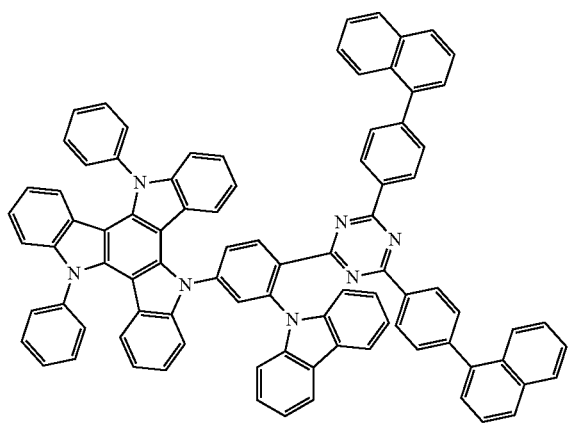
23
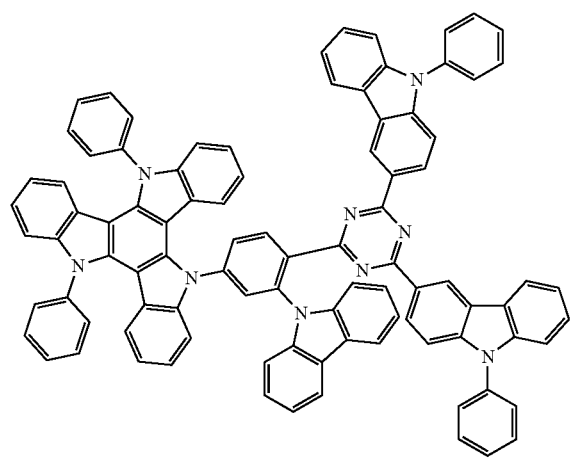
24
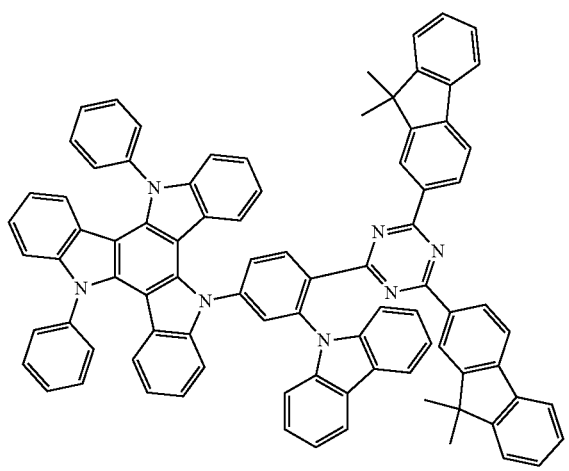

25
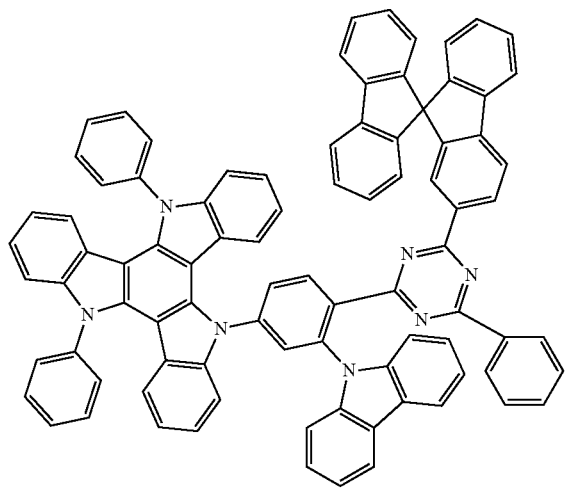
26
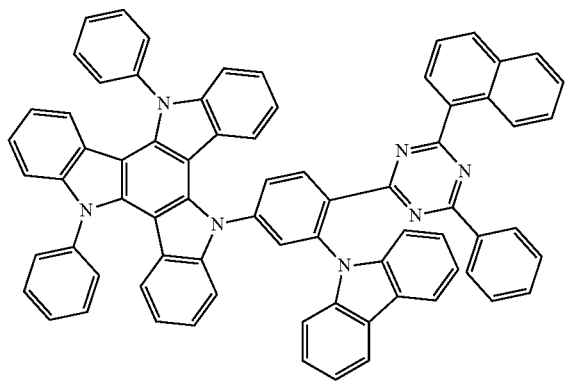
27
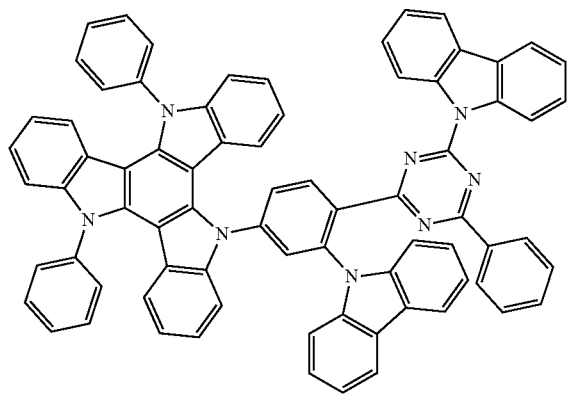
28
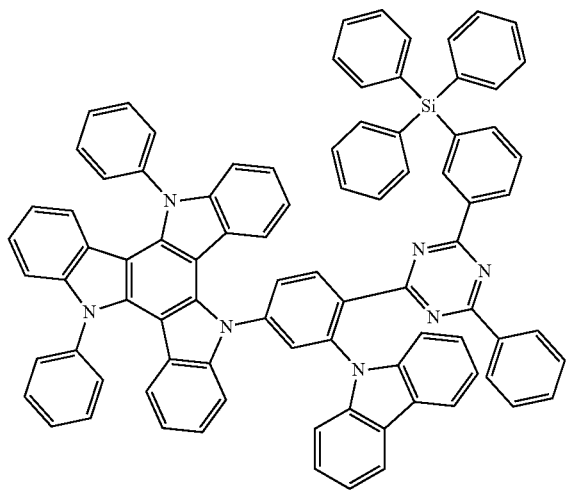
29
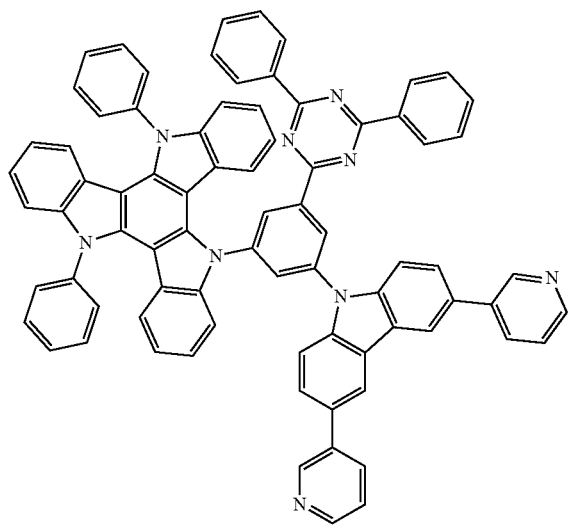
30
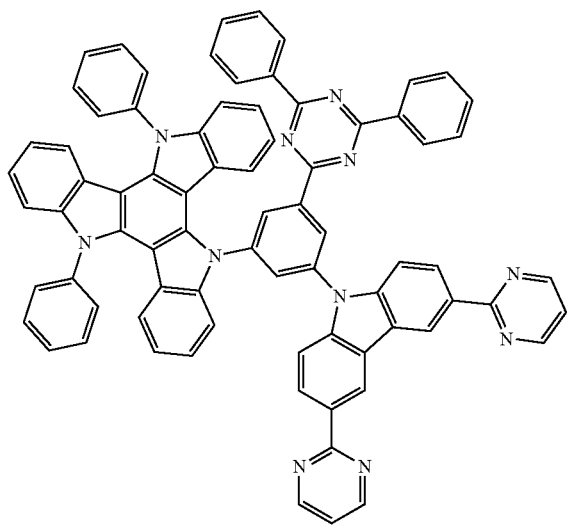

31
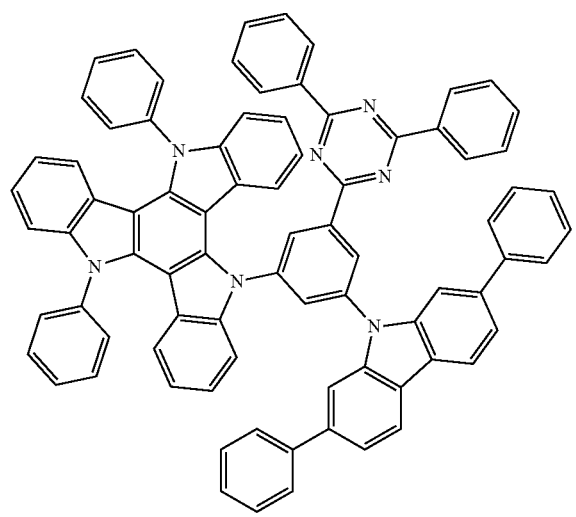
32
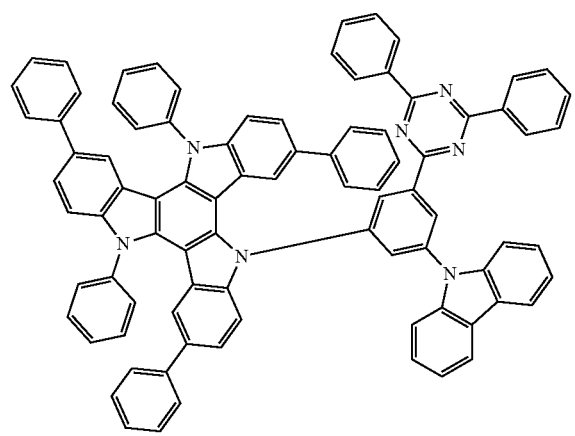
33
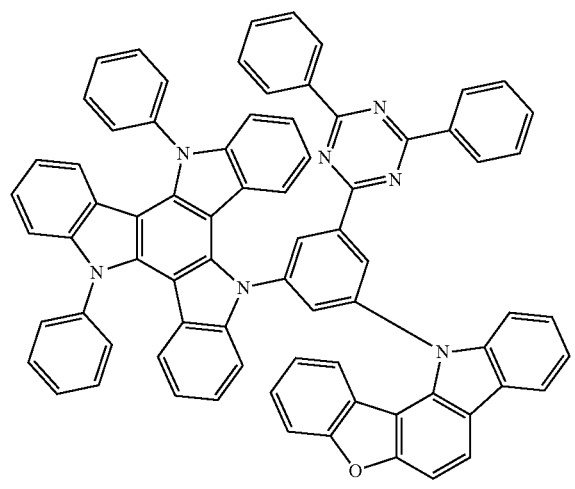
34
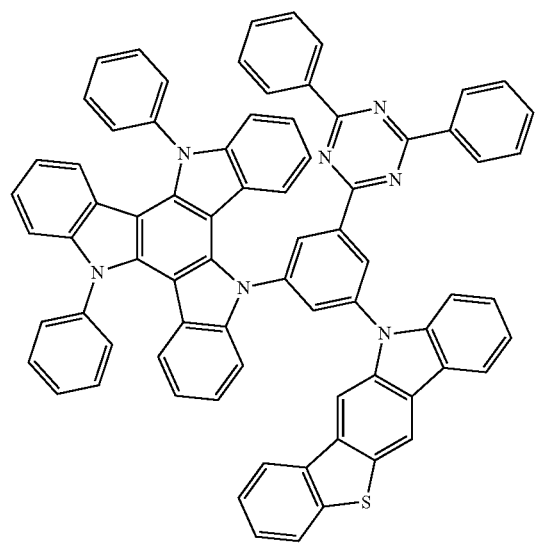

35
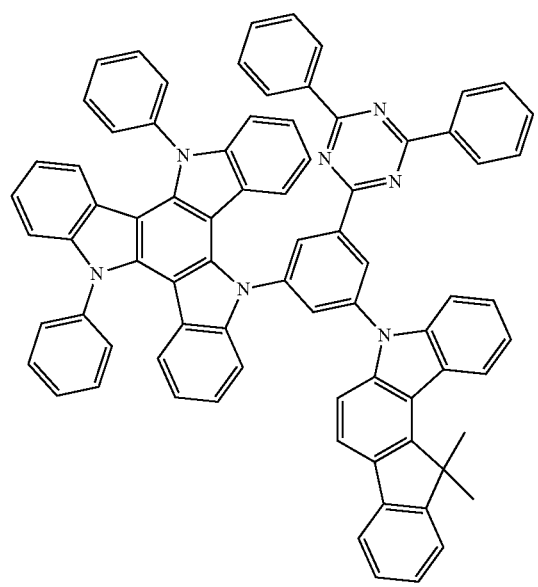
36
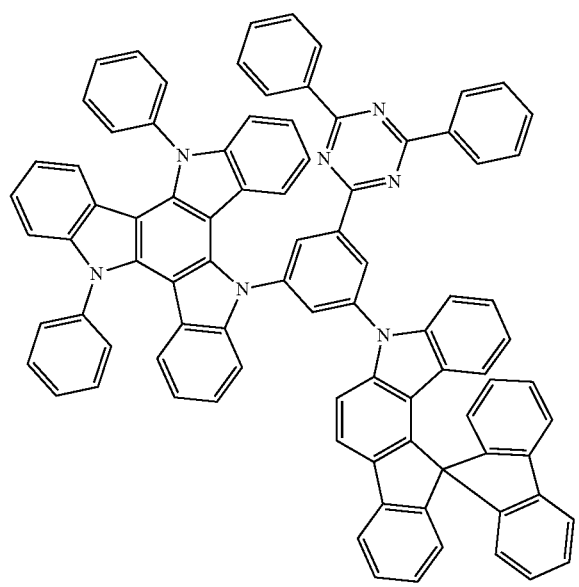
37
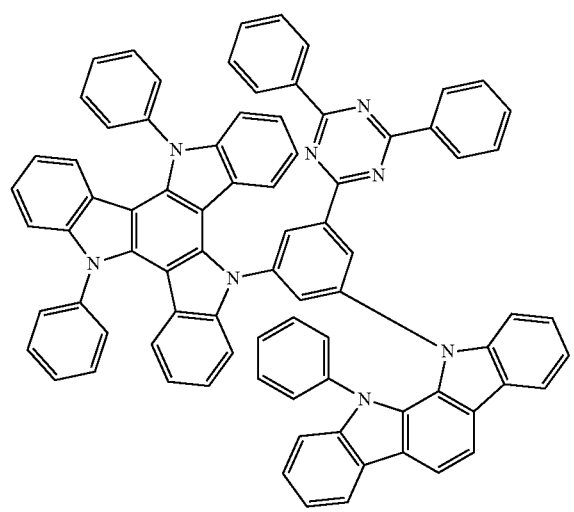
38
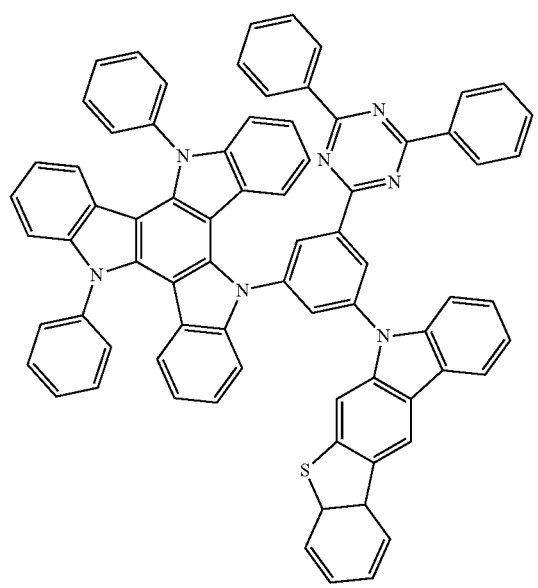

129 130
-continued
39 40
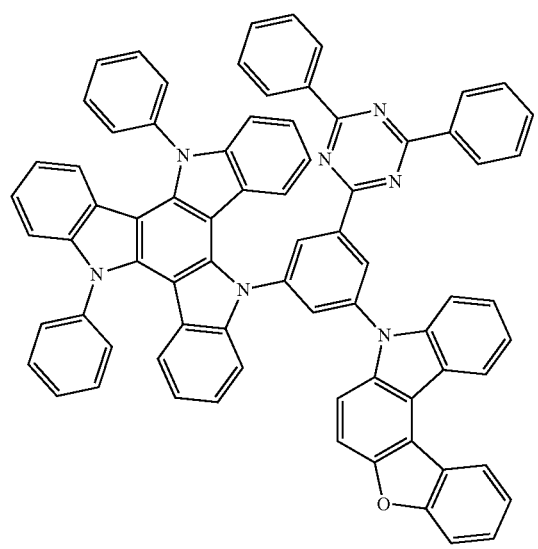
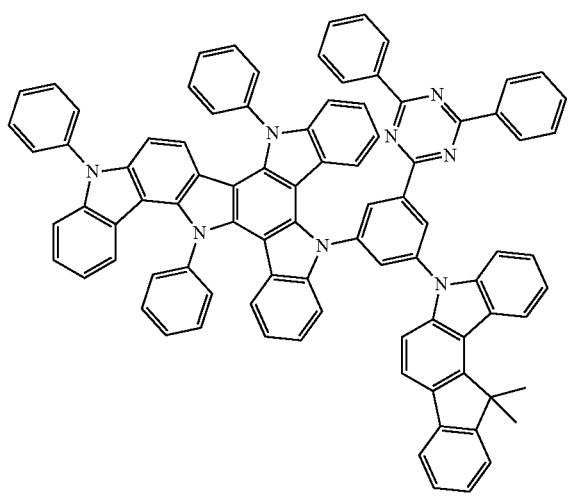
41 42
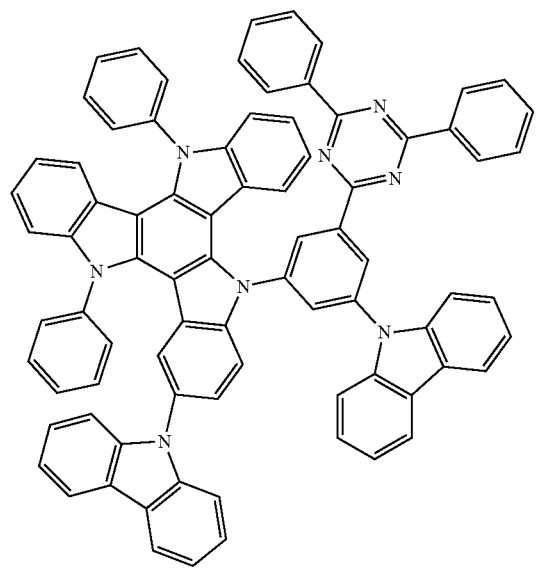
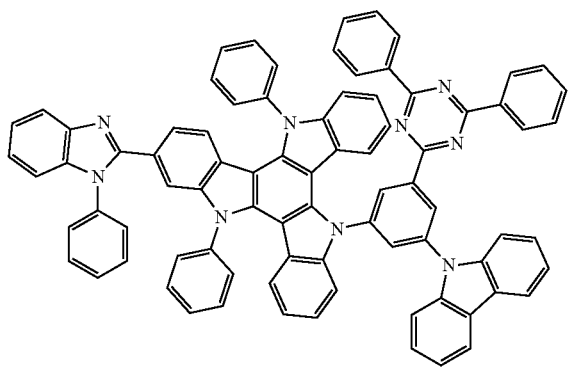

43
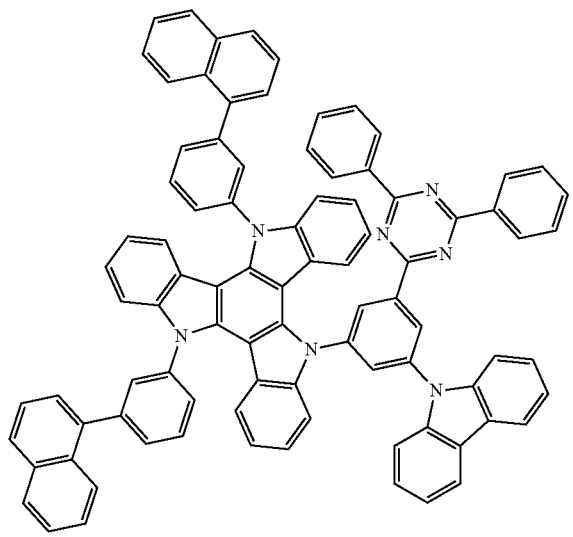
44
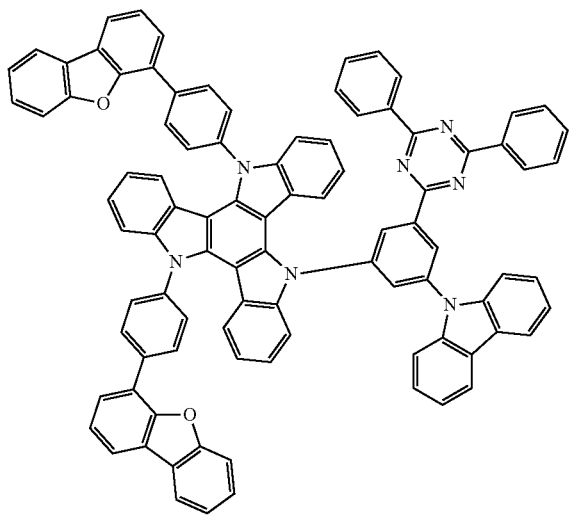
45
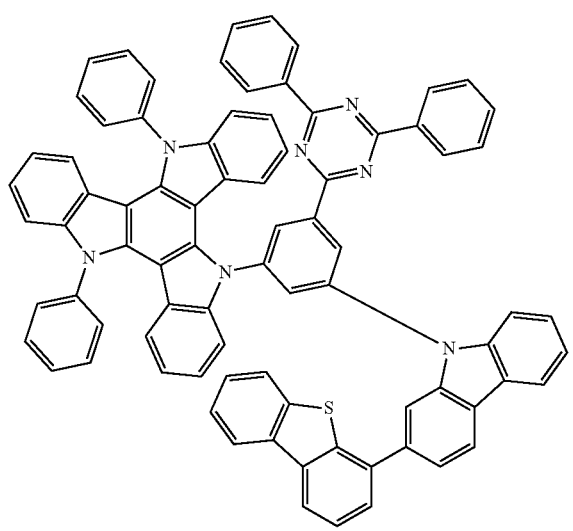
46
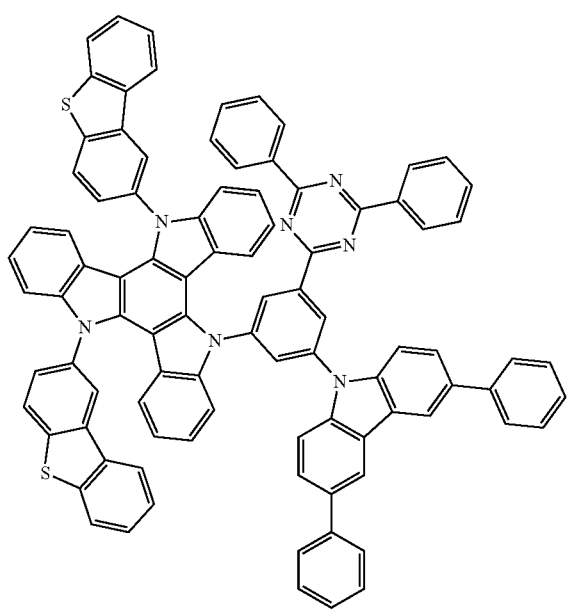
47
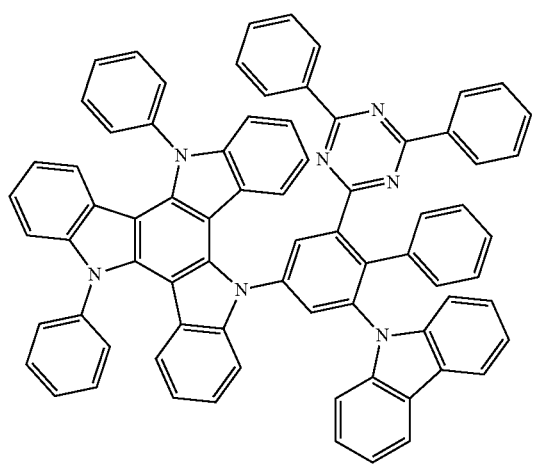
48
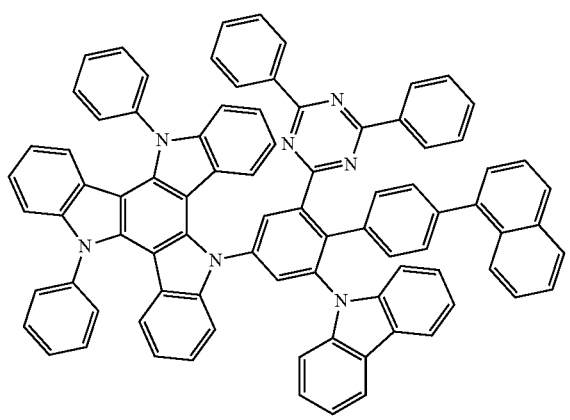

-continued
49
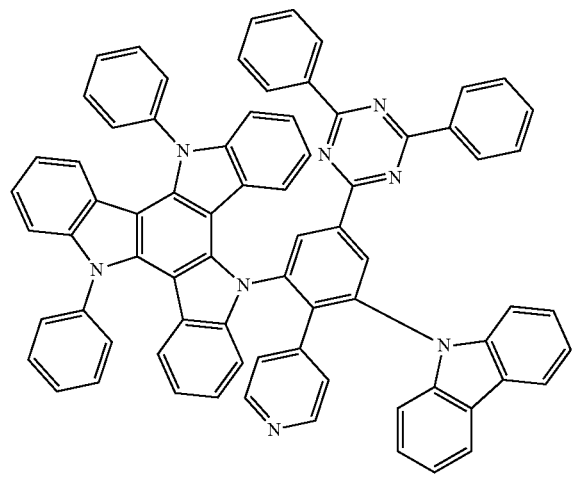
50
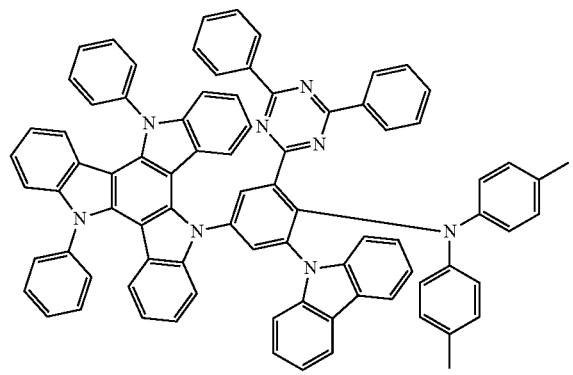
51
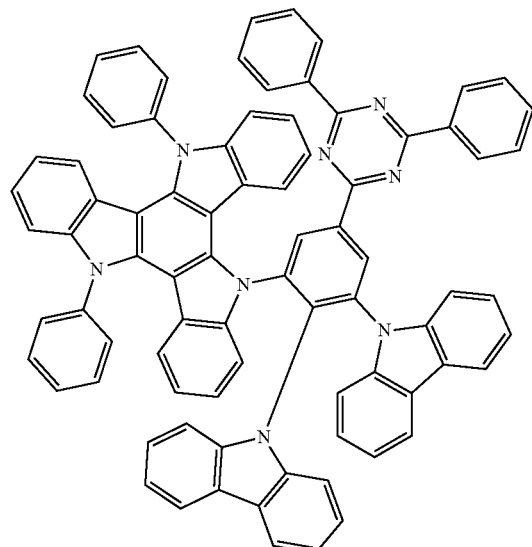
52
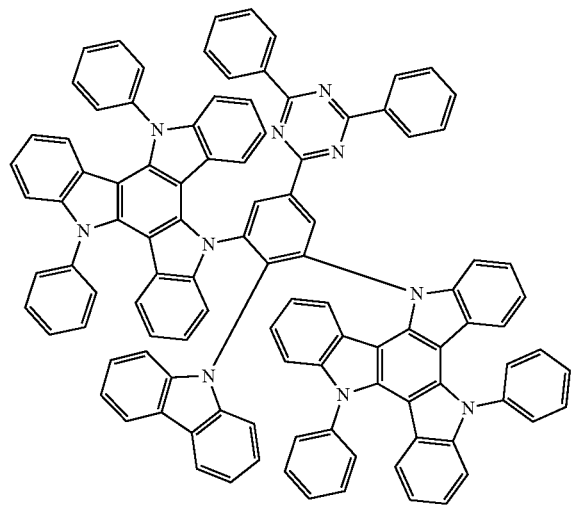
53
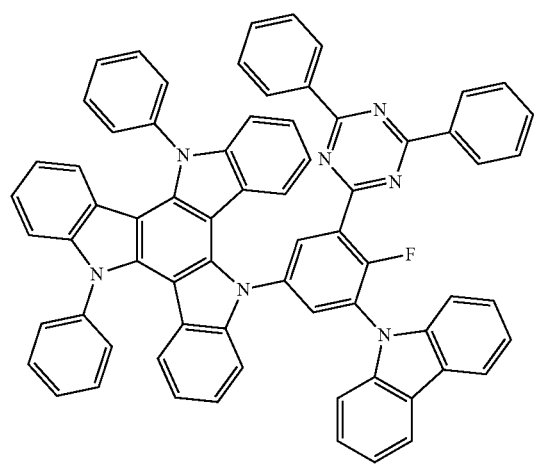
54
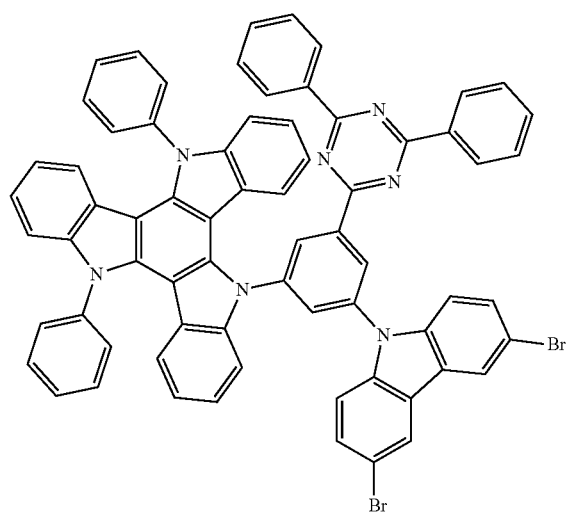

55
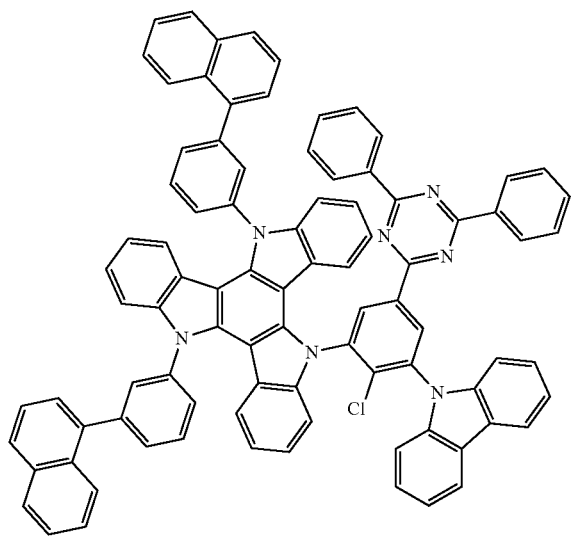
56
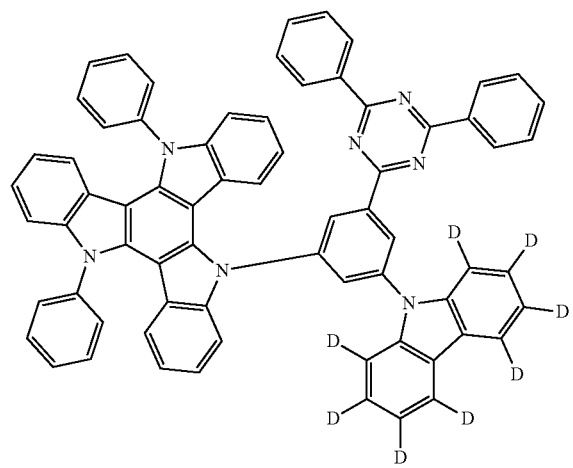
57
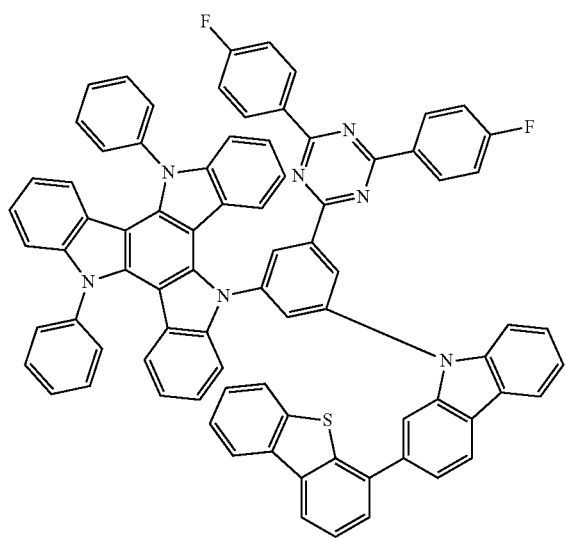
58
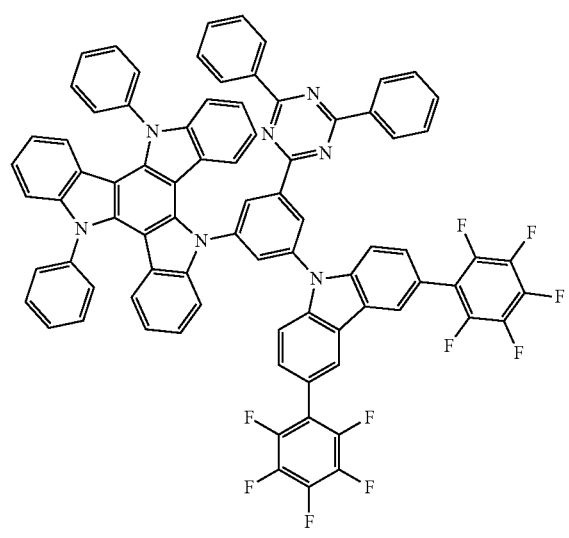

59
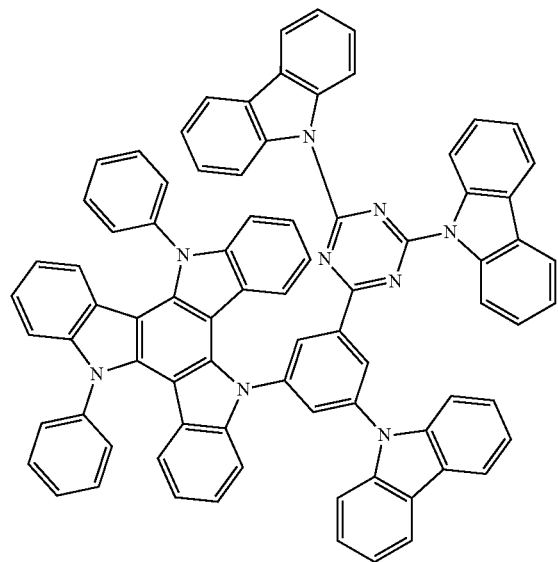
60
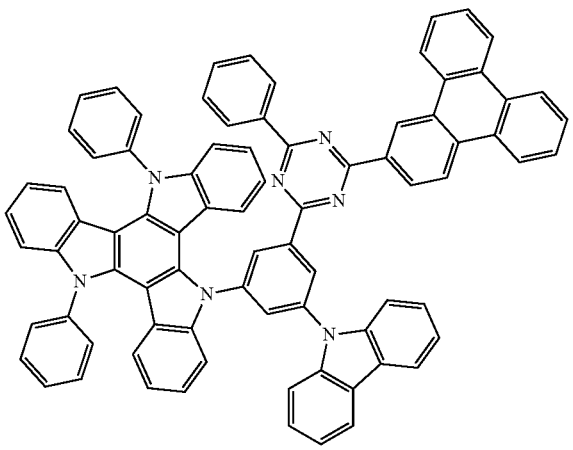
61
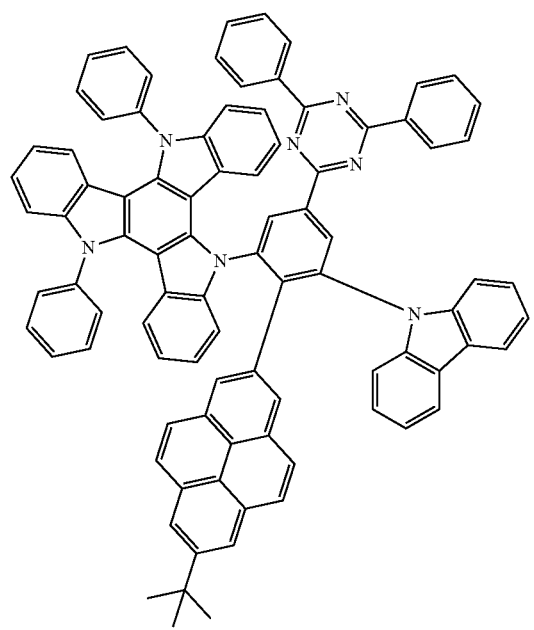

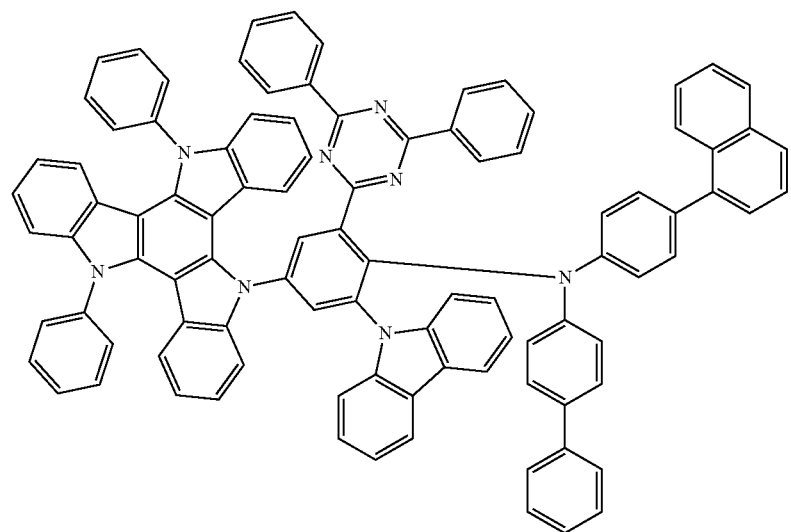
62
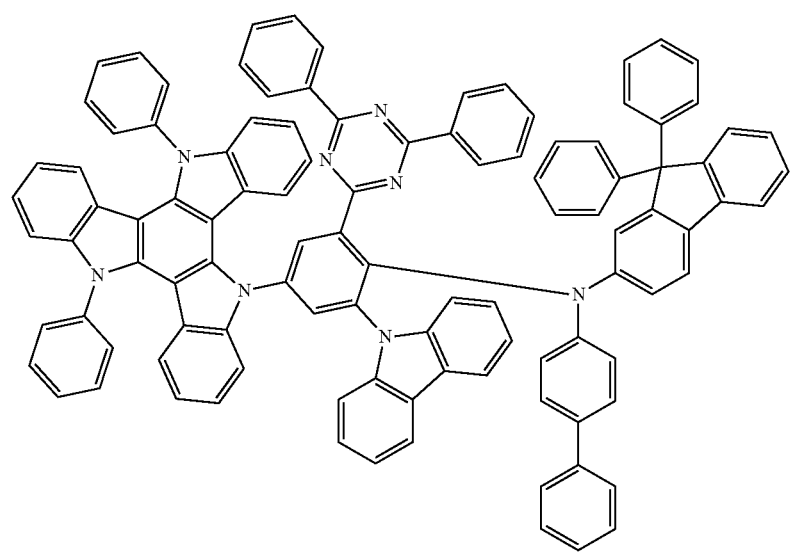
63

64
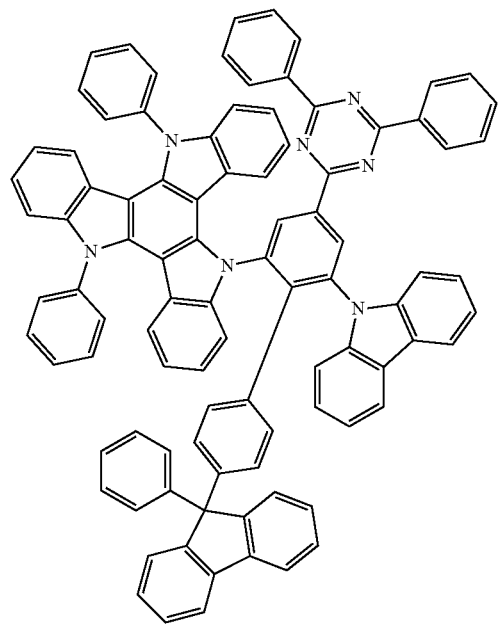
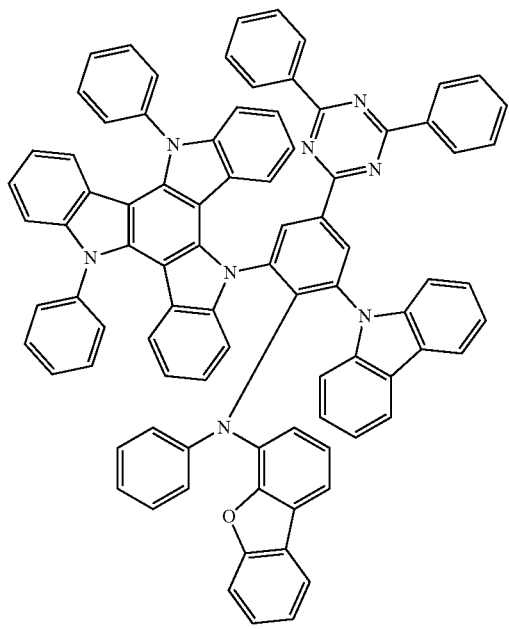
66
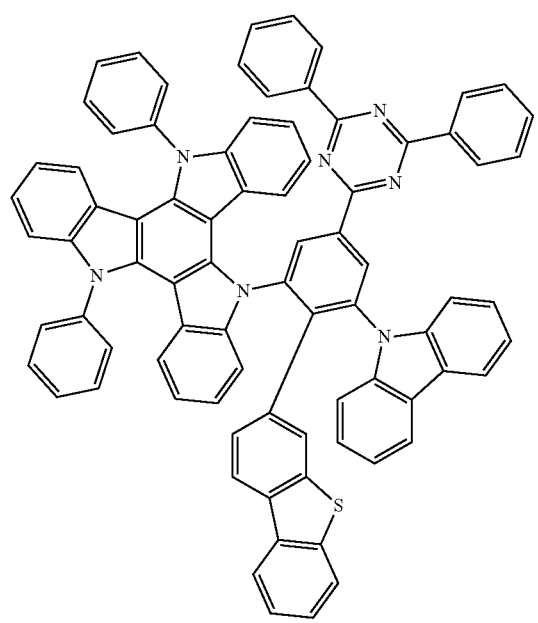
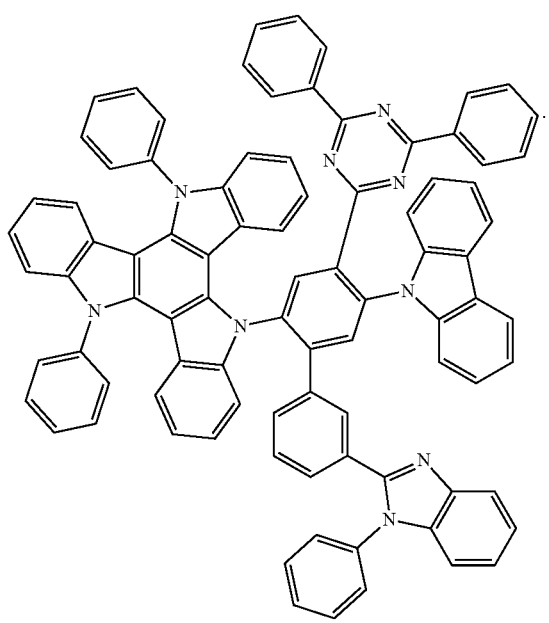
* * * * *